United States Patent
Hasegawa et al.

(10) Patent No.: US 6,791,320 B2
(45) Date of Patent: Sep. 14, 2004

(54) MAGNETIC DETECTION DEVICE ADAPTED TO CONTROL MAGNETIZATION OF FREE MAGNETIC LAYER BY USING ANTIFERROMAGNETIC LAYER, AND MANUFACTURING METHOD FOR THE SAME

(75) Inventors: Naoya Hasegawa, Niigata-ken (JP); Eiji Umetsu, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/228,511

(22) Filed: Aug. 27, 2002

(65) Prior Publication Data

US 2003/0042903 A1 Mar. 6, 2003

(30) Foreign Application Priority Data

Aug. 29, 2001 (JP) ...................................... 2001-258895
Feb. 14, 2002 (JP) ...................................... 2002-036385

(51) Int. Cl.[7] ............................................. G01R 33/02
(52) U.S. Cl. ........................ 324/252; 324/260; 428/692
(58) Field of Search .......................... 324/252; 360/324, 360/324.1, 324.11, 324.12; 338/32 R; 427/127, 128, 131; 428/694 T, 694 TM, 900

(56) References Cited

U.S. PATENT DOCUMENTS

| 5,949,623 | A |   | 9/1999  | Lin |   |
|-----------|---|---|---------|-----|---|
| 6,030,753 | A |   | 2/2000  | Lin |   |
| 6,137,662 | A | * | 10/2000 | Huai et al. ............. | 360/327.22 |
| 6,292,335 | B1 | * | 9/2001 | Gill ........................ | 360/324.11 |
| 6,352,621 | B1 | * | 3/2002 | Saito et al. .............. | 204/192.2 |
| 6,611,405 | B1 | * | 8/2003 | Inomata et al. .......... | 360/324.2 |
| 6,621,665 | B1 | * | 9/2003 | Gill ........................ | 360/324.11 |

FOREIGN PATENT DOCUMENTS

| JP | 2000-348309 | 12/2000 |
|----|-------------|---------|
| JP | 2001-52315  | 2/2001  |

* cited by examiner

Primary Examiner—N. Le
Assistant Examiner—Reena Aurora
(74) Attorney, Agent, or Firm—Brinks Hofer Gilson & Lione

(57) ABSTRACT

A magnetic detection device and a manufacturing method for the same that allows effective control of the magnetization of a free magnetic layer in a design with narrower tracks. A second antiferromagnetic layer is deposited on a free magnetic layer, and a thin nonmagnetic layer formed from an element such as Ru or the like is deposited on the second antiferromagnetic layer. Third antiferromagnetic layers are deposited on both end portions of the free magnetic layer. Both end portions of the second antiferromagnetic layer exhibit antiferromagnetic properties so that the magnetization of both end portions of the free magnetic layer is firmly fixed. A central portion of the second antiferromagnetic layer is non-antiferromagnetic. A central portion of the free magnetic layer is formed into a weak single domain so it permits inverted magnetization in response to an external magnetic field.

63 Claims, 33 Drawing Sheets

FIG. 15
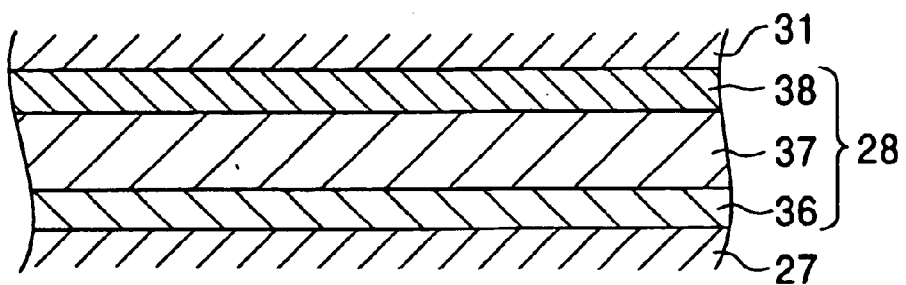
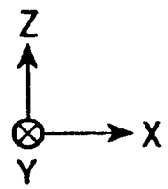
FIG. 16
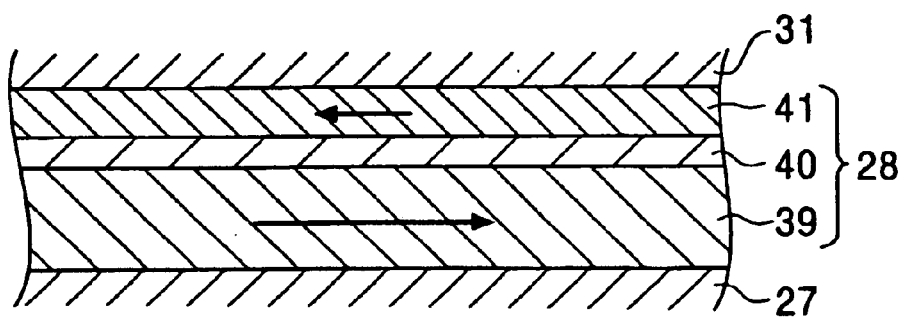
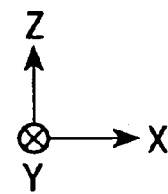

MAGNETIC DETECTION DEVICE ADAPTED TO CONTROL MAGNETIZATION OF FREE MAGNETIC LAYER BY USING ANTIFERROMAGNETIC LAYER, AND MANUFACTURING METHOD FOR THE SAME

BACKGROUND OF THE INVENTION

1. Field of the Invention

The present invention relates to a magnetic detection device used primarily with a hard disk drive, a magnetic sensor, or the like. More particularly, the invention relates to a magnetic detection device that permits proper control of the magnetization of a free magnetic layer even in a design with narrower tracks, and exhibits excellent reproducing characteristics, and a manufacturing method for the same.

2. Description of the Related Art

FIG. 35 is a partial sectional view of the structure of a conventional magnetic detection device observed from a surface opposing a recording medium.

In FIG. 35, a multilayer film 8 formed on a substrate 1 includes an antiferromagnetic layer 2, a pinned magnetic layer 3, a nonmagnetic material layer 4, and a free magnetic layer 5. Hard bias layers 6 are formed on both sides of the multilayer film 8, and electrode layers 7 are formed on the hard bias layers 6.

The magnetization of the pinned magnetic layer 3 is fixed in a direction Y in the drawing by an exchange coupling magnetic field generated between itself and the antiferromagnetic layer 2. On the other hand, the magnetization of the free magnetic layer 5 is pinned in a direction X in the drawing by a longitudinal bias magnetic field from the hard bias layer 6.

As shown in FIG. 35, a track width Tw is restricted by the width dimension in the direction of the track width (in the direction X in the drawing) of the free magnetic layer 5. With a higher recording density in the future, the dimension of the track width Tw will be further reduced.

The tracks that are becoming increasingly narrower have been preventing the structure of the magnetic detection device shown in FIG. 35 from properly controlling the magnetization of the free magnetic layer 5.

First, according to the structure illustrated in FIG. 35, as the width dimension of the free magnetic layer 5 is reduced to accommodate narrower tracks, the region subjected to the influences of an intense longitudinal bias magnetic field from the hard bias layer 6 takes up more percentage in the free magnetic layer 5. The area affected by the intense longitudinal bias magnetic field turns into a dead region that is magnetically less responsive to an external magnetic field. With narrower tracks, the dead region grows larger, resulting in degraded reproduction sensitivity.

Second, the hard bias layer 6 and the free magnetic layer 5 are apt to develop magnetic discontinuity. This trend is especially true if a foundation layer formed of Cr or the like lies between the hard bias layer 6 and the free magnetic layer 5.

Such magnetic discontinuity causes enhanced influences of the diamagnetic fields of the end portions of the free magnetic layer 5 in the width direction, frequently leading to a phenomenon known as the "buckling phenomenon" in which the magnetization of the free magnetic layer 5 is disturbed. The buckling phenomenon tends to take place in a wider region of the free magnetic layer 5 as the tracks become narrower. This reduces the stability of the reproduced waveforms.

Third, with a narrower gap, a part of the longitudinal bias magnetic field from the hard bias layer 6 escapes to a shielding layers (not shown) formed on the top and bottom of the magnetic detection device shown in FIG. 35. This disturbs the magnetization of the shielding layers and weakens the longitudinal bias magnetic field to be supplied to the free magnetic layer 5, preventing effective control of the magnetization of the free magnetic layer 5.

To overcome the problem described above, the exchange bias method has recently been used. According to the method, the magnetization control of the free magnetic layer 5 is attained using an antiferromagnetic layer formed on the free magnetic layer.

The magnetic detection device using the exchange bias method is fabricated according to the manufacturing process illustrated in, for example, FIG. 36 and FIG. 37, which are partial sectional views of the magnetic detection device observed from its surface opposing a recording medium.

In the process illustrated in FIG. 36, the antiferromagnetic layer 2 made of, for example, a PtMn alloy is formed on the substrate 1. Then, the pinned magnetic layer 3, the nonmagnetic material layer 4, and the free magnetic layer 5 made of a magnetic material are deposited thereon. A Ta film 9 is formed on the free magnetic layer 5 to prevent the latter from being oxidized when its surface is exposed to the atmosphere.

Subsequently, a liftoff resist layer 10 is formed on the Ta film 9 shown in FIG. 36. The portion of the Ta film 9 exposed on both sides in the track width direction or the direction X in the drawing that is not covered by the resist layer 10 is then completely removed by ion milling. The free magnetic layer 5 under the Ta film 9 is also partly removed, as indicated by the dotted lines in the drawing.

In the step illustrated in FIG. 37, ferromagnetic layers 11, second antiferromagnetic layers 12 formed of an IrMn alloy or the like, and electrode layers 13 are deposited in this order on the portions of the free magnetic layers 5 that are exposed on both sides of the resist layer 10. Removing the resist layer 10 shown in FIG. 37 completes the exchange bias type magnetic detection device.

In the magnetic detection device shown in FIG. 37, the track width Tw can be restricted in terms of the interval in the track width direction (in the direction X in the drawing) of the ferromagnetic layers 11. The ferromagnetic layers 11 are firmly fixed by the exchange coupling magnetic field generated between themselves and the second antiferromagnetic layers 12. This causes both ends A of the free magnetic layers 5, which are positioned under the ferromagnetic layers 11, to be firmly fixed in the direction X in the drawing by the ferromagnetic coupling between themselves and the ferromagnetic layers 11. Thus, it has been believed that a central portion B of the free magnetic layer 5 in the area of the track width Tw is formed into a weak single domain so it is able to magnetically respond to an external magnetic field.

The use of an exchange bias type magnetic detection device has been expected to provide a solution to the problems described above.

However, the magnetic detection device formed according to the manufacturing process illustrated in FIG. 36 and FIG. 37 poses the following shortcomings.

First, during the ion milling step in the process illustrated in FIG. 36, a part of the free magnetic layer 5 formed under the Ta film 9 is inevitably removed while removing the Ta film 9. In addition, an inert gas used for ion milling, such as Ar, is apt to enter through the exposed portion of the free magnetic layer 5. The damage caused by the ion milling set forth above tends to destroy the crystal structure of surface portions 5a of the free magnetic layer 5, or to the occurrence of lattice defects (mixing effect). This frequently results in the degradation of the magnetic characteristics of the surface portions 5a of the free magnetic layer 5.

Ideally, only the Ta film 9 is removed in the ion milling step of the process illustrated in FIG. 36, leaving the free magnetic layer 5 intact. In reality, it is difficult to achieve such degree of milling control.

The reason underlying the difficulty in achieving ideal milling control is due to the thickness of the Ta film 9 formed on the free magnetic layer 5. The Ta film 9 is formed to have a thickness in the range of between about 30 angstroms to about 50 angstroms. This film thickness is necessary to adequately protect the free magnetic layer 5 from oxidation.

The Ta film 9 is, however, oxidized by being exposed to air or during annealing in a magnetic field to produce an exchange coupling magnetic field between the pinned magnetic layer 3 or the ferromagnetic layers 11 and the antiferromagnetic layers 2 or 12. The thickness of the oxidized portion increases, causing the entire thickness of the Ta film 9 to increase from that in the initial film forming step. For instance, if the thickness of the Ta film 9 is 30 angstroms upon completion of the film formation, the thickness of the Ta film 9 after oxidation will be about 45 angstroms.

Therefore, it is necessary to use high-energy ion milling to effectively remove the Ta film 9 with its increased thickness due to oxidation. High-energy ion milling means high milling rate. It is almost impossible to stop milling once the thick Ta film 9 has been removed by ion milling. In other words, higher-energy ion milling requires a larger milling stop margin. Thus, a part of the free magnetic layer 5 formed under the Ta film is undesirably removed and the free magnetic layer 5 is subjected to more damage from high-energy ion milling and its magnetic characteristics exhibit more conspicuous deterioration.

Second, it is difficult to stop ion milling in the middle of the free magnetic layer 5 shown in FIG. 36 because of the thinness of the free magnetic layer 5, which ranges between about 30 angstroms to about 40 angstroms. In the worst case, both end portions A of the free magnetic layer 5 is completely removed by ion milling.

Third, the surface of the free magnetic layer 5 exposed by ion milling as described above develops deteriorated magnetic characteristics attributable to the ion milling. This results in inadequate magnetic coupling or ferromagnetic exchange interaction between the free magnetic layer 5 and the ferromagnetic layers 11 deposited thereon. For this reason, the ferromagnetic layers 11 must be thick.

However, as the thickness of the ferromagnetic layers 11 increases, the exchange coupling magnetic field generated between the ferromagnetic layers 11 and the antiferromagnetic layers 12 weakens. Thus, both end portions A of the free magnetic layer 5 cannot be firmly fixed magnetically, and a side-reading problem arises, making it impossible to fabricate a magnetic detection device capable of accommodating narrower tracks.

If the thickness of the ferromagnetic layers 11 is excessively thick, then extra static magnetic field tends to reach a central portion B of the free magnetic layer 5 from the inner side surfaces of the ferromagnetic layers 11. This frequently causes degraded sensitivity to an external magnetic field of the central portion B of the free magnetic layer 5, which permits inverted magnetization.

Thus, a magnetic detection device structure, in which the Ta film 9 is formed on the free magnetic layer 5, and the ferromagnetic layers 11 and the second antiferromagnetic layers 12 are laminated on the portions of the free magnetic layer 5 that have been exposed by removing both end portions of the Ta film 9, has not yet made it possible to properly perform magnetization control of the free magnetic layer 5. Therefore current techniques do not permit manufacture of a magnetic detection device that properly accommodates tracks narrower than those in conventional magnetic detection devices.

SUMMARY OF THE INVENTION

It is an object of the invention to provide a magnetic detection device able to effectively control the magnetization of a free magnetic layer using an exchange bias method and to successfully accommodate narrower tracks, and a method for manufacturing the same.

According to a first aspect of the present invention, there is provided a magnetic detection device that includes a multilayer film having a first antiferromagnetic layer, a pinned magnetic layer, a nonmagnetic material layer, and a free magnetic layer, these components being arranged in this order from the bottom, wherein a second antiferromagnetic layer is provided on the free magnetic layer, a nonmagnetic layer is provided at least on a central portion of the second antiferromagnetic layer, and third antiferromagnetic layers are provided on both end portions of the second antiferromagnetic layer.

In the present invention, the second antiferromagnetic layer is provided on the free magnetic layer, and the third antiferromagnetic layers are provided on both end portions of the second antiferromagnetic layer as set forth above. Hence, the thick antiferromagnetic layers combining the second antiferromagnetic layers and the third antiferromagnetic layers are formed on both end portions of the free magnetic layer. Both end portions of the free magnetic layer are properly fixed along a track width direction by an exchange coupling magnetic field generated between the free magnetic layer and the antiferromagnetic layers. The central portion of the free magnetic layer is formed into a weak single domain that permits inverted magnetization in response to an external magnetic field.

The nonmagnetic layer provided on the central portion of the second antiferromagnetic layer protects the second antiferromagnetic layer from oxidation caused by air exposure. The nonmagnetic layer may be provided between both end portions of the second antiferromagnetic layer and the third antiferromagnetic layers.

In the conventional magnetic detection device shown in FIG. 37, both end portions of the free magnetic layer are partly removed. In the present invention, the free magnetic layer is covered by the second antiferromagnetic layer, thus solving a prior art problem in which the free magnetic layer is damaged by ion milling.

The structure according to the present invention allows more effective control of the magnetization of the free magnetic layer than in a conventional magnetic detection device, making it possible to manufacture magnetic detection devices that can successfully accommodate narrower tracks.

Preferably, when a nonmagnetic layer is provided between both end portions of the second antiferromagnetic layer and the third antiferromagnetic layers, the nonmagnetic layer is thicker at its central portion than at its end portions on both sides.

Preferably, a nonmagnetic layer of 3 angstroms or less is provided between the third antiferromagnetic layers and the second antiferromagnetic layer. Alternatively, the third antiferromagnetic layers are directly formed on both end portions of the second antiferromagnetic layer.

The presence of the nonmagnetic layer of 3 angstroms or less makes it easier for antiferromagnetic interaction to take place between both end portions of the second antiferromagnetic layer and the third antiferromagnetic layers. This causes both end portions of the second antiferromagnetic layer and the third antiferromagnetic layers to act like a combined one-piece antiferromagnetic layer, allowing both end portions of the free magnetic layer to be properly and firmly fixed in the track width direction.

Preferably, the thickness of the nonmagnetic layer formed on the central portion of the second antiferromagnetic layer ranges from 3 angstroms to 10 angstroms.

Preferably, the central portion of the second antiferromagnetic layer exhibits non-antiferromagnetic characteristics, while both end portions of the second antiferromagnetic layer exhibit antiferromagnetic characteristics.

If the central portion of the second antiferromagnetic layer exhibits non-antiferromagnetic characteristics, it would be difficult for the central portion of the second antiferromagnetic layer to develop order transformation even by annealing in a magnetic field. Hence, no exchange coupling magnetic field is generated between the central portion of the second antiferromagnetic layer and the central portion of the free magnetic layer. As a result, the magnetization of the central portion of the free magnetic layer will not be firmly fixed along the track width direction.

The end portions at both sides of the second antiferromagnetic layer and the third antiferromagnetic layers formed thereon are combined into one antiferromagnetic layer, permitting easy order transformation by annealing in a magnetic field. Thus, an exchange coupling magnetic field is produced between both end portions of the second antiferromagnetic layer and both end portions of the free magnetic layer. As a result, both end portions of the free magnetic layer can be firmly fixed along the track width direction.

The thickness of the second antiferromagnetic layer preferably ranges from about 20 angstroms to about 50 angstroms, more preferably from about 30 angstroms to about 40 angstroms. These thickness ranges prevent the occurrence of an exchange coupling magnetic field between the central portion of the second antiferromagnetic layer and the central portion of the free magnetic layer. But even if an exchange coupling magnetic field is generated, its magnitude will be extremely small.

According to a second aspect of the present invention, there is provided a magnetic detection device that includes a multilayer film having a first antiferromagnetic layer, a pinned magnetic layer, a nonmagnetic material layer, and a free magnetic layer, these components being arranged in this order from the bottom, wherein second antiferromagnetic layers are provided at least on both end portions of the free magnetic layer, nonmagnetic layers are provided on the second antiferromagnetic layers, and third antiferromagnetic layers are provided on the nonmagnetic layers.

Unlike the magnetic detection device according to the first aspect of the present invention, the nonmagnetic layer is always provided between the second antiferromagnetic layers and the third antiferromagnetic layers. The second antiferromagnetic layer may not be provided on a central portion of the free magnetic layer. This structural difference arises from the manufacturing method used.

In this embodiment, the second antiferromagnetic layers and the third antiferromagnetic layers are deposited on both end portions of the free magnetic layer, the second antiferromagnetic layers and the third antiferromagnetic layers acting like a single antiferromagnetic layer. Hence, the magnetization of both end portions of the free magnetic layer are firmly fixed in a track width direction by an exchange coupling magnetic field generated between the free magnetic layer and the second antiferromagnetic layers. The central portion of the free magnetic layer is loosely formed into a single domain that permits magnetic reaction to an external magnetic field.

In the conventional magnetic detection device shown in FIG. 37, both end portions of the free magnetic layer are partly removed. In contrast, in the present invention, the free magnetic layer is covered by the second antiferromagnetic layers, which overcomes a problem in the prior art.

The structure according to the present invention allows more effective control of the magnetization of the free magnetic layer than in the conventional magnetic detection device. Thus, the structure of the present invention makes it possible to manufacture magnetic detection devices that can successfully accommodate tracks narrower than those in conventional magnetic detection devices.

Alternatively, the second antiferromagnetic layer may be provided also on a central portion of the free magnetic layer. Thus, the entire top surface of the free magnetic layer is covered by the second antiferromagnetic layer, so the free magnetic layer is protected from ion milling.

Alternatively, the second antiferromagnetic layer and the nonmagnetic layer may be provided also on the central portion of the free magnetic layer.

Preferably, the second antiferromagnetic layer provided on the central portion of the free magnetic layer exhibits non-antiferromagnetic properties, while both end portions of the second antiferromagnetic layer exhibit antiferromagnetic properties. In this configuration, no exchange coupling magnetic field is generated between the central portion of the free magnetic layer and the central portion of the second antiferromagnetic layer. Thus, the magnetization of the central portion of the free magnetic layer cannot be firmly fixed in the track width direction. On the other hand, both end portions of the second antiferromagnetic layer and the third antiferromagnetic layer formed thereon are combined into one antiferromagnetic layer; hence, both end portions of the second antiferromagnetic layer effects order transformation by annealing in a magnetic field. An exchange coupling magnetic field of an appropriate magnitude is produced between both end portions of the second antiferromagnetic layer and both end portions of the free magnetic layer, thereby firmly fixing both end portions of the free magnetic layer in the track width direction.

Preferably, the antiferromagnetic layer formed on the central portion of the free magnetic layer has a thickness of about 50 angstroms or less. Alternatively, no antiferromagnetic layer is provided on the central portion of the free magnetic layer.

If the antiferromagnetic layer formed on the central portion of the free magnetic layer has a thickness of about 50 angstroms or less, no exchange coupling magnetic field arises between the antiferromagnetic layer and the central portion of the free magnetic layer. But even if an exchange coupling magnetic field is generated, its magnitude will be extremely small.

Preferably, the antiferromagnetic layer on the central portion of the free magnetic layer has a thickness of about 40 angstroms or less.

Preferably, the thickness of the nonmagnetic layer formed on both end portions of the free magnetic layer ranges from about 0.2 angstroms to about 3 angstroms. The presence of this thin nonmagnetic layer causes antiferromagnetic interaction to take place between the second antiferromagnetic layer and the third antiferromagnetic layers. This in turn causes the second antiferromagnetic layer and the third antiferromagnetic layers to act like a single antiferromagnetic layer, which allows the magnetization of both end portions of the free magnetic layer to be properly fixed in the track width direction.

Preferably, the nonmagnetic layer is formed from one or more elements from among Ru, Re, Pd, Os, Ir, Pt, Au, and Rh. These noble metals are resistant to oxidation, and even if these noble metal elements diffuse into an antiferromagnetic layer by annealing or heat treatment, the properties of the antiferromagnetic layer are not degraded. In comparison with an element such as Ru, conventional Ta films are undesirable because they are easily oxidized. Also, the diffusion of noble metal elements such as Ta tends to cause deterioration in the properties or functions of an antiferromagnetic layer.

According to the present invention, a noble metal such as Ru is used to ensure adequate protection against oxidation even in the case of a thin nonmagnetic layer. Thus, low-energy ion milling can be carried out, permitting efficient manufacture of magnetic detection devices with excellent adaptation to tracks narrower than those used in conventional magnetic detection devices.

Preferably, the free magnetic layer is formed from three layers. For example, the free magnetic layer three-layer structure can be CoFe/NiFe/CoFe.

In the present invention, an electrode layer may be provided on the third antiferromagnetic layer. Preferably, the electrode layer is oriented in a direction parallel to the film surfaces of the layers making up the multilayer film.

A magnetic detection device in which current flows in a direction parallel to the surfaces of the layers of the magnetic detection device is known as a current-in-the-plane (CIP) type.

Alternatively, upper electrode layers may be provided on the central portion of the multilayer film and the third antiferromagnetic layer, a lower electrode layer may be provided under the multilayer film, and current passes in a direction perpendicular to the film surfaces of the layers of the multilayer film. This type of magnetic detection device is known as a current-perpendicular-to-the-plane (CPP) type.

For the CPP type magnetic detection device, the upper electrode layers are preferably upper shielding layers formed from a magnetic material. This makes it easier to fabricate magnetic detection devices and to reduce a gap length G1, so magnetic detection devices that permit higher recording density can be manufactured.

Preferably, an insulating layer is provided between the third antiferromagnetic layer and the upper electrode layer.

Preferably, a first insulating layer is provided on the upper surface of the third antiferromagnetic layer, a second insulating layer separate from the first insulating layer is provided on an inner end surface of the third antiferromagnetic layer, and the first insulating layer and the second insulating layer lie between the third antiferromagnetic layer and the upper electrode layer. With this arrangement, it is possible to effectively prevent the current that passes from the upper electrode layer to the multilayer film from shunting to the third antiferromagnetic layer. This allows fabrication of magnetic detection devices that feature high reproduction output and narrower effective reproduction tracks, which are suited for higher recording densities.

For a CPP type magnetic detection device, the lower electrode layer is preferably a lower shielding layer formed from a magnetic material. This makes it easier to fabricate magnetic detection devices and to reduce a gap length G1, so magnetic detection devices that permit higher recording density can be manufactured.

Preferably, a protuberant portion projecting toward the multilayer film is provided at the center in the track width direction of the lower electrode layer, the upper surface of the protuberant portion is in contact with the bottom surface of the multilayer film, and an insulating layer is provided between the end portions at both sides in the track width direction of the lower electrode layer and the multilayer film. This arrangement makes it difficult for the current that runs from the lower electrode layer to the multilayer film to spread beyond a track width, so current shunt loss can be minimized. Thus, the present invention allows magnetic detection devices with higher reproduction outputs and narrower effective reproducing track widths to be fabricated.

Preferably, the upper surface of the protuberant portion is flush with the upper surfaces of the insulating layers provided on both end portions of the lower electrode layer.

Preferably, the nonmagnetic material layer is formed from a nonmagnetic electrically conductive material. A magnetic detection device having the nonmagnetic material layer made of a nonmagnetic electrically conductive material is known as a spin valve GMR magneto-resistive device (CIP-GMR or CPP-GMR).

Alternatively, the nonmagnetic material layer may be formed from an insulating material. This magnetic detection device is called a spin valve tunnel magneto-resistive device (CPP-TMR).

According to another aspect of the present invention, there is provided a manufacturing method for a magnetic detection device, including the steps of:

(a) depositing a first antiferromagnetic layer, a pinned magnetic layer, a nonmagnetic material layer, a free magnetic layer, a second antiferromagnetic layer, and a nonmagnetic layer, these components being arranged on a substrate in this order from the bottom;

(b) carrying out a first annealing in a magnetic field to generate an exchange coupling magnetic field between the first antiferromagnetic layer and the pinned magnetic layer to fix the magnetization of the pinned magnetic layer along a height direction;

(c) forming a resist layer on a central portion of the nonmagnetic layer, and removing both end portions of the nonmagnetic layer that are not covered by the resist layer, leaving both end portions of the nonmagnetic layer partly unremoved;

(d) forming third antiferromagnetic layers on both end portions of the nonmagnetic, layer that have been left unremoved, and removing the resist layer; and (e) carrying out a second annealing in a magnetic field to generate an exchange coupling magnetic field between both end portions of the second antiferromagnetic layer, that opposes and is located under the third antiferromagnetic layer through the intermediary of the nonmagnetic layer, and both end portions of the free magnetic layer to fix the magnetization of both end portions of the free magnetic layer in a direction crossing the direction in which the pinned magnetic layer is magnetized.

In step (a) above, the first antiferromagnetic layer up to the nonmagnetic layer are sequentially formed on the substrate. When removing both end portions of the nonmagnetic layer that are not covered by the resist layer in the step (c) above, milling control is conducted to leave behind a part of both end portions of the nonmagnetic layer. Leaving a part of both end portions of the nonmagnetic layer allows the second antiferromagnetic layer formed thereunder to be protected from damage caused by ion milling. Moreover, both end portions of the nonmagnetic layer are shallowly trimmed thereby to form the third antiferromagnetic layer formed on both end portions of the nonmagnetic layer and both end portions of the second antiferromagnetic layer into a one-piece antiferromagnetic layer. Thus, the magnetization of both end portions of the free magnetic layer can be properly fixed in the track width direction by the exchange coupling magnetic field generated between both end portions of the free magnetic layer and both end portions of the second antiferromagnetic layer. On the other hand, the magnetization of the central portion of the free magnetic layer is not fixed in the track width direction as firmly as the magnetization of the end portions on both sides. This causes the central portion of the free magnetic layer to be loosely magnetized to a level that permits inverted magnetization in response to an external magnetic field.

With this arrangement, the free magnetic layer can be protected from damage due to ion milling overcutting, which has been a problem in the art, and both end portions of the free magnetic layer can be firmly fixed. In addition, the magnetization of the central portion of the free magnetic layer can be controlled to a level that allows the magnetization to be inverted in response to an external magnetic field. Hence, the present invention allows the magnetization of the free magnetic layer to be effectively controlled.

Hence, the present invention makes it possible to manufacture magnetic detection devices featuring high reproduction sensitivity and excellent reproducing characteristics even with narrower tracks.

Alternatively, both end portions of the nonmagnetic layer that are not covered by the resist layer may be completely removed to expose the surfaces of both end portions of the second antiferromagnetic layer in step (c) above, and the third antiferromagnetic layer may be formed on the exposed second antiferromagnetic layer in the foregoing step (d).

In step (a) above, the second antiferromagnetic layer is preferably formed to have a thickness in the range of about 10 angstroms to about 50 angstroms, and more preferably from about 30 angstroms to about 40 angstroms.

In the present invention, the second antiferromagnetic layer should not be excessively thick. If the second antiferromagnetic layer is excessively thick, then order transformation easily takes place by annealing in a magnetic field, and a large exchange coupling magnetic field is apt to be generated between the central portion of the free magnetic layer and the central portion of the second antiferromagnetic layer.

Accordingly, the present invention controls the thickness of the second antiferromagnetic layer to within the range mentioned above to prevent a large exchange coupling magnetic field from being produced between the central portion of the second antiferromagnetic layer and the central portion of the free magnetic layer.

Preferably, the nonmagnetic layer has a thickness in the range of about 3 angstroms to about 10 angstroms in step (a) above. The limited thickness range permits easy adjustment of the film thickness by trimming the nonmagnetic layer by low-energy ion milling in step (c) above. The limited thickness range also ensures protection of the second antiferromagnetic layer under the nonmagnetic layer from damage due to ion milling.

Preferably, in the foregoing step (c), both end portions of the nonmagnetic layer are etched away until the thickness of both end portions of the nonmagnetic layer reaches about 3 angstroms or less, or the entire nonmagnetic layer is removed in step (c) above. This causes an antiferromagnetic interaction between the third antiferromagnetic layer from step (d) above and the second antiferromagnetic layer to form them as if they were a single antiferromagnetic layer. This particular antiferromagnetic interaction allows the magnetization of both end portions of the free magnetic layer to be properly fixed along the track width direction. It also limits the damage to the second antiferromagnetic layer under the nonmagnetic layer caused by ion milling.

Alternatively, the substrate in step (a) above may be a lower electrode layer, an insulating layer may be formed on the third antiferromagnetic layer in the foregoing step (d), and an upper electrode layer may be formed onto the insulating layer and further to the central portion of the nonmagnetic layer between the foregoing steps (d) and (e). In this case, the magnetic detection device is of the CPP type. The presence of the insulating layer between the upper electrode layer and the third antiferromagnetic layer makes it possible to effectively prevent the current passing from the upper electrode layer to the multilayer film from shunting to the third antiferromagnetic layer. This makes it possible to fabricate magnetic detection devices that feature high reproduction output and narrower effective reproduction tracks, which are suited for higher recording densities.

According to still another aspect of the present invention, there is provided a manufacturing method for a magnetic detection device including the steps of:

(f) depositing a first antiferromagnetic layer, a pinned magnetic layer, a nonmagnetic material layer, a free magnetic layer, a second antiferromagnetic layer, and a nonmagnetic layer, these components being arranged on a substrate in this order from the bottom;

(g) carrying out a first annealing in a magnetic field to generate an exchange coupling magnetic field between the first antiferromagnetic layer and the pinned magnetic layer to fix the magnetization of the pinned magnetic layer along a height direction;

(h) removing a part of the front surface of the nonmagnetic layer;

(i) forming a third antiferromagnetic layer on the nonmagnetic layer;

(j) forming a mask layer on end portions on both sides of the third antiferromagnetic layer, and etching away the central portion of the third antiferromagnetic layer not covered by the mask layer;

(k) carrying out a second annealing in a magnetic field to generate an exchange coupling magnetic field between both end portions of the second antiferromagnetic layer under the third antiferromagnetic layer that are left under the mask layer and both end portions of the free magnetic layer to fix the magnetization of both end portions of the free magnetic layer in a direction crossing the pinned magnetic layer magnetization direction.

In step (f) above, the first antiferromagnetic layer through the nonmagnetic layer are formed in succession on the substrate. Leaving a part of the nonmagnetic layer in step (h) allows the second antiferromagnetic layer formed thereunder to be protected from damage caused by ion milling. Further, the nonmagnetic layer is shallowly etched away to allow an antiferromagnetic interaction between the third antiferromagnetic layer formed on the nonmagnetic layer and the second antiferromagnetic layer under the nonmagnetic layer, which permits the second antiferromagnetic layer and the third antiferromagnetic layer to act like a one-piece antiferromagnetic layer.

In step (j) above, the third antiferromagnetic layer at its central portion not covered by the mask layer is etched away, and the thick antiferromagnetic layer composed of the second antiferromagnetic layer and the third antiferromagnetic layers is left on both end portions of the free magnetic layer. With this arrangement, the magnetization of both end portions of the free magnetic layer can be properly fixed in the track width direction by the exchange coupling magnetic field generated between both end portions of the free magnetic layer and the second antiferromagnetic layer. On the other hand, the magnetization of the central portion of the free magnetic layer is not firmly fixed along the track width direction, so the central portion of the free-magnetic layer is weakly magnetized to a level that permits inverted magnetization in response to an external magnetic field.

With this arrangement, the free magnetic layer can be protected from damage due to ion milling overcutting, which has been a problem in the art, and both end portions of the free magnetic layer can be provided with a sufficient longitudinal bias magnetic field. Thus, the magnetization of the free magnetic layer can be properly controlled.

Hence, the present invention makes it possible to manufacture magnetic detection devices featuring high reproduction sensitivity and excellent reproducing characteristics even with narrow tracks.

In step (f) above, the second antiferromagnetic layer preferably has a thickness in the range of about 10 angstroms to about 50 angstroms, more preferably from about 30 angstroms to about 40 angstroms. This makes it difficult for the central portion of the second antiferromagnetic layer to develop order transformation by annealing in a magnetic field, so the occurrence of an exchange coupling magnetic field between the central portion of the second antiferromagnetic layer and the central portion of the free magnetic layer can be effectively prevented. Thus, the central portion of the free magnetic layer is formed into a weak single domain so it permits proper inverted magnetization in response to an external magnetic field.

Preferably, the nonmagnetic layer is formed to have a thickness in the range of about 3 angstroms to about 10 angstroms in step (f) above. The limited thickness range permits easy adjustment of the film thickness by trimming the nonmagnetic layer by low-energy ion milling in step (h) above. The limited thickness range also ensures the protection of the second antiferromagnetic layer under the nonmagnetic layer from damage caused by ion milling.

Preferably, the nonmagnetic layer left behind in step (h) above has a thickness that ranges from about 0.2 angstroms to about 3 angstroms. This allows antiferromagnetic interaction between the third antiferromagnetic layer left on both end portions of the free magnetic layer and the second antiferromagnetic layer, so the third antiferromagnetic layer and the second antiferromagnetic layer act like a one-piece antiferromagnetic layer. Thus, the magnetization of both end portions of the free magnetic layer can be properly fixed in the track width direction.

Alternatively, in step (j) above, the third antiferromagnetic layer not covered by the mask layer may be completely removed to expose the front surface of the nonmagnetic layer.

Alternatively, in step (j) above, the third antiferromagnetic layer not covered by the mask layer may be entirely removed, and the exposed nonmagnetic layer may also be entirely removed to expose the front surface of the second antiferromagnetic layer.

Alternatively, the second annealing in a magnetic field in step (k) above may be carried out after step (i) and before step (j).

Alternatively, the substrate in step (f) may be a lower electrode layer, the first insulating layer may be formed on the third antiferromagnetic layer in step (i), the mask layer may be formed on both end portions of the first insulating layer, and the central portions of the first insulating layer and the third antiferromagnetic layer that are not covered by the mask layer may be etched away in step (j), the second insulating layer may be formed onto the first insulating layer, inner end surfaces of the third antiferromagnetic layers, and the central portion sandwiched by the third antiferromagnetic layers. Then, the second insulating layer may be removed, leaving a part of the second insulating layer formed on the inner end surfaces of the third antiferromagnetic layers, after step (j), and the upper electrode layer may be formed onto the first insulating layer to the second insulating layer and the central portion.

In this case, the magnetic detection device is the CPP type. The presence of the first insulating layer and the second insulating layer between the upper electrode layer and the third antiferromagnetic layer makes it possible to prevent the current passing from the upper electrode layer to the multilayer film from shunting to the third antiferromagnetic layer. This makes it possible to fabricate magnetic detection devices that feature high reproduction output and narrower effective reproduction tracks, which are suited for higher recording densities.

Alternatively, in place of step (i), the first insulating layer may be formed on both end portions of the third antiferromagnetic layer, and in place of step (j), the central portion of the third antiferromagnetic layer that is not covered by the first insulating layer may be etched away using the first insulating layer as a mask.

Preferably, the angle for forming the second insulating layer is set to an angle $\theta_1$ with respect to the plane perpendicular to the surface of the lower electrode layer, and the incident angle for trimming the second insulating layer is set to an angle $\theta_2$, which is smaller than the angle $\theta_1$.

The second insulating layer is preferably etched away in a perpendicular direction or a direction close to the perpendicular direction. This makes it easier to partly leave the second antiferromagnetic layer on the inner end surface of the third antiferromagnetic layer. This also properly etches away the second insulating layer or the like which is formed on the central portion of the third antiferromagnetic layer.

Thus, it is possible to easily manufacture a CPP type magnetic detection device in which current properly passes from the upper electrode layer into the multilayer film, and the current does not shunt to the third antiferromagnetic layer.

Alternatively, both end portions of the lower electrode layer may be etched away to form an insulating layer on the end portions on both sides. The first antiferromagnetic layer may be formed on the protuberant portion formed on the central portion of the lower electrode layer, and on the insulating layer.

Alternatively, the lower electrode layer and the upper electrode layer may be formed from a magnetic material.

Preferably, the nonmagnetic layer is formed from one or more elements that include Ru, Re, Pd, Os, Ir, Pt, Au, and Rh. These noble metals are resistant to oxidation, so an increase in film thickness due to oxidation can be prevented, in contrast to Ta films. Moreover, even when these noble metal elements diffuse into an antiferromagnetic layer by annealing or heat treatment, the antiferromagnetic layer properties are not degraded. In comparison with Ru or the like, conventional Ta films are undesirable because they tend to degrade the properties or functions of the antiferromagnetic layer if they diffuse into the antiferromagnetic layer.

According to the present invention, a noble metal such as Ru is used in place of Ta to permit the adjustment of the thickness of the nonmagnetic layer formed from Ru or the like by low-energy ion milling. In addition, the second antiferromagnetic layer formed under the nonmagnetic layer can be properly protected from damage caused by ion milling. Further, and the second and third antiferromagnetic layers on both end portions of the free magnetic layer can function like a one-piece antiferromagnetic layer through the nonmagnetic layer. This arrangement permits the magnetization of both end portions of the free magnetic layer to be fixed more effectively along the track width direction.

Preferably, the free magnetic layer is formed using a three-layer structure in step (a) or (f). In particular, the free magnetic layer preferably has a CoFe/NiFe/CoFe three-layer structure.

BRIEF DESCRIPTION OF THE DRAWINGS

FIG. 15 is a partial enlarged sectional view showing an embodiment of a free magnetic layer in accordance with the present invention observed from a surface opposing a recording medium;

FIG. 16 is a partial enlarged sectional view showing another embodiment of the free magnetic layer in accordance with the present invention observed from a surface opposing a recording medium;

DESCRIPTION OF THE PREFERRED EMBODIMENTS

Figure 1:
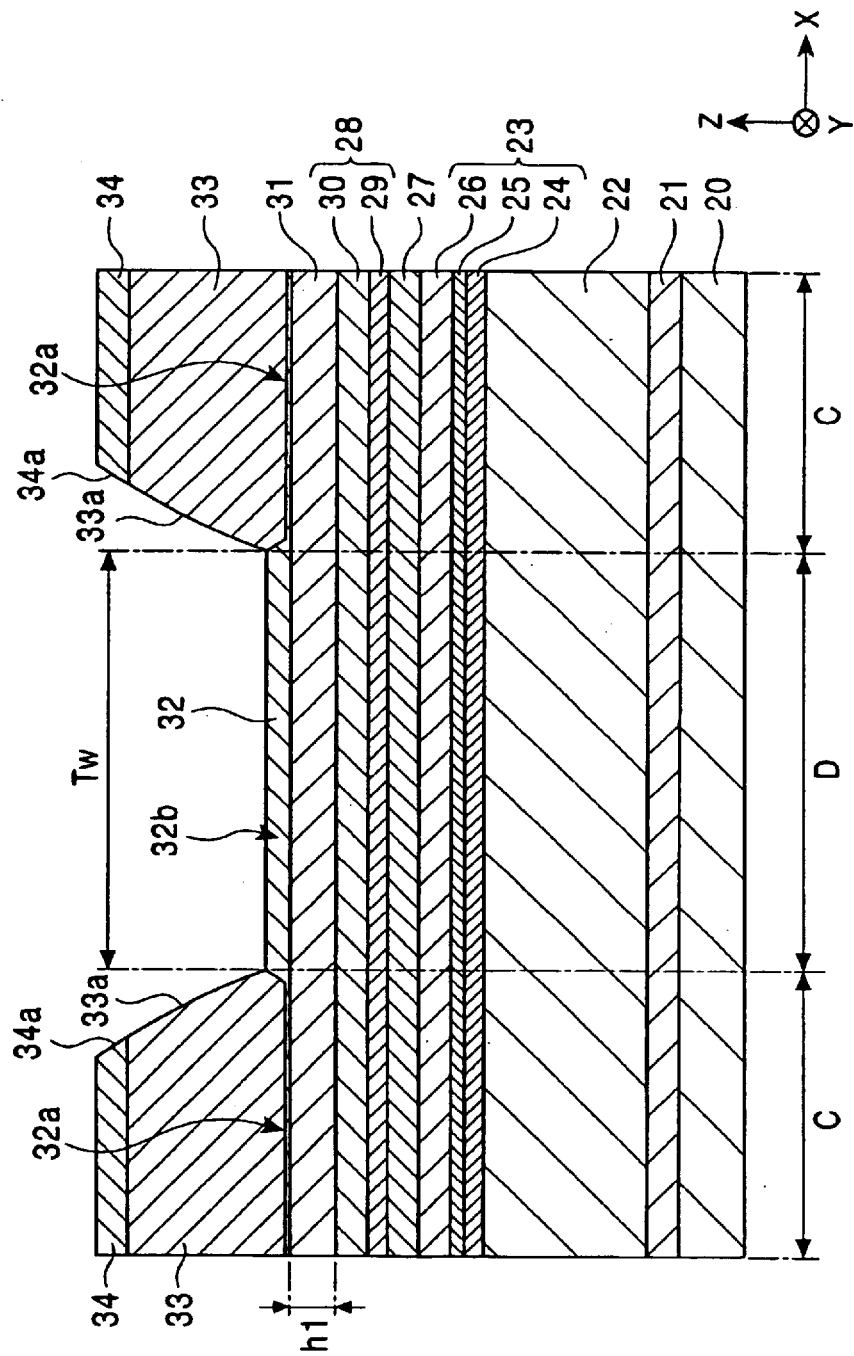
FIG. 1 is a partial sectional view of the structure of a magnetic detection device according to a first embodiment of the present invention observed from a surface opposing a recording medium.

FIG. 1 is a partial sectional view showing the structure of a magnetic detection device, namely, a spin valve type thin-film element, in accordance with the present invention that is observed from its surface opposing a recording medium.

A seed layer 21 made of a NiFe alloy, NiFeCr alloy, Cr, or the like is formed on a substrate 20. The seed layer 21 is formed from, for example, $(Ni_{0.8}Fe_{0.2})_{60at\%}Cr_{40at\%}$, with a thickness of about 60 angstroms.

A first antiferromagnetic layer 22 is formed on the seed layer 21. The first antiferromagnetic layer 22 is formed from a PtMn alloy or X—Mn alloy (X being one or more elements selected from Pd, Ir, Rh, Ru, Os, Ni, and Fe), or a Pt—Mn—X' alloy (X' being one or more elements selected from Pd, Ir, Rh, Ru, Au, Ag, Os, Cr, Ni, Ar, Ne, Xe, and Kr).

Using the above alloys and subjecting them to heat treatment for the first antiferromagnetic layer 22 makes it possible to obtain an exchange coupling film for a first antiferromagnetic layer 22 and a pinned magnetic layer 23 that generates a large exchange coupling magnetic field. Especially when the PtMn alloy is used, an excellent exchange coupling film for the first antiferromagnetic layer 22 and the pinned magnetic layer 23 can be obtained that has an exchange coupling magnetic field of about 48 kA/m or more, e.g., about 64 kA/m, and an extremely high blocking temperature of about 380° C., at which the exchange coupling magnetic field is lost.

The alloys have an irregular face-centered cubic structure (fcc) immediately following film formation, and transforms into a CuAuI regular face-centered tetragonal structure (fct) after being subjected to heat treatment.

The thickness of the first antiferromagnetic layer 22 ranges from about 80 angstroms to about 300 angstroms in the vicinity of the center thereof in the track width direction.

The pinned magnetic layer 23 is formed on the first antiferromagnetic layer 22. The pinned magnetic layer 23 has an artificial ferri-structure. The pinned magnetic layer 23 is composed of three layers, namely, magnetic layers 24 and 26, and a nonmagnetic intermediate layer 25 sandwiched between the magnetic layers 24 and 26.

The magnetic layers 24 and 26 are formed from a magnetic material, such as a NiFe alloy, Co, a CoNiFe alloy, a CoFe alloy, or a CoNi alloy. Preferably, the magnetic layer 24 and the magnetic layer 26 are made of the same material.

The nonmagnetic intermediate layer 25 is made of a nonmagnetic material, and formed from an alloy made of one or more elements selected from Ru, Rh, Ir, Cr, Re, and Cu. Layer 25 is preferably formed from Ru.

A nonmagnetic material layer 27 is formed on the pinned magnetic layer 23. The nonmagnetic material layer 27 prevents magnetic coupling between the pinned magnetic layer 23 and the free magnetic layer 28, and primarily senses current passing through the layer 27. The nonmagnetic material layer 27 is preferably made of an electrically conductive nonmagnetic material such as Cr, Au, and Ag, more preferably Cu.

A free magnetic layer 28 is formed on the nonmagnetic material layer 27. The free magnetic layer 28 of the embodiment shown in FIG. 1 has two layers. A diffusion restraining layer 29 made of Co or CoFe prevents mutual diffusion between the free magnetic layer 28 and the nonmagnetic material layer 27. A magnetic material layer 30 made of a NiFe alloy or the like is formed on the diffusion restraining layer 29.

A second antiferromagnetic layer 31 is formed on the free magnetic layer 28. As in the case of the first antiferromagnetic layer 22, the second antiferromagnetic layer 31 is made of a PtMn alloy or X—Mn alloy (X being one or more elements selected from Pd, Ir, Rh, Ru, Os, Ni, and Fe), or a Pt—Mn—X' alloy (X' being one or more elements selected from Pd, Ir, Rh, Ru, Au, Ag, Os, Cr, Ni, Ar, Ne, Xe, and Kr).

In the embodiment shown in FIG. 1, a nonmagnetic layer 32 is formed on the second antiferromagnetic layer 31. Third antiferromagnetic layers 33 are deposited on end portions 32a on both sides of the nonmagnetic layer 32. As in the case of the first antiferromagnetic layer 22, the third antiferromagnetic layers 33 are formed from a PtMn alloy or X—Mn alloy (X being one or more elements selected from Pd, Ir, Rh, Ru, Os, Ni, and Fe), or a Pt—Mn—X' alloy (X' being one or more elements selected from Pd, Ir, Rh, Ru, Au, Ag, Os, Cr, Ni, Ar, Ne, Xe, and Kr). Preferably, the third antiferromagnetic layers 33 are formed from the same material as that of the second antiferromagnetic layer 31.

Electrode layers 34 are formed on the third antiferromagnetic layers 33. The electrode layers 34 are made of, for example, Au, W, Cr, Ru, and Ta.

In the embodiment shown in FIG. 1, inner end portions 33a of the third antiferromagnetic layers 33 and inner end portions 34a of the electrode layers 34 are formed to have sloped or curved surfaces such that they gradually increase the gap between the third antiferromagnetic layers 33 from the bottom surface toward the top surface (along direction Z in the drawing). The same configuration applies to the laminates shown in FIG. 2 and FIG. 3.

Characteristic aspects of the magnetic detection device shown in FIG. 1 will be described.

Referring to FIG. 1, the second antiferromagnetic layer 31 is formed on the free magnetic layer 28. The third antiferromagnetic layers 33 are formed on both end portions (both labeled C) of the second antiferromagnetic layer 31 with the nonmagnetic layer 32 in the middle. Preferably, the end portions 32a on both sides of the nonmagnetic layer 32 that are sandwiched between the second antiferromagnetic layer 31 and the third antiferromagnetic layer 33 are thin, preferably about 3 angstroms or less.

Forming a thin nonmagnetic layer 32 as mentioned above causes an antiferromagnetic interaction to occur between the second antiferromagnetic layer 31 and the third antiferromagnetic layers 33 through the nonmagnetic layer 32. This makes it easy for the second antiferromagnetic layer 31 and the third antiferromagnetic layers 33 to act like a one-piece antiferromagnetic layer;

Thus, the embodiment illustrated in FIG. 1 has a construction similar to one in which a thick antiferromagnetic layer exhibiting antiferromagnetic properties is formed on both end portions C of the free magnetic layer 28. Thus, the magnetization of both end portions C of the free magnetic layer 28 is properly fixed along the track width direction (direction X in the drawing) by the exchange coupling magnetic field generated between the free magnetic layer 28 and both end portions C of the second antiferromagnetic layer 31.

In the embodiment shown in FIG. 1, the second antiferromagnetic layer 31 is also formed on a central portion D of the free magnetic layer 28, whereas a third antiferromagnetic layer 33 is not provided on the central portion D.

According to the present invention, a thickness h1 of the second antiferromagnetic layer 31 is adjusted in a film forming stage so the central portion D of the second antiferromagnetic layer 31 loses its antiferromagnetic properties (turns non-antiferromagnetic or nonmagnetic).

Preferably, the thickness h1 of the second antiferromagnetic layer 31 ranges from about 20 angstroms to about 50 angstroms, more preferably from about 30 angstroms to about 40 angstroms. Forming a thin second antiferromagnetic layer 31 within the above range makes it difficult for the central portion D of the second antiferromagnetic layer 31 to develop order transformation even when subjected to annealing in a magnetic field. Hence, no exchange coupling magnetic field is generated between the central portion D of the second antiferromagnetic layer 31 and the central portion D of the free magnetic layer 28. Even if an exchange coupling magnetic field is produced, its magnitude will be small.

The thickness of the second antiferromagnetic layer 31 is preferably 20 angstroms or more, more preferably 30 angstroms or more, because of the following reason. If the second antiferromagnetic layer 31 is excessively thin, the exchange coupling magnetic field generated between both end portions C of the second antiferromagnetic layer 31 and both end portions C of the free magnetic layer 28 weakens. This weakened exchange coupling magnetic field may prevent proper magnetic fixation of both end portions C of the free magnetic layer 28 in the track width direction.

As described above, the antiferromagnetic interaction takes place between both end portions C of the second antiferromagnetic layer 31 and the third antiferromagnetic layers 33 formed thereon through the nonmagnetic layer 32. This causes both end portions C of the second antiferromagnetic layer 31 and the third antiferromagnetic layers 33 to function like a one-piece antiferromagnetic layer; physically, however, they are not completely integral, so that the order transformation of the second antiferromagnetic layer 31 will be inadequate if the second antiferromagnetic layer 31 is excessively thin. This results in an inadequate exchange coupling magnetic field produced between both end portions C of the second antiferromagnetic layer 31 and both end portions C of the free magnetic layer 28. For this reason, the thickness of the second antiferromagnetic layer 31 is set to about 20 angstroms or more, preferably about 30 angstroms or more.

Furthermore, the shunt loss in the central portion D can be reduced and the reproducing output can be increased by setting the thickness of the second antiferromagnetic layer 31 to a range of between about 20 angstroms to about 50 angstroms, more preferably of between about 30 angstroms to about 40 angstroms.

Preferably, the total thickness of both end portions C of the second antiferromagnetic layer 31 and the thickness of the third antiferromagnetic layers 33 ranges from about 80 angstroms to about 300 angstroms. This makes it possible to impart appropriate antiferromagnetic properties to both end portions C of the second antiferromagnetic layer 31 and cause both end portions C of the second antiferromagnetic layer 31 to develop order transformation by annealing in a magnetic field. An exchange coupling magnetic field is produced between both end portions C of the second antiferromagnetic layer 31 and both end portions C of the free magnetic layer 28, which fixes the magnetization of both end portions C of the free magnetic layer 28 along the track width direction.

The nonmagnetic layer 32 will now be described. The nonmagnetic layer 32 protects the second antiferromagnetic layer 31 from oxidation due to air exposure.

Preferably, the nonmagnetic layer 32 is made of a material more resistant to oxidation due to air exposure than a Ta film. Furthermore, the element constituting the nonmagnetic layer 32 is preferably made of a material that does not cause deterioration in the antiferromagnetic layer properties during a film forming stage, or even when it diffuses into the second antiferromagnetic layer 31 or the third antiferromagnetic layers 33 by annealing in a magnetic field to adjust the direction of the magnetization of the pinned magnetic layer 23 or the free magnetic layer 28.

Preferably, the nonmagnetic layer 32 is made of one or more elements of selected from Ru, Re, Pd, Os, Ir, Pt, Au, and Rh. Among these elements, Ru is preferred. The nonmagnetic layer 32 formed from these noble metals is resistant to oxidation even when exposed to the atmosphere. Thus, the film thickness of the non-magnetic layer 32 does not increase via oxidation, unlike a Ta film.

Moreover, even if these noble metal elements used for the nonmagnetic layer 32 are diffused in the second antiferromagnetic layer 31 or the third antiferromagnetic layers 33, the properties of the antiferromagnetic layers are not degraded.

Whether an element constituting the nonmagnetic layer 32 has diffused into the second antiferromagnetic layer 31 or the third antiferromagnetic layers 33 can be verified using, for example, a SIMS analyzer. In a diffusion region, if the second antiferromagnetic layer 31 is made of a PtMn alloy and the nonmagnetic layer 32 is made of Ru in the film formation stage, a diffusion layer of an alloy of Ru—Pt—Mn is formed by annealing in a magnetic field. A Ru—Pt—Mn alloy makes an appropriate antiferromagnetic layer.

The thickness of the nonmagnetic layer 32 will now be described. The nonmagnetic layer 32 is preferably formed to have a thickness in the range of between about 3 angstroms to about 10 angstroms during film formation. The nonmagnetic layer 32 formed from Ru or the like is a dense layer resistant to oxidation when exposed the atmosphere, so the second antiferromagnetic layer 31 can be effectively protected from oxidation caused by exposure to the atmosphere even when the nonmagnetic layer 32 is thin.

The thickness upon completion of film formation essentially remains unchanged at the central portion 32b of the nonmagnetic layer 32 because the central portion 32b is not subjected to ion milling, as it will be explained below in connection with a manufacturing method of the invention.

The end portions 32a on both sides of the nonmagnetic layer 32 are etched away during ion milling. The end portions 32a are made thinner than the central portion 32b so that antiferromagnetic interaction can take place between both end portions C of the second antiferromagnetic layer 31 and the third antiferromagnetic layers 33 formed thereon through the the nonmagnetic layer 32. As a result, the third antiferromagnetic layers 33 and both end portions C of the second antiferromagnetic layer 31 function like a one-piece antiferromagnetic layer.

If the nonmagnetic layer 32 is excessively thick, then the concentration of a nonmagnetic substance such as Ru will not be properly diluted, causing the nonmagnetic layer 32 to remain thick after annealing. This prevents antiferromagnetic interaction from taking place between the second antiferromagnetic layer 31 and the third antiferromagnetic layers 33. The second antiferromagnetic layer 31 alone is formed to be so thin that no exchange coupling magnetic field is-generated between the second antiferromagnetic layer 31 and the free magnetic layer 28, as set forth above, thus preventing the magnetization of both end portions C of the free magnetic layer 28 from being properly fixed.

The thickness of the end portions 32a on both sides of the nonmagnetic layer 32 is preferably about 3 angstroms or less. By making the nonmagnetic layer 32 this thin, antiferromagnetic interaction can be induced between both end portions C of the second antiferromagnetic layer 31 and the third antiferromagnetic layers 33. This interaction causes both end portions C of the second antiferromagnetic layer 31 and the third antiferromagnetic layers 33 to function as an integral antiferromagnetic layer.

A part of the end portions 32a on both sides of the nonmagnetic layer 32 is left to protect the second antiferromagnetic layer 31 from damage due to ion milling, thereby preventing the magnetic characteristics of the second antiferromagnetic layer 31 from deteriorating.

The end portions 32a on both sides of the nonmagnetic layer 32 can be made extremely thin, e.g., about 3 angstroms or less, as shown in FIG. 1, because low-energy ion milling can be implemented. The nonmagnetic layer 32 is originally formed to have a small thickness in the range of about 3 angstroms to about 10 angstroms during film formation. Hence, the thickness of the nonmagnetic layer 32 can be adequately adjusted even with the low-energy ion milling. Since the low-energy milling has a lower milling rate than high-energy milling, it is relatively easy to stop milling in the middle of trimming the nonmagnetic layer 32.

In the embodiment shown in FIG. 1, the interval along the track width direction (direction X in the drawing) between the bottom surface edges of the third antiferromagnetic layers 33 is set as the track width Tw. The track width Tw is preferably set to about 0.2 μm or less.

In the embodiment shown in FIG. 1, the magnetization of both end portions C of the free magnetic layer 28 has been properly fixed in the track width direction (the direction X in the drawing), while the central portion D of the free magnetic layer 28 is formed into a weak single domain that permits inverted magnetization in response to an external magnetic field. The width of the central portion D of the free magnetic layer 28 in the track width direction is substantially identical to the track width Tw, allowing the magnetization of the free magnetic layer 28 in the track width Tw region to be properly inverted in response to an external magnetic field.

In the embodiment shown in FIG. 1, the second antiferromagnetic layer 31 is formed on the free magnetic layer 28, and the nonmagnetic layer 32 is etched away by ion milling. Unlike the prior art, therefore, the free magnetic layer 28 will not be etched away by ion milling or the like, so the degradation of the magnetic characteristics of the free magnetic layer 28 due to ion milling is solved by the embodiment shown in FIG. 1.

According to the present invention, the second antiferromagnetic layer 31 is formed on the free magnetic layer 28. The third antiferromagnetic layers 33 are deposited on both end portions C of the second antiferromagnetic layer 31 through the nonmagnetic layer 32. This arrangement allows the magnetization of the free magnetic layer 28 to be properly controlled even with narrow tracks, making it possible to fabricate a magnetic detection device capable of successfully accommodating tracks narrower than those in conventional magnetic detection devices.

Figure 2:
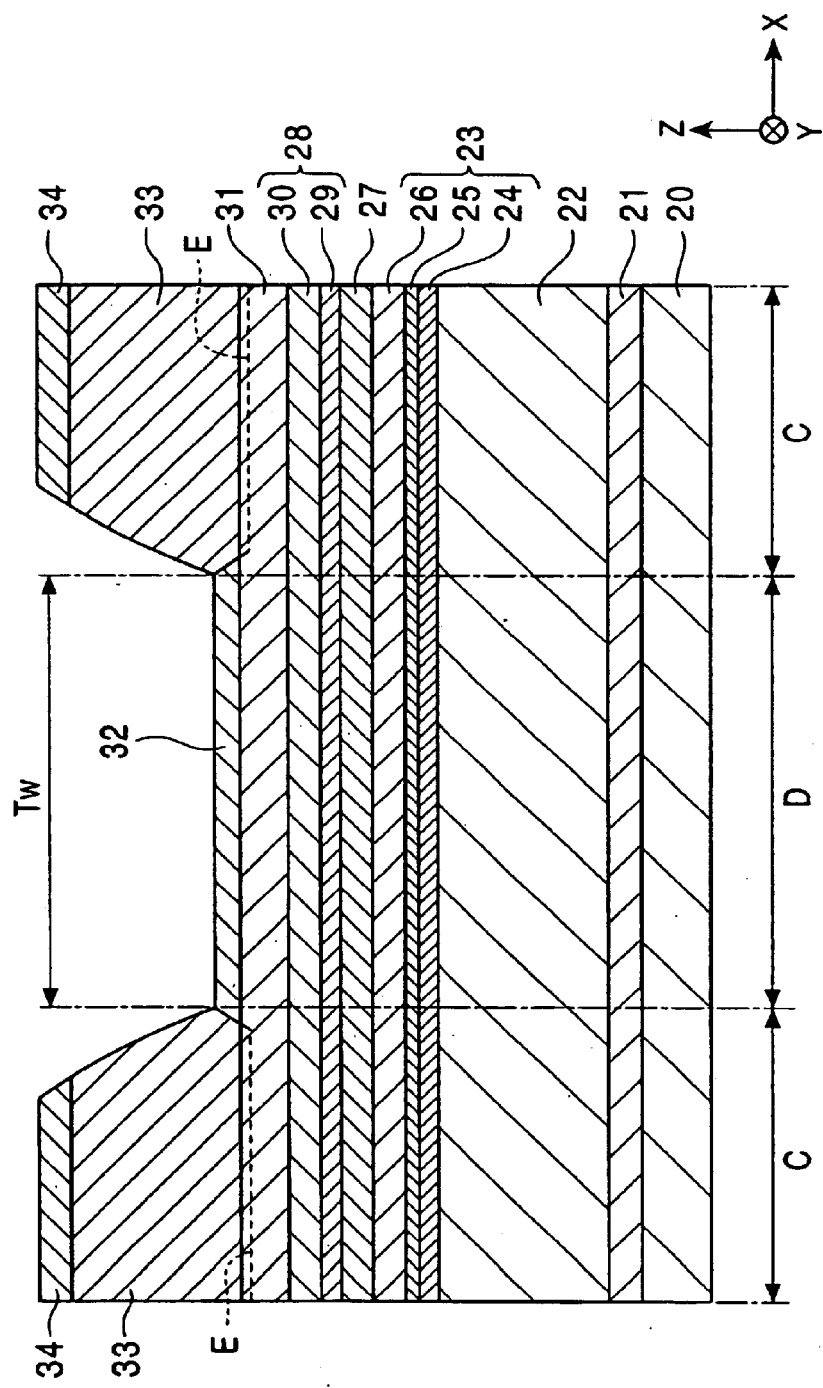
FIG. 2 is a partial sectional view of the structure of a magnetic detection device according to a second embodiment of the present invention observed from a surface opposing a recording medium.

FIG. 2 is a partial sectional view showing the structure of a magnetic detection device according to a second embodiment of the present invention, as observed from its surface opposing a recording medium.

The magnetic detection device shown in FIG. 2 is different from that shown in FIG. 1 in that the nonmagnetic layer 32 is provided only between the third antiferromagnetic layers 33. In other words, the nonmagnetic layer 32 is provided only in the interval defined by the track width Tw. Hence, the nonmagnetic layer 32 is not provided between the third antiferromagnetic layers 33 and both end portions C of second antiferromagnetic layer 31.

Preferably, the nonmagnetic layer 32 shown in FIG. 2 is made of one or more elements selected from Ru, Re, Pd, Os, Ir, Pt, Au, and Rh. The nonmagnetic layer 32 made of these noble metals is resistant to oxidation even when exposed to the atmosphere. Especially when the nonmagnetic layer 32 is formed from Ru, the nonmagnetic layer 32 is capable of properly protecting the second antiferromagnetic layer 31 from oxidation caused by air exposure even if layer 32 is thin. According to the present invention, the nonmagnetic layer 32 is preferably formed to have a thickness in the range of about 3 angstroms to about 10 angstroms.

As will be explained in connection with the manufacturing method hereinafter, both end portions of the nonmagnetic layer 32 formed on the entire surface of the second antiferromagnetic layer 31 are etched away by ion milling. The third antiferromagnetic layers are deposited on the exposed two end portions C of the second antiferromagnetic layer 31. Since the nonmagnetic layer 32 has a thickness in the range of between about 3 angstroms to about 10 angstroms, the nonmagnetic layer 32 can be effectively removed by low-energy ion milling. Thus, milling can be easily controlled to avoid trimming the second antiferromagnetic layer 31, in contrast to when high-energy ion milling is performed. This minimizes damage to the second antiferromagnetic layer 31 under the nonmagnetic layer 32, and maintains the good magnetic characteristics of the second antiferromagnetic layer 31.

As with the magnetic detection device of FIG. 1, the second antiferromagnetic layer 31 in the embodiment shown in FIG. 2 is preferably also made of a thin film ranging from about 20 angstroms to about 50 angstroms. Preferably, a central portion D of the second antiferromagnetic layer 31 has non-antiferromagnetic properties. No exchange coupling magnetic field is generated between the central portion D of the second antiferromagnetic layer 31 and the central portion D of the free magnetic layer 28. Even if an exchange coupling magnetic field is generated, its magnitude will be extremely small. Hence, the magnetization of the central portion D of the free magnetic layer 28 can be properly oriented along the track width direction, (direction X in the drawing) to permit inverted magnetization in response to an external magnetic field.

Meanwhile, the second antiferromagnetic layer 31 and the third antiferromagnetic layers 33, which are formed in direct contact with the second antiferromagnetic layer 31, are formed on both end portions C of the free magnetic layer 28. The antiferromagnetic interaction between the second antiferromagnetic layer 31 and the third antiferromagnetic layers 33 imparts antiferromagnetic properties to the second antiferromagnetic layer 31. Thus, when subjected to annealing in a magnetic field, both end portions C of the second antiferromagnetic layer 31 develop order transformation, and an exchange coupling magnetic field is generated between both end portions C of the second antiferromagnetic layer 31 and both end portions C of the free magnetic layer 28. This firmly fixes both end portions C of the free magnetic layer 28 along the track width direction (in direction X in the drawing).

In the embodiment shown in FIG. 2, the second antiferromagnetic layer 31 is formed on the free magnetic layer 28, and the nonmagnetic layer 32 is etched away by ion milling. In the embodiment shown in FIG. 2, the free magnetic layer 28 will not be etched by ion milling, thus preventing damage to the free magnetic layer 28 from ion milling and preventing degradation of the magnetic characteristics.

The construction of the magnetic detection device shown in FIG. 2 allows the magnetization of the free magnetic layer 28 to be properly controlled even with narrow tracks, which makes it possible to fabricate a magnetic detection device capable of successfully accommodating tracks narrower than those in conventional magnetic detection devices.

In FIG. 2, the surfaces of both end portions C of the second antiferromagnetic layers 31 are slightly etched away as indicated by dotted lines E. Even though both end portions C of the second antiferromagnetic layers 31 are thinner than the central portion D of the second antiferromagnetic layers 31, both end portions C of the second antiferromagnetic layers 31 are trimmed by low-energy ion milling. Hence, the damage to both end portions C is less than in the case where high-energy ion milling is used. Thus, it is believed that both end portions C of the second antiferromagnetic layers 31 develop antiferromagnetic properties. It is also hypothesized that an exchange coupling magnetic field sufficient to firmly fix the magnetization of both end portions C of the free magnetic layer 28 can be produced between those end portions and the end portions C of the free magnetic layer 31.

Figure 3:
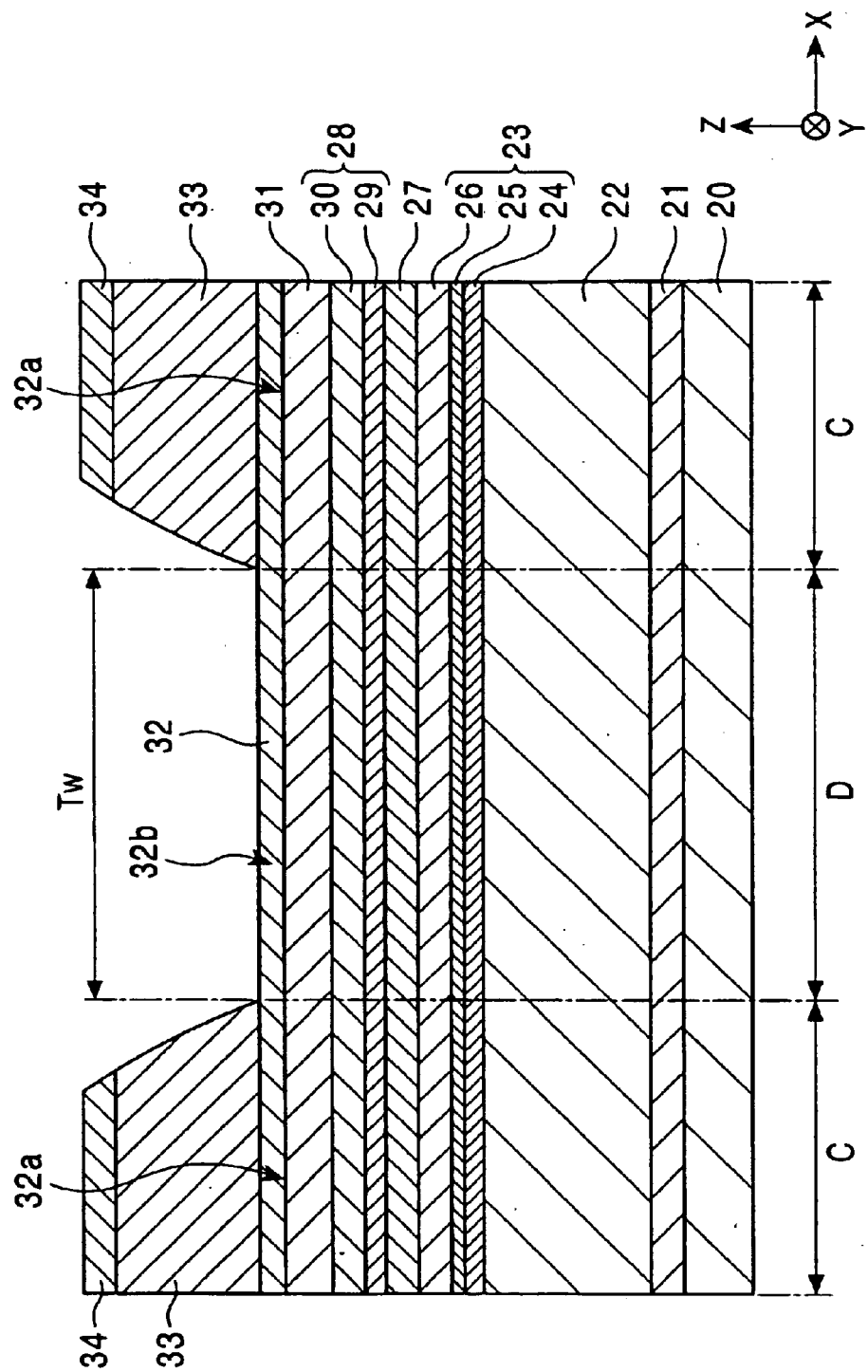
FIG. 3 is a partial sectional view of the structure of a magnetic detection device according to a third embodiment of the present invention observed from a surface opposing a recording medium.

FIG. 3 is a partial sectional view of the structure of a magnetic detection device according to a third embodiment of the present invention, as observed from its surface opposing a recording medium.

Unlike the magnetic detection device shown in FIG. 1, the magnetic detection device shown in FIG. 3 has a nonmagnetic layer 32 that has a predetermined thickness and which is deposited on the second antiferromagnetic layer 31. Specifically, the central portion 32b and the end portions 32a at both sides of the nonmagnetic layer 32 have the same thickness. Preferably, the nonmagnetic layer 32 is thin, ranging from about 1 angstrom to about 3 angstroms.

It is undesirable to form the nonmagnetic layer 32 thinner than about 1 angstrom because it would degrade the protection from oxidation caused by air exposure afforded by the second antiferromagnetic layers 31 On the other hand, if the nonmagnetic layer 32 is thicker than 3 angstroms, the concentration of a nonmagnetic substance such as Ru will not be adequately diluted by diffusion, and the nonmagnetic layer 32 will remain thick even after annealing. This makes it difficult for an antiferromagnetic interaction to take place between both end portions C of the second antiferromagnetic layers 31 and the third antiferromagnetic layers 33, thus making it difficult for the second antiferromagnetic layer 31 and the third antiferromagnetic layers 33 to act like an integral antiferromagnetic layer. In this case, the second antiferromagnetic layer 31 has a thickness that does not produce an exchange coupling magnetic field between the second antiferromagnetic layer 31 and the free magnetic layer 28. As a result, both end portions C of the second antiferromagnetic layer 31 will not adequately develop order transformation when subjected to annealing in a magnetic field. Thus, no or very little exchange coupling magnetic field will be generated between both end portions C of the second antiferromagnetic layer 31 and both end portions C of the free magnetic layer 28. Thus, the magnetization of both end portions C of the free magnetic layer 28 will not be firmly fixed along the track width direction (direction X in the drawing).

For the reason set forth above, the thickness of the nonmagnetic layer 32 ranges from about 1 angstrom to about 3 angstroms.

As with the magnetic detection device in FIG. 1, the second antiferromagnetic layer 31 of the magnetic detection device shown in FIG. 3 preferably has a thickness that ranges from about 20 angstroms to 50 angstroms. The central portion D of the second antiferromagnetic layer 31 exhibits non-antiferromagnetic or nonmagnetic properties, and no or very little exchange coupling magnetic field will be generated between the central portion D of the second antiferromagnetic layer 31 and the central portion D of the free magnetic layer 28. Hence, the magnetization of the central portion D of the free magnetic layer 28 is oriented along the track width direction (direction X in the drawing) to an extent that permits inverted magnetization in response to an external magnetic field.

The second antiferromagnetic layer 31 is deposited on both end portions C of the free magnetic layer 28, and the third antiferromagnetic layers 33 are formed on the second antiferromagnetic layer 31, sandwiching the nonmagnetic layer 32. Antiferromagnetic interaction takes place between the second antiferromagnetic layer 31 and the third antiferromagnetic layers 33, imparting antiferromagnetic properties to both end portions C of the second antiferromagnetic layer 31. Therefore, both end portions C of the second antiferromagnetic layer 31 develop order transformation when subjected to annealing in a magnetic field, generating an exchange coupling magnetic field between both end portions C of the second antiferromagnetic layer 31 and both end portions C of the free magnetic layer 28. Thus, the magnetization of both end portions C of the free magnetic layer 28 are firmly fixed in the track width direction (direction X in the drawing).

In FIG. 3, the free-magnetic layer 28 is not etched by techniques such as ion milling. This prevents damage to the free magnetic layer 28 from ion milling which causes deterioration of the magnetic characteristics.

The structure of the magnetic detection device shown in FIG. 3 allows proper control of the magnetization of the free magnetic layer 28 even with narrower tracks, making it possible to fabricate magnetic detection devices capable of successfully accommodating tracks narrower than those in conventional magnetic detection device.

Figure 4:
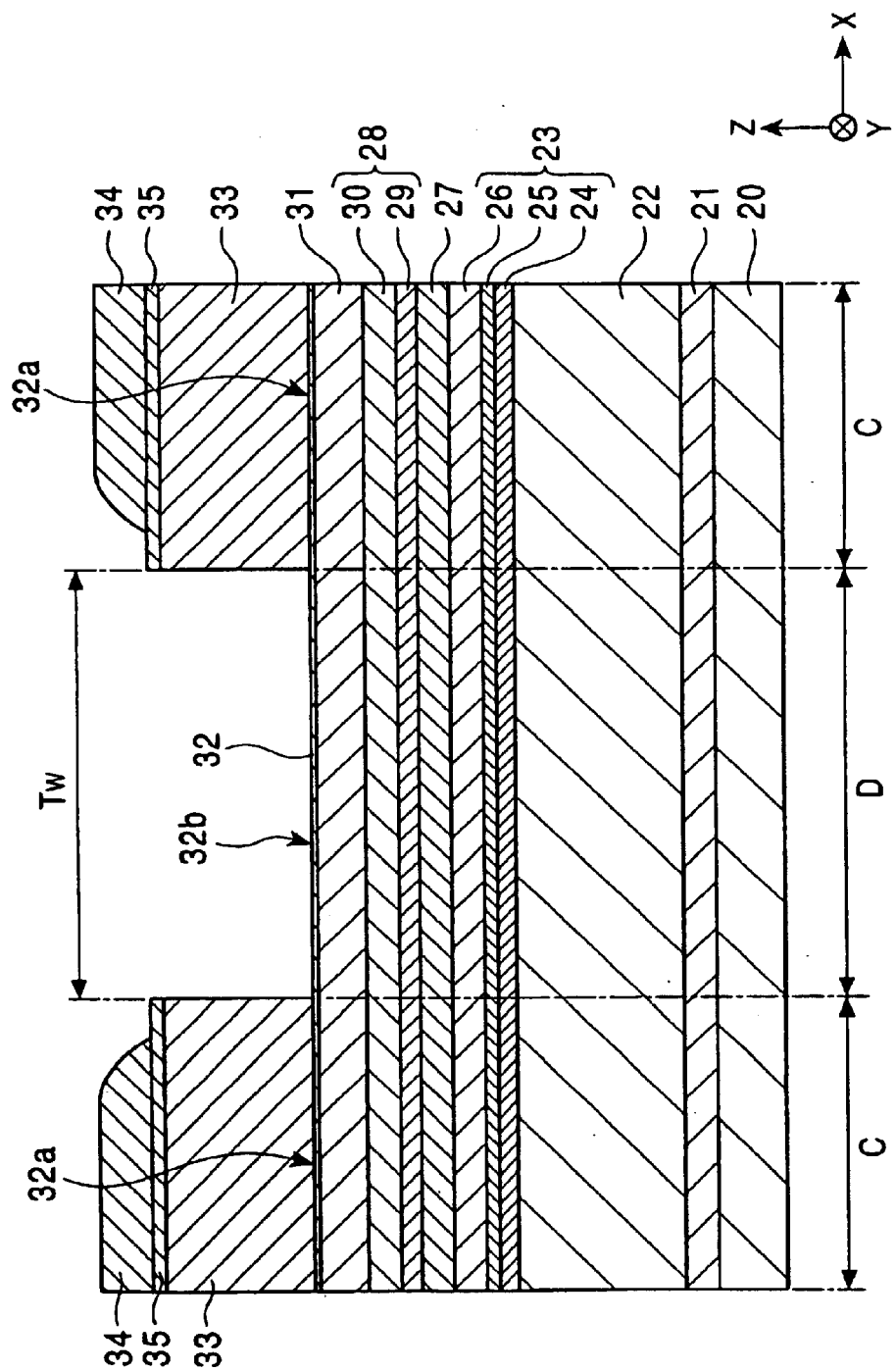
FIG. 4 is a partial sectional view of the structure of a magnetic detection device according to a fourth embodiment of the present invention observed from a surface opposing a recording medium.

FIG. 4 is a partial sectional view of the structure of a magnetic detection device according to a fourth embodiment of the present invention, as observed from its surface opposing a recording medium.

In FIG. 4, a seed layer 21, a first antiferromagnetic layer 22, a pinned magnetic layer 23, a nonmagnetic material layer 27, a free magnetic layer 28, a second antiferromagnetic layer 31, and a nonmagnetic layer 32 are deposited in this order on a substrate 20. The materials of these layers are the same as those described in conjunction with FIG. 1.

In the embodiment shown in FIG. 4, the third antiferromagnetic layers 33 are deposited on both end portions 32a of the nonmagnetic layer 32. Electrode layers 34 are deposited on the third antiferromagnetic layers 33 through the intermediate layers 35 formed from a material such as Ta.

In the embodiment shown in FIG. 4, the track width Tw is defined by the interval between the bottom surface edges of the third antiferromagnetic layers 33. Preferably, the track width Tw is about 0.2 µm or less.

Further, in the embodiment shown in FIG. 4, a thin nonmagnetic layer 32 is formed on the entire surface of the second antiferromagnetic layer 31. The nonmagnetic layer 32 is preferably made of a material resistant to oxidation even when exposed to the atmosphere. Preferably, the nonmagnetic layer 32 is made of an element that does not degrade the properties of antiferromagnetic layers when the element diffuses into the second antiferromagnetic layer 31 or the third antiferromagnetic layers 33. Preferably, the nonmagnetic layer 32 is formed from one or more noble metals selected from Ru, Re, Pd, Os, Ir, Pt, Au, and Rh. Preferably, the nonmagnetic layer 32 is formed with a thickness that ranges between about 0.2 angstroms to about 3 angstroms. A thickness of about 0.2 angstroms in this case is the mean value of the entire nonmagnetic layer 32, and is smaller than the thickness of an atomic layer. Hence, the nonmagnetic layer 32 has areas with atoms and areas without, the areas being distributed like islands. For this reason, a thickness of about 0.2. angstroms refers to the mean value of the entire nonmagnetic layer 32.

Since the nonmagnetic layer 32 is formed to be as thin as described above, the antiferromagnetic interaction takes place between the second antiferromagnetic layer 31 and the third antiferromagnetic layers 33 despite the presence of the nonmagnetic layer 32 between both end portions C of the second antiferromagnetic layer 31 and the third antiferromagnetic layers 33. This imparts antiferromagnetic properties to both end portions C of the second antiferromagnetic layer 31. Also, this causes both end portions C of the second antiferromagnetic layer 31 to develop order transformation by annealing in a magnetic field, and an exchange coupling magnetic field is generated between both end portions C of the second antiferromagnetic layer 31 and both end portions C of the free magnetic layer 28. As a result, the magnetization of both end portions C of the free magnetic layer 28 is firmly fixed along the track width direction (direction X in the drawing).

Although the second antiferromagnetic layer 31 is formed on the central portion D of the free magnetic layer 28, the second antiferromagnetic layer 31 has a thickness such that it does not exhibit antiferromagnetic properties by itself. Preferably, the thickness of the second antiferromagnetic layer 31 ranges from about 20 angstroms to about 50 angstroms, more preferably from about 30 angstroms to about 40 angstroms. This makes it difficult for the central portion D of the second antiferromagnetic layer 31 to develop order transformation by annealing in a magnetic field, so that no or very little exchange coupling magnetic field is generated between the central portion D of the free magnetic layer 28 and the central portion D of the second antiferromagnetic layer 31. Thus, the free magnetic layer 28 is formed into a weak single domain to an extent that permits inverted magnetization in response to an external magnetic field.

As mentioned above, the nonmagnetic layer 32 is formed from a noble metal or metals, such as Ru. The material constituting the nonmagnetic layer 32 sometimes diffuses into the second antiferromagnetic layer 31 or the third antiferromagnetic layers 33 by annealing in a magnetic field, which is performed to control the magnetization of the free magnetic layer 28 or the pinned magnetic layer 23. When the second antiferromagnetic layer 31 and the third antiferromagnetic layers 33 are made of a PtMn alloy, and the nonmagnetic layer 32 is made of Ru, an area in the vicinity of the surface of the second antiferromagnetic layer 31 or the bottom surfaces of the third antiferromagnetic layers 33 turns into an antiferromagnetic layer made of Ru—Pt—Mn due to thermal diffusion.

The material made of Ru—Pt—Mn, functions as an antiferromagnetic material. Hence, the diffusion of one or more elements in the nonmagnetic layer 32 into the second antiferromagnetic layer 31 or the third antiferromagnetic layers 33 will not degrade the antiferromagnetic properties. Thus, the thermal diffusion of the nonmagnetic layer 32 to the antiferromagnetic layers 31 and 33 will not interfere with the proper antiferromagnetic function or performance of the second antiferromagnetic layer 31 or the third antiferromagnetic layers 33.

The embodiment shown in FIG. 4 differs from the embodiments shown in FIG. 1 through FIG. 3 in that the inner end portions 33a of the third antiferromagnetic layers 33 are formed such that they extend along a direction perpendicular to the surface of the substrate 20 (direction Z in the drawing). This configuration difference is due to a difference in manufacturing method, as it will be discussed hereinafter.

As in the case of the embodiments shown in FIG. 1 through FIG. 3, the inner end portions 33a of the third antiferromagnetic layers 33 in the embodiment shown in FIG. 4 may be also have sloped or curved surfaces wherein the interval between the third antiferromagnetic layers 33 gradually increases upward from the bottom.

Figure 5:
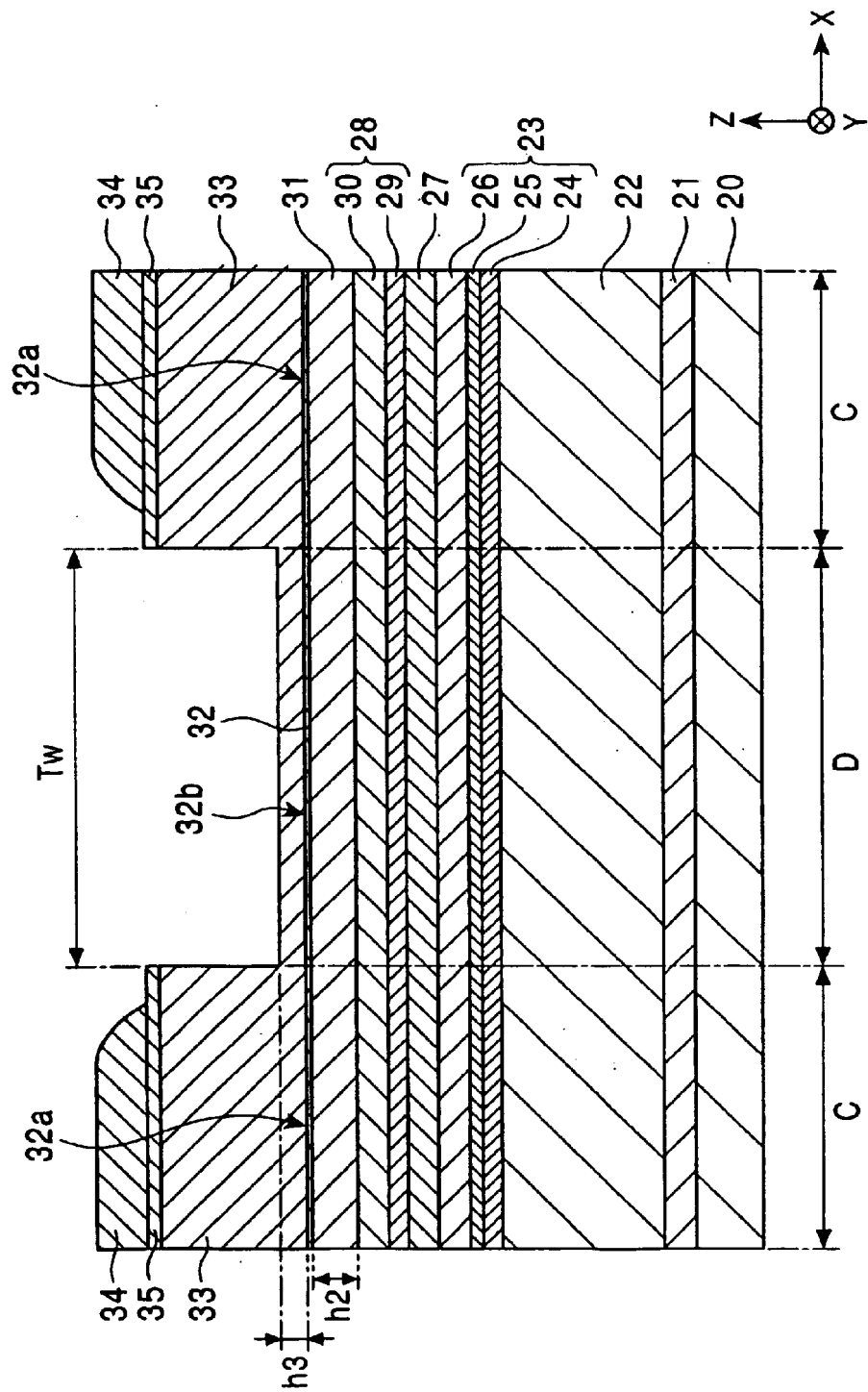
FIG. 5 is a partial sectional view of the structure of a magnetic detection device according to a fifth embodiment of the present invention observed from a surface opposing a recording medium.
Figure 6:
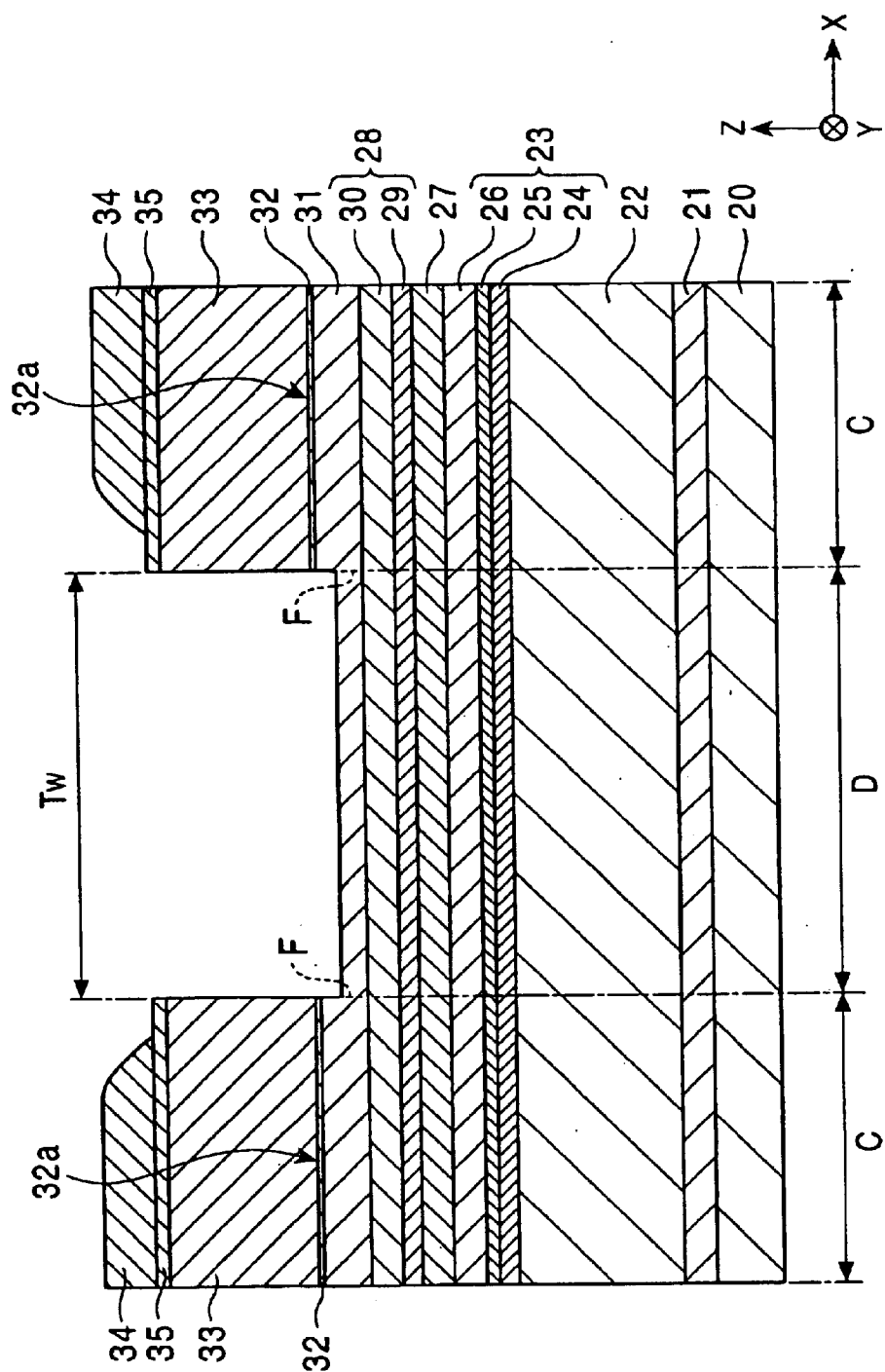
FIG. 6 is a partial sectional view of the structure of a magnetic detection device according to a sixth embodiment of the present invention observed from a surface opposing a recording medium.

The magnetic detection devices shown in FIG. 1 through FIG. 3 are fabricated using the same manufacturing process, while the magnetic detection devices shown in FIG. 4 through FIG. 6 are fabricated using manufacturing methods different from those for the magnetic detection devices shown in FIG. 1 through FIG. 3. The magnetic detection devices shown in FIG. 1 through FIG. 3 share the same structure in that a central portion 32b of the nonmagnetic layer 32 is always left in the interval between the third antiferromagnetic layers 33. In contrast, the magnetic detection devices shown in FIG. 4 through FIG. 6 share the same structure in that the nonmagnetic layer 32 is always left between both end portions C of the second antiferromagnetic layer 31 and the third antiferromagnetic layers 33.

The structure of a magnetic detection device according to another embodiment fabricated using the same manufacturing method as that used for the embodiment shown in FIG. 4 will now be described.

FIG. 5 is a partial sectional view of the structure of a magnetic detection device according to a fifth embodiment of the present invention, as observed from its surface opposing a recording medium.

The structure of the magnetic detection device shown in FIG. 5 is different from that shown in FIG. 4 in that the third antiferromagnetic layer 33 is partly formed also on the central portion 32b of the nonmagnetic layer 32.

In the embodiment shown in FIG. 5, both end portions C of the second antiferromagnetic layer 31 and the third antiferromagnetic layers 33 function like an integrated antiferromagnetic layer. This is due to the antiferromagnetic interaction therebetween through the nonmagnetic layer 32 which has a thickness in the range of about 0.2 angstroms (mean value) to about 3 angstroms. The end portions C at both sides of the second antiferromagnetic layer 31 exhibit antiferromagnetic properties. This causes both end portions C of the second antiferromagnetic layer 31 to develop order transformation by annealing in a magnetic field, and an exchange coupling magnetic field is generated between both end portions C of the second antiferromagnetic layer 31 and both end portions C of the free magnetic layer 28. As a result, the magnetization of both end portions C of the free magnetic layer 28 is firmly fixed along the track width direction (direction X in the drawing).

In this embodiment, a part of the third antiferromagnetic layer 33 is deposited also on the central portion D of the second antiferromagnetic layer 31, the part being thinner than both end portions of the third antiferromagnetic layer 33.

Accordingly, unless the total thickness of a film thickness h2 of the central portion D of the second antiferromagnetic layer 31, and a film thickness h3 of the third antiferromagnetic layer 33 deposited thereon, is small, the second antiferromagnetic layer 31 will develop antiferromagnetic properties due to the antiferromagnetic interaction between itself and the third antiferromagnetic layer 33. This leads to an undesirable result wherein an exchange coupling magnetic field is produced between the central portion D of the second antiferromagnetic layer 31 and the central portion D of the free magnetic layer 28.

Preferably, the total film thickness is in the range of between about 20 angstroms to about 50 angstroms, more preferably between about 30 angstroms to about 40 angstroms. However, the thickness of the second antiferromagnetic layer 31 is at least about 20 angstroms, more preferably about 30 angstroms.

If the second antiferromagnetic layer 31 does not have a thickness of about 20 angstroms or more, then both end portions C of the second antiferromagnetic layer 31 will exhibit inadequate antiferromagnetic properties even after the third antiferromagnetic layer 33 is formed thereon. As a result, a sufficiently large exchange coupling magnetic field will not be produced between both end portions C of the second antiferromagnetic layer 31 and both end portions C of the free magnetic layer 28, making it impossible to firmly fix the magnetization of both end portions C of the free magnetic layer 28 along the track width direction.

If the total thickness h2 of the central portion D of the second antiferromagnetic layer 31 and the thickness h3 of the third antiferromagnetic layer 33 formed thereon is small, it becomes difficult for the central portion D of the second antiferromagnetic layer 31 to develop order transformation by annealing in a magnetic field. In turn, it is difficult for an antiferromagnetic interaction to take place between the second antiferromagnetic layer 31 and the third antiferromagnetic layer 33, and thus difficult for the second antiferromagnetic layer 31 to develop antiferromagnetic properties. Hence, no or very little exchange coupling magnetic field will be generated between the central portion D of the second antiferromagnetic layer 31 and the central portion D of the free magnetic layer 28. Thus, the magnetization of the central portion D of the free magnetic layer 28 will not be firmly fixed as in the case of the magnetization of both end portions C thereof.

The magnetic detection device according to the embodiment shown in FIG. 5 is constructed such that the central portion D of the free magnetic layer 28 is formed into a single domain sufficiently loose to permit inverted magnetization in response to an external magnetic field. This allows excellent reproduction sensitivity even with tracks narrower than those used in conventional magnetic detection device.

FIG. 6 is a partial sectional view of the structure of a magnetic detection device according to a sixth embodiment of the present invention, as observed from its surface opposing a recording medium.

The magnetic detection device shown in FIG. 6 is structurally different from that shown in FIG. 4 in that the nonmagnetic layer 32 exposed in the gap between the third antiferromagnetic layers 33 is removed and a part of the surface of the second antiferromagnetic layer 31 under the nonmagnetic layer 32 is also removed.

In the embodiment shown in FIG. 6, the third antiferromagnetic layers 33 are formed on both end portions C of the second antiferromagnetic layer 31 on top of the nonmagnetic layer 32, which is formed from an element such as Ru and has a thickness in the range of about 0.2 angstroms to about 3 angstroms. Both end portions C of the second antiferromagnetic layer 31 and the third antiferromagnetic layers are preferably thick, ranging from about 80 angstroms to about 300 angstroms.

Thus, antiferromagnetic interaction takes place between both end portions C of the second antiferromagnetic layer 31 and the third antiferromagnetic layers 33 through the nonmagnetic layer 32, causing both end portions C of the second antiferromagnetic layer 31 and the third antiferromagnetic layers 33 to act like a one-piece antiferromagnetic layer. Hence, both end portions C of the second antiferromagnetic layer 31 exhibit antiferromagnetic properties and develop order transformation by annealing in a magnetic field. An exchange coupling magnetic field is generated between both end portions C of the second antiferromagnetic layer 31 and both end portions C of the free magnetic layer 28. As a result, the magnetization of both end portions C of the free magnetic layer 28 is firmly fixed along the track width direction (direction X in the drawing).

Although the second antiferromagnetic layer 31 is formed also on the central portion D of the free magnetic layer 28, the second antiferromagnetic layer 31 on the central portion D is thin, ranging from about 5 angstroms to about 50 angstroms, preferably ranging from about 10 angstroms to about 40 angstroms. A layer within this thickness range does not impart antiferromagnetic properties to the central portion D of the second antiferromagnetic layer 31, making it difficult for the central portion D of the second antiferromagnetic layer 31 to develop order transformation. Hence, no or very little exchange coupling magnetic field will be generated between the central portion D of the second antiferromagnetic layer 31 and the central portion D of the free magnetic layer 28. Thus, the magnetization of the central portion D of the free magnetic layer 28 is formed into a single domain that is sufficiently loose to permit inverted magnetization in response to an external magnetic field: This makes it possible to manufacture magnetic detection devices ensuring excellent reproduction sensitivity even with tracks narrower than those in conventional magnetic detection devices.

The central portion D of the second antiferromagnetic layer 31 may be completely removed, as indicated by dotted lines F in FIG. 6, to expose the surface of the central portion D of the free magnetic layer 28. However, a part of the second antiferromagnetic layer 31 should be left on the central portion D of the free magnetic layer 28 because the surface of the central portion D of the exposed free magnetic layer 28 is apt to be damaged by ion milling or RIE.

In the embodiment shown in FIG. 6, the central portion D of the second antiferromagnetic layer 31 has been etched away by ion milling, so that the central portion D of the second antiferromagnetic layer 31 is apt to incur deterioration of the magnetic characteristics due to damage from ion milling. However, the central portion D of the second antiferromagnetic layer 31 is formed to be sufficiently thin so as not to develop antiferromagnetic properties. This substantially prevents magnetic action from influencing the free magnetic layer 28 and other layers. Hence, even if the central portion D of the second antiferromagnetic layer 31 is damaged by ion milling, the damage will not substantially affect reproduction performance.

The magnetic detection devices shown in FIG. 1 through FIG. 6 are of the current in the plane (CIP) type. In CIP type devices, electrode layers 34 that sit above the third antiferromagnetic layers 33 are provided on both end portions of the multiple layers up to the second antiferromagnetic layer 31 deposited on the substrate 20. Current passes through the multiple layers in the direction parallel to the surfaces of the layers making up the multilayer laminate.

Figure 7:
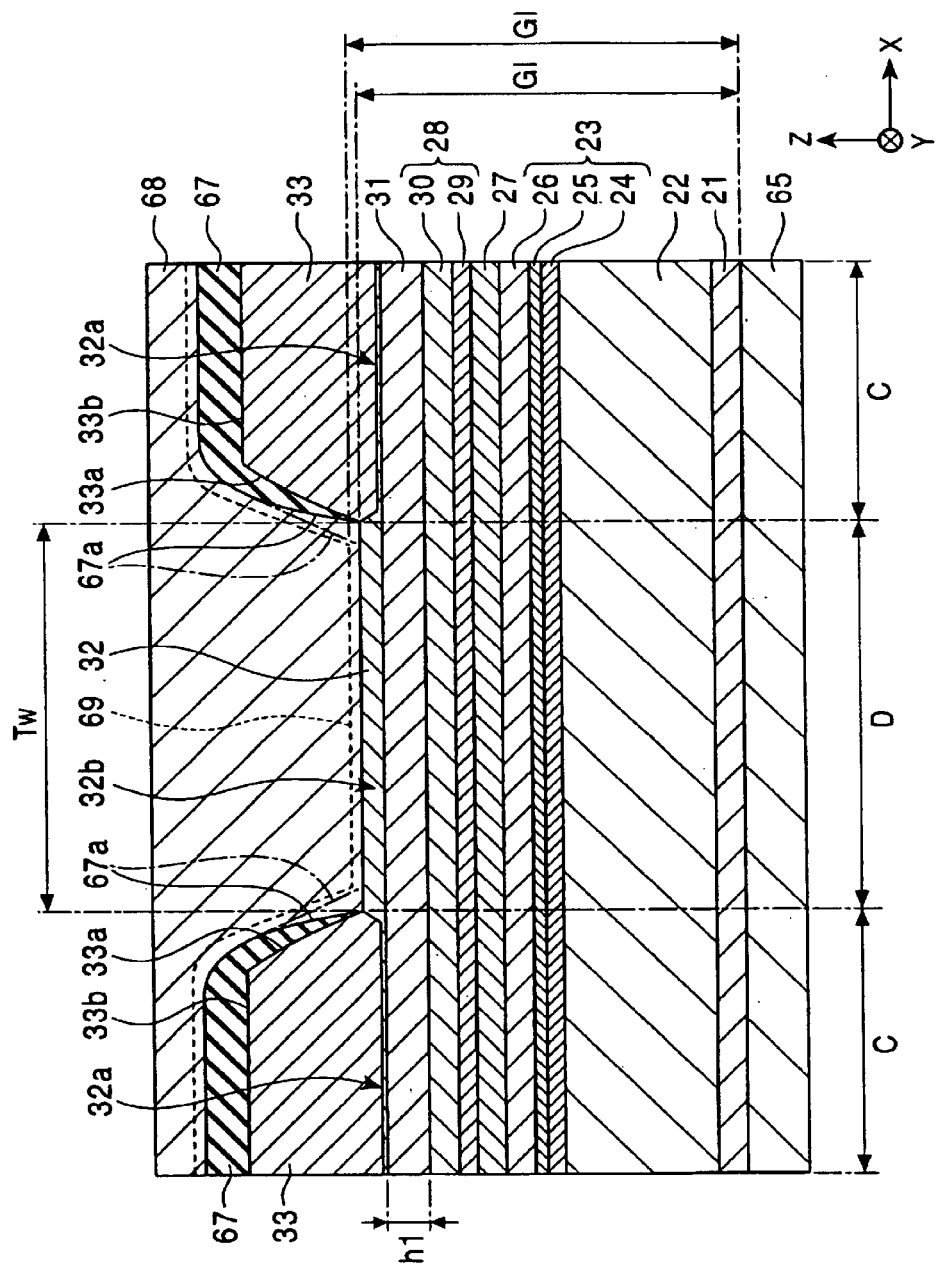
FIG. 7 is a partial sectional view of the structure of a magnetic detection device according to a seventh embodiment of the present invention observed from a surface opposing a recording medium.

The magnetic detection device shown in FIG. 7 has a structure known as the current perpendicular to the plane (CPP) type. In a CPP type structure, an upper electrode layer 68 and a lower electrode layer 65 are provided at the top and bottom of the multilayer including the layers from a seed layer 21 up to a second antiferromagnetic layer 31. Current passes from the electrode layer 65 or 68 into the multilayer film in the direction perpendicular to the surfaces of these layers. The present invention is also applicable to a CPP type magnetic detection device as described above.

The laminate structure of the multilayer is the same as that shown in FIG. 1; hence, the descriptions thereof will not be repeated. The seed layer 21 shown in FIG. 7 may be omitted.

In FIG. 7, a lower shielding layer 65 that functions also as the lower electrode is provided under the seed layer 21. The lower shielding layer 65 is formed by plating using a magnetic material, such as Permalloy (NiFe).

As shown in FIG. 7, the third antiferromagnetic layers 33 flank the nonmagnetic layer 32 on both end portions C along the track width direction (direction X in the drawing) of the multilayer. Insulating layers 67 are formed on upper surfaces 33b and inner end portions 33a of the third antiferromagnetic layers 33.

An upper shielding layer 68 that also function as the upper electrode is provided, covering the insulating layer 67 and a central portion 32b of the nonmagnetic layer 32.

Thus, the magnetic detection device shown in FIG. 7 has shielding layers 65 and 68 that also serve as electrodes provided at the top and bottom of the multilayer. Current passes through the shielding layers 65 and 68 such that it flows in a direction perpendicular to the surfaces of the individual layers of the multilayer laminate.

As shown in FIG. 7, the upper surfaces 33b and the inner end portions 33a of the third antiferromagnetic layer 33 are covered by the insulating layer 67. This arrangement allows a current passing through the upper shielding layer 68 into the multilayer to be properly led into the multilayer without being shunted to the third antiferromagnetic layers 33. Hence, the structure of the magnetic detection device shown in FIG. 7 makes it possible to manufacture CPP type magnetic detection devices with high reproduction outputs that are capable of preventing the current from spreading beyond the track width Tw.

Preferably, the inner end portions 67a of the insulating layer 67 are formed to extend to both end portions of the central portion 32b of the nonmagnetic layer 32, as indicated by the chain lines in FIG. 7. With this arrangement, current shunt into the third antiferromagnetic layers 33 can be further controlled.

If necessary, a nonmagnetic layer 69 indicated by the dotted line may be formed to cover the insulating layer 67 and the central portion 32b of the nonmagnetic layer 32. The nonmagnetic layer 69 is preferably formed from a nonmagnetic electrically conductive material, such as Ta, Ru, Rh, Ir, Cr, Re, and Cu. The nonmagnetic layer 69 functions as an upper gap layer. The nonmagnetic layer 69 is also formed on the central portion D of the multilayer, while the central portion D provides the inlet and output of the current path of the multilayer. Therefore, it is not desirable to cover the central portion D with the nonmagnetic layer 69 made of, for example, an insulating material, because it would make it difficult for current to pass into the magnetic detection device. For this reason, the nonmagnetic layer 69 in the present invention is preferably formed of a nonmagnetic electrically conductive material.

A nonmagnetic material layer 27 of the magnetic detection device shown in FIG. 7 may be formed of a nonmagnetic electrically conductive material, such as Cu, or an insulating material, such as $Al_2O_3$ or $SiO_2$. The magnetic detection device having the nonmagnetic material layer 27 formed of a nonmagnetic electrically conductive material is called a "spin valve GMR magnetoresistive device (CPP-GMR)", while one having a nonmagnetic material layer formed from an insulating material is called a "spin valve tunnel magnetoresistive device (CPP-TMR)."

A tunnel magnetoresistive device is adapted to cause resistance changes by making use of spin tunnel effect. If the magnetization of a pinned magnetic layer 23 and that of a free magnetic layer 28 are antiparallel, it is very difficult for tunnel current to pass via the nonmagnetic material layer 27; this situation corresponds to maximum resistance. In a situation corresponding to minimum resistance, the magnetization of the pinned magnetic layer 23 and that of the free magnetic layer 28 is parallel, and the tunnel current can easily pass.

By utilizing the aforesaid principle, the electrical resistance that varies according to the changes in the magnetization of the free magnetic layer 28 caused by an external magnetic field can be monitored or measured in terms of voltage changes during a constant-current operation or current changes during a constant-voltage operation. Thus, leakage field from a recording medium is detected.

Figure 8:
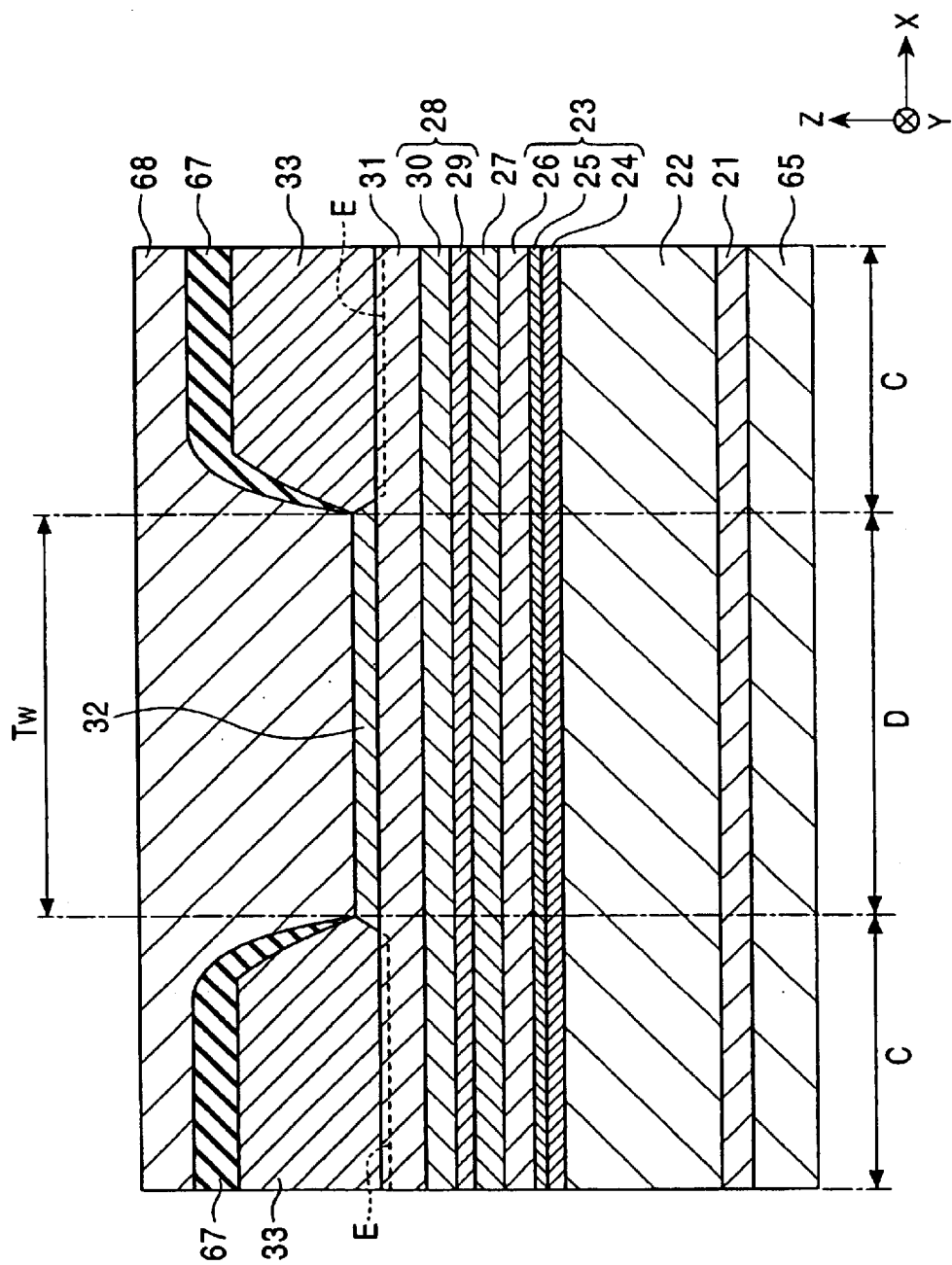
FIG. 8 is a partial sectional view of the structure of a magnetic detection device according to an eighth embodiment of the present invention observed from a surface opposing a recording medium.
Figure 9:
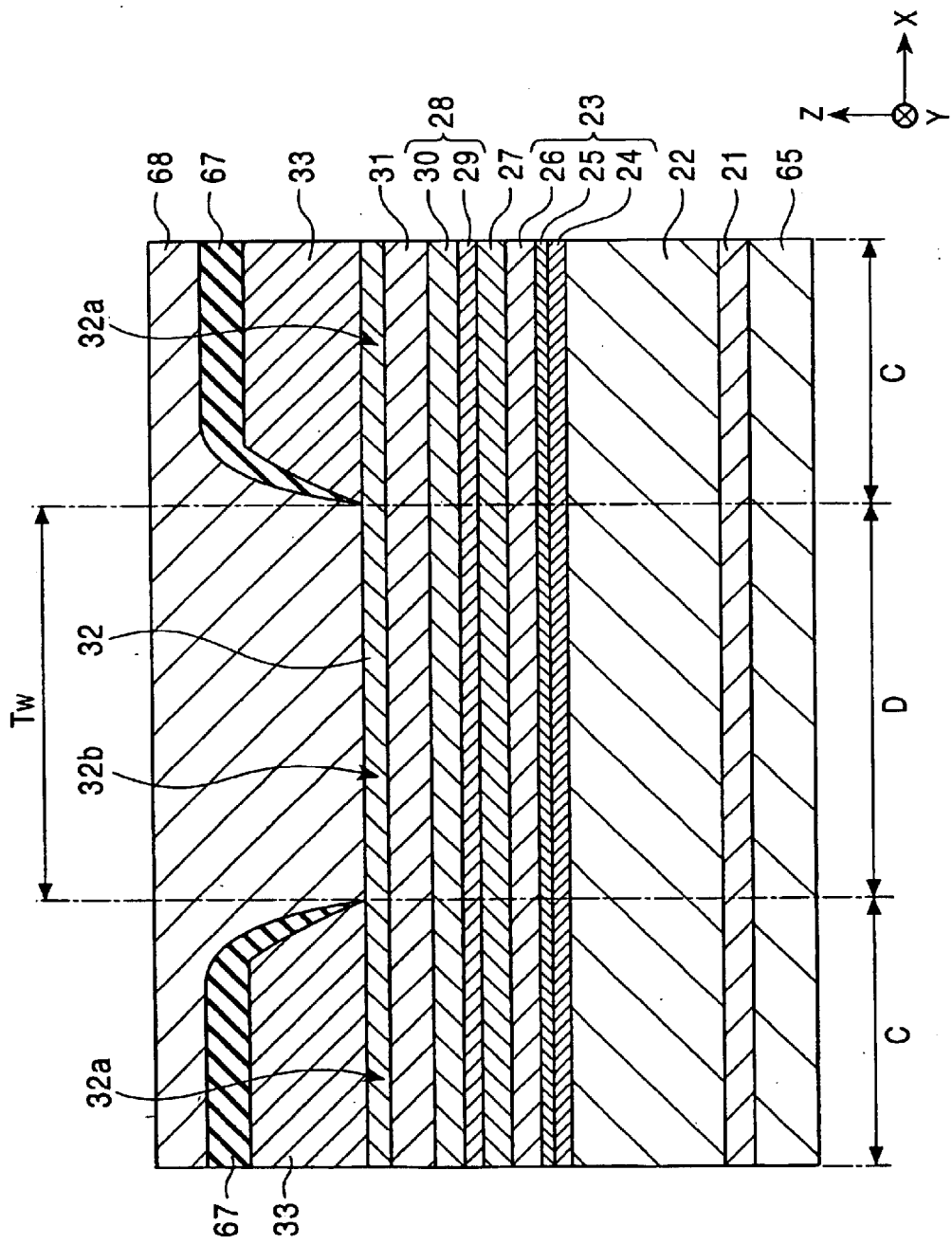
FIG. 9 is a partial sectional view of the structure of a magnetic detection device according to a ninth embodiment of the present invention observed from a surface opposing a recording medium.
Figure 10:
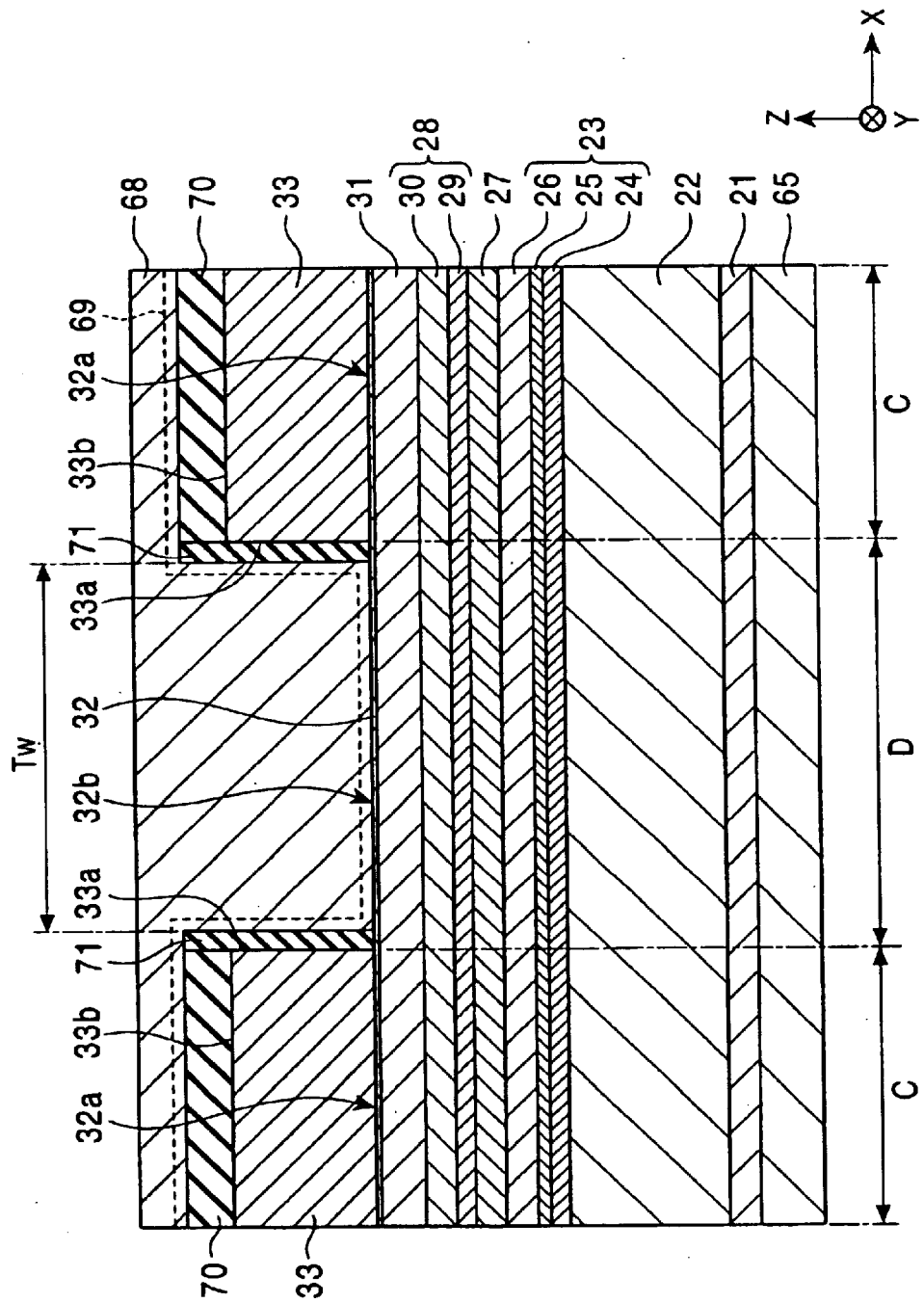
FIG. 10 is a partial sectional view of the structure of a magnetic detection device according to a tenth embodiment of the present invention observed from a surface opposing a recording medium.

FIG. 8 shows an embodiment obtained by turning the magnetic detection device shown in FIG. 2 into a CPP type magnetic detection device shown in FIG. 7. FIG. 9 is an embodiment obtained by turning the magnetic detection device shown in FIG. 3 into a CPP type magnetic detection device such as the one shown in FIG. 7. FIG. 10 shows an embodiment obtained by turning the magnetic detection device shown in FIG. 4 into a CPP type magnetic detection device such as the one shown in FIG. 7.

The magnetic detection device shown in FIG. 10 differs from the one shown in FIG. 7 in that first insulating layers 70 are formed on upper surfaces 33b of third antiferromagnetic layers 33, and second insulating layers 71, which are separate from the first insulating layers 70, are deposited on inner end portions 33a of the third antiferromagnetic layers 33. This difference is based on a difference in manufacturing method, which will be discussed below.

The first insulating layers 70 and the second insulating layers 71 share the same function as that of the insulating layers 67 shown in FIG. 7, the function being to effectively prevent the current, which flows into the multilayer through the upper shielding layer 68, from shunting into the third antiferromagnetic layers 33.

The first insulating layers 70 and the second insulating layers 71 are formed of insulating materials, such as $Al_2O_3$, $SiO_2$, AlN, Al—Si—O—N, Al—Si—O, $Ti_2O_3$, or $Ti_3O_5$.

In the embodiment shown in FIG. 10, the inner end portions 33a of the third antiferromagnetic layers 33 are perpendicular to the track width direction (direction X in the drawing). Alternatively, however, the inner end portions 33a may be formed to have sloped or curved surfaces such that the interval between the third antiferromagnetic layers 33 gradually increases along the track width direction as the distance from the free magnetic layer 28 increases.

The inner end portions 33a are preferably formed with the sloped or curved surfaces because this allows the second insulating layers 71 with an appropriate thickness to be deposited onto the inner end portions 33a. This arrangement permits successful reduction in shunt loss.

In the case of the magnetic detection device shown in FIG. 10, the upper surfaces 33b and the inner end portions 33a of the third antiferromagnetic layers 33 are covered by the insulating layers 70 and 71. This arrangement allows the current passing into the multilayer through the upper shielding layer 68 to properly flow within the track width Tw defined by the interval in the track width direction between the second insulating layers 71 without shunting into the third antiferromagnetic layers 33. Thus, the structure of the magnetic detection device shown in FIG. 10 makes it possible to manufacture CPP type magnetic detection devices with high reproduction outputs capable of preventing current from spreading beyond the track width Tw.

Alternatively, as shown in FIG. 10, a nonmagnetic layer 69 indicated by the dotted line may be formed to cover the first insulating layers 70, the second insulating layers 71, and the central portion D of the multilayer. The nonmagnetic layer 69 is preferably formed from a nonmagnetic electrically conductive material, such as Ta, Ru, Rh, Ir, Cr, Re, and Cu. The nonmagnetic layer 69 functions as an upper gap layer. The nonmagnetic layer 69 is also formed on the central portion D of the multilayer, while the central portion D provides the inlet and output of the current path. Therefore, it is not desirable to cover the central portion D of the multilayer with the nonmagnetic layer 69 made of, for example, an insulating material, because it would make it difficult for current to pass into the magnetic detection device. For this reason, the nonmagnetic layer 69 in the present invention is preferably formed of a nonmagnetic electrically conductive material.

A nonmagnetic material layer 27 of the magnetic detection device shown in FIG. 10 may be formed of a nonmagnetic electrically conductive material, such as Cu, or an insulating material, such as $Al_2O_3$ or $SiO_2$ The magnetic detection device having a nonmagnetic material layer 27 formed of a nonmagnetic electrically conductive material is called a "spin valve GMR magnetoresistive device (CPP-GMR)", while the one having a nonmagnetic material layer formed of an insulating material is called a "spin valve tunnel magnetoresistive device (CPP-TMR)."

Figure 11:
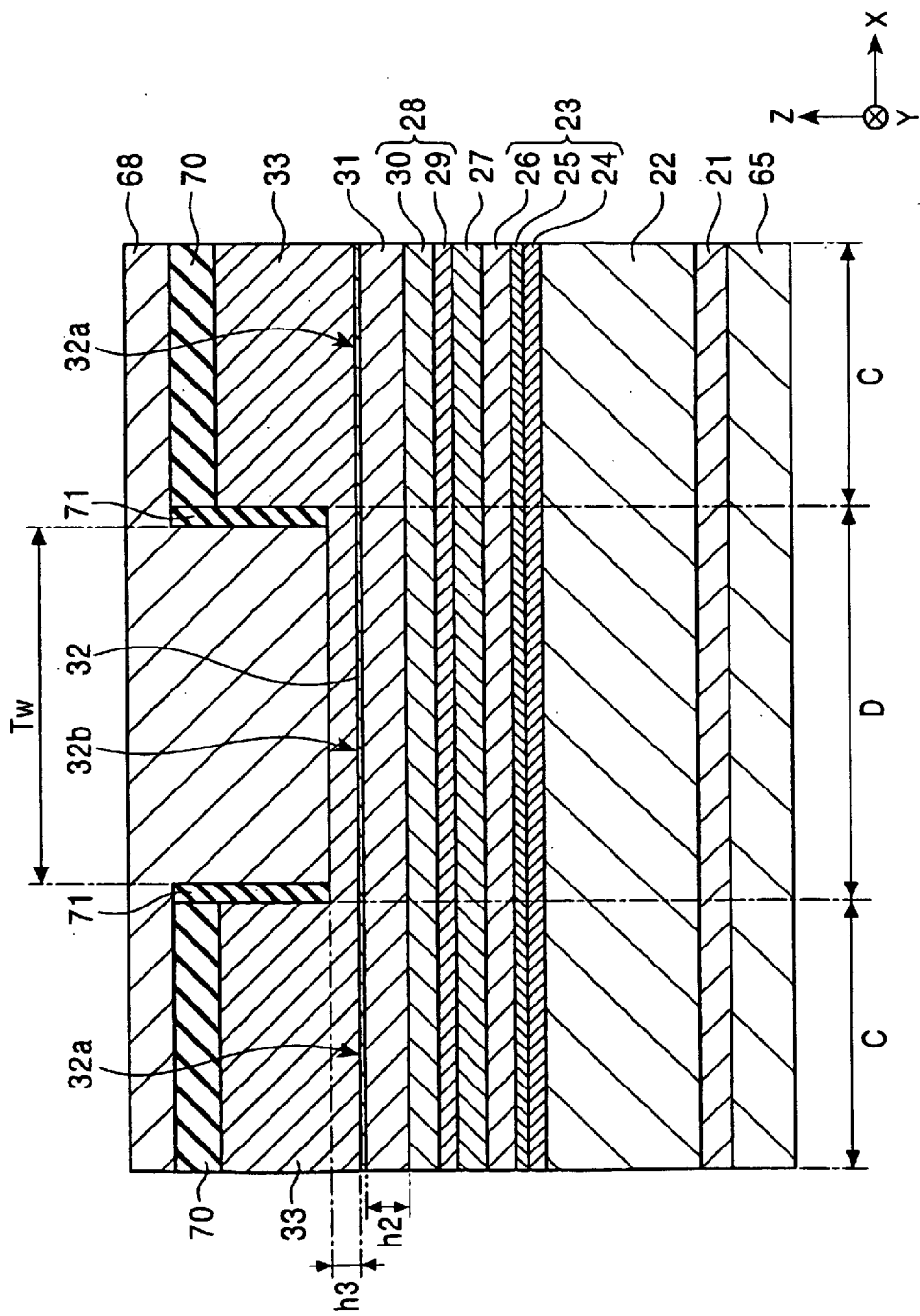
FIG. 11 is a partial sectional view of the structure of a magnetic detection device according to an eleventh embodiment of the present invention observed from a surface opposing a recording medium.
Figure 12:
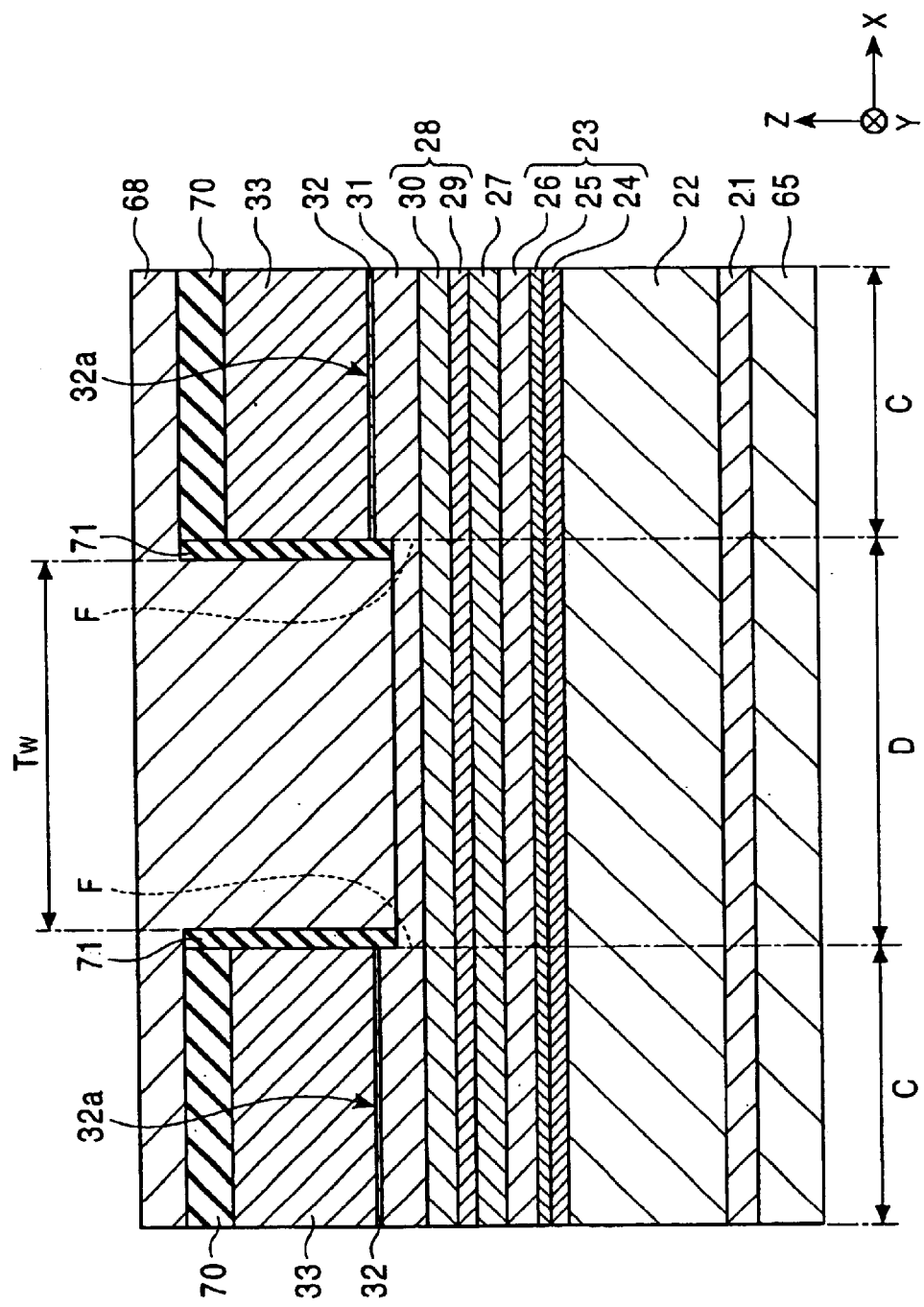
FIG. 12 is a partial sectional view of the structure of a magnetic detection device according to a twelfth embodiment of the present invention observed from a surface opposing a recording medium.

FIG. 11 shows an embodiment of a magnetic detection device obtained by turning the magnetic detection device shown in FIG. 5 into a CPP type magnetic detection device such as the one shown in FIG. 10. FIG. 12 shows an embodiment of a magnetic detection device obtained by turning the magnetic detection device shown in FIG. 6 into a CPP type magnetic detection device such as the one shown in FIG. 10.

Figure 13:
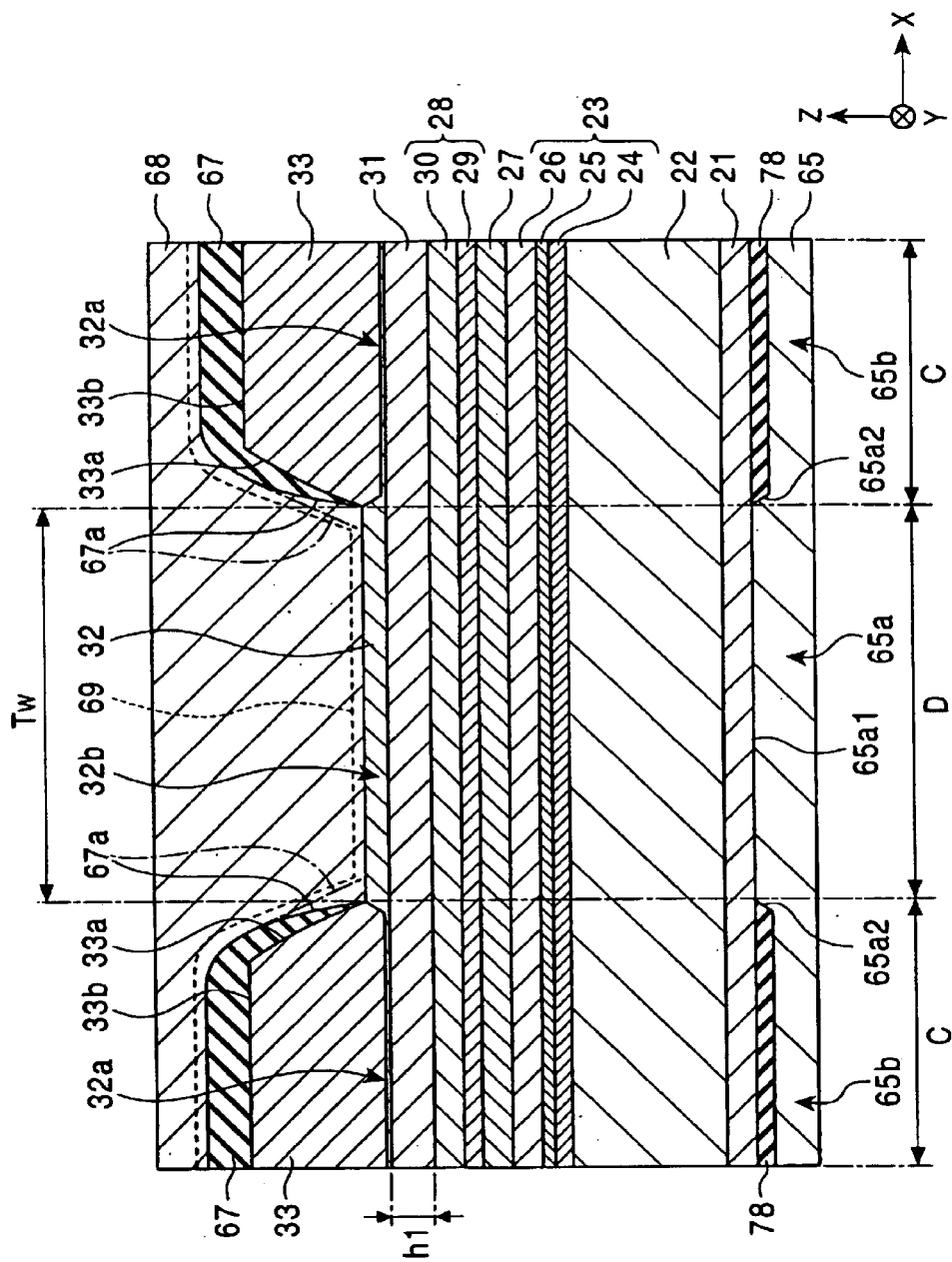
FIG. 13 is a partial sectional view of the structure of a magnetic detection device according to a thirteenth embodiment of the present invention observed from a surface opposing a recording medium.
Figure 14:
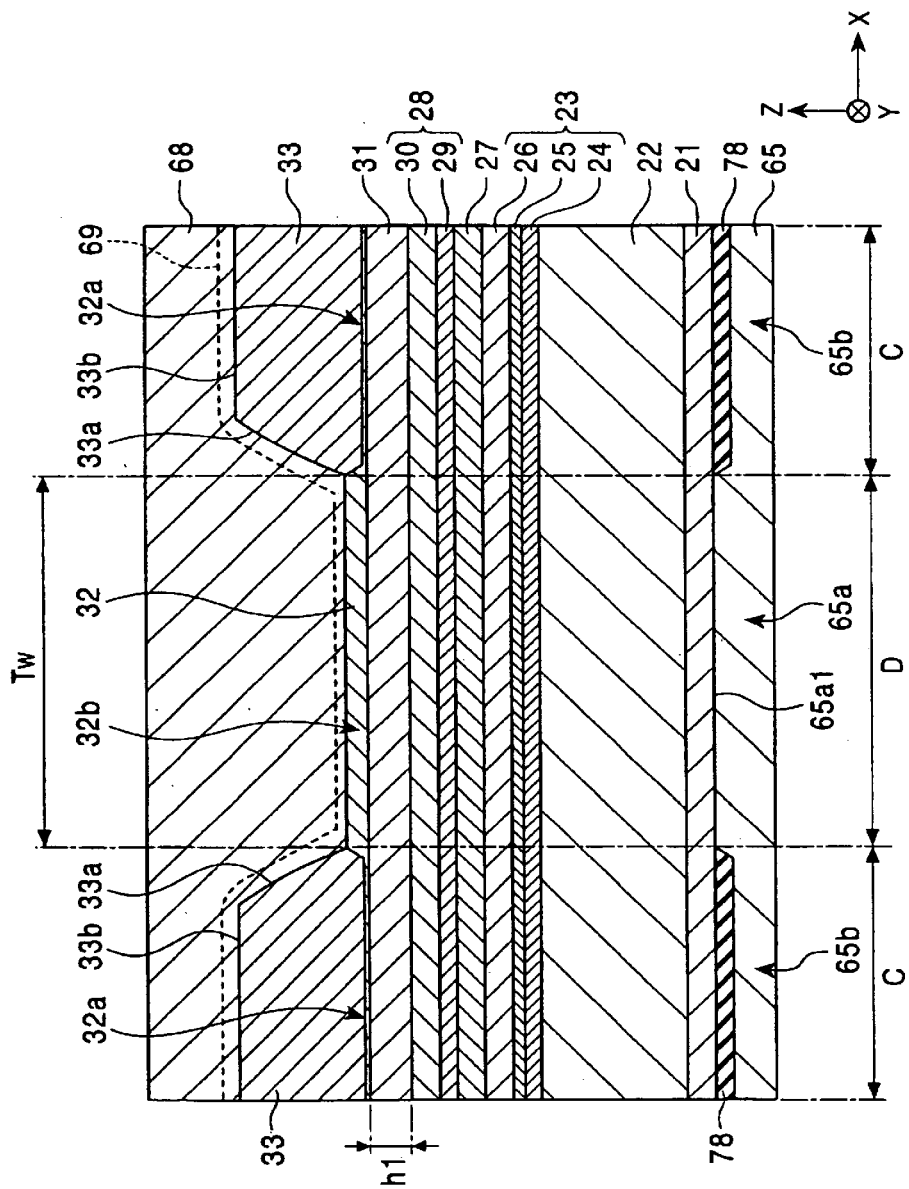
FIG. 14 is a partial sectional view of the structure of a magnetic detection device according to a fourteenth embodiment of the present invention observed from a surface opposing a recording medium.

The magnetic detection devices shown in FIG. 13 and FIG. 14 are the same CPP type as those shown in FIG. 7 through FIG. 12; however, they differ from those shown in FIG. 7 through FIG. 12 in that the shapes of the lower shielding layers 65 are different from those shown in FIG. 7 through FIG. 12.

The embodiment shown in FIG. 13 is the same CPP type magnetic detection device having the same film construction as that shown in FIG. 7 except that a projecting portion 65a that juts out toward the multilayer (direction Z in the drawing) is provided on the central portion D in the track width direction (direction X in the drawing) of the lower shielding layer 65 serving also as the lower electrode. An upper surface 65a1 of the projecting portion 65a is in contact with the lower surface of the seed layer 21 so that current passes through the projecting portion 65a into the multilayer or through the multilayer into the projecting portion 65a.

In the embodiment shown in FIG. 13, insulating layers 78 are provided between both end portions 65b in the track width direction (direction X in the drawing) of the lower shielding layer 65 and the seed layer 21. The insulating layers 78 are formed of an insulating material, such as $Al_2O_3$, $SiO_2$, AlN, Al—Si—O—N, Al—Si—O, $Ti_2O_3$, or $Ti_3O_5$.

In the embodiment shown in FIG. 13, the current path in the lower shielding layer 65 is narrowed by the presence of the projecting portion 65a. Further, the insulating layers 78 provided between both end portions 65b of the lower shielding layer 65 and the multilayer prevents current from shunting from both end portions 65b into the multilayer. With this arrangement, it is possible to further efficiently manufacture magnetic detection devices with high reproduction outputs and narrower effective track widths.

Furthermore, in the embodiment shown in FIG. 13, the dimension of the upper surface 65a1 in the track width direction (direction X in the drawing) of the projecting portion 65a of the lower shielding layer 65 coincides with the dimension of the central portion D in the track width direction (direction X in the drawing). The width dimension of the upper surface 65a1 may alternatively be larger than the width direction of the central portion D. Preferably, the width dimension of the upper surface 65a1 coincides with the track width Tw. This allows current to pass only in the region defined by the track width Tw of the magnetic detection device, making it possible to fabricate magnetic detection devices providing high reproduction outputs.

In the embodiment shown in FIG. 13, both side surfaces 65a2 in the track width direction (direction X in the drawing) of the projecting portion 65a deposited on the lower shielding layer 65 are formed to have sloped or curved surfaces so the width dimension in the track width direction of the projecting portion 65a gradually increases as the distance from the multilayer to the sloped or curved surfaces increases (in the opposite direction from direction Z in the drawing). Both side surfaces 65a2, however, may have surfaces perpendicular to the track width direction (direction X in the drawing).

The embodiment shown in FIG. 14 has a lower shielding layer 65 of the same shape as that in the embodiment shown in FIG. 13. Specifically, a projecting portion 65a that projects toward the multilayer (direction Z in the drawing) is provided on a central portion D along the track width direction (direction X in the drawing) of the lower shielding layer 65 shown in FIG. 14. An upper surface 65a1 of the projecting portion 65a is in contact with the lower surface of the seed layer 21 so that current passes through the projecting portion 65a into the multilayer or through the multilayer into the projecting portion 65a. Insulating layers 78 are provided between both end portions 65b in the track width direction (direction X in the drawing) of the lower shielding layer 65 and the seed layer 21.

Unlike the embodiment shown in FIG. 13, the one shown in FIG. 14 does not have the insulating layers 67 on the upper surfaces 33b and both end portions 33a of the third antiferromagnetic layers 33. In addition, the upper shielding layer 68 serving also as the upper electrode is directly joined onto the third antiferromagnetic layer 33 and the central portion D of the multilayer.

Compared with the embodiment shown in FIG. 13, the one shown in FIG. 14 does not provide isolation between the upper shielding layer 68 and the third antiferromagnetic layers 33, so the current tends to spread beyond the track width Tw resulting in lower reproduction outputs. On the other hand, the lower shielding layer 65 is provided with the projecting portion 65a at the bottom side of the magnetic detection device to narrow the current path, thus making it possible to restrain the current path from spreading and to restrain a drop in reproducing output.

In the magnetic detection devices shown in FIG. 13 and FIG. 14, the upper surface 65a1 of the projecting portion 65a formed on the lower shielding layer 65 is preferably flush with the upper surface of the insulating layers 78 formed at both ends thereof. This arrangement makes it possible to form the surfaces of the layers making up the multilayer laminate that are formed on the projecting portion 65a up to the insulating layer 78 on the insulating layers 78 more parallel in the track width direction. As a result, magnetic detection devices exhibiting excellent reproduction characteristics can be manufactured.

The embodiments shown in FIGS. 13 and 14 are also applicable to the CPP type magnetic detection devices shown in FIG. 8 through FIG. 12.

In the CPP type magnetic detection devices shown in FIG. 7 through FIG. 14, the lower shielding layer 65 and the upper shielding layer 68 are formed in contact with the top and bottom of the multilayer to make the shielding layers 65 and 68 also serve as electrode layers. This arrangement obviates the need for forming the electrode layers and the shielding layers separately, simplifying the manufacturing process of CPP type magnetic detection devices.

Moreover, using the layers combining the electrode function and the shielding function makes it possible to set a gap length G1, which is defined by the interval between the shielding layers, to an extremely small value (refer to FIG. 7). If the nonmagnetic layer 69 is provided, then the thickness of the nonmagnetic layer 69 is also added in determining the gap length G1. With this arrangement, magnetic detection devices capable of successfully accommodating higher recording densities in the future can be manufactured.

The present invention, however, is not limited to the embodiments shown in FIG. 7 through FIG. 14. The invention may be also applied to a construction in which an electrode layer or layers formed from, for example, Au, W, Cr, or Ta, are provided on the upper surface and/or the lower surface of the multilayer. A shielding layer made of a magnetic material is provided, through a gap layer, on the surface of the electrode layer on the opposite side from that in the aforesaid magnetic detection device.

The construction of an embodiment of the free magnetic layer 28 in accordance with the present invention will now be described.

In all the magnetic detection devices shown in FIG. 1 through FIG. 14, the free magnetic layer 28 has a two-layer structure. The layer in contact with the nonmagnetic material layer 27 is the diffusion restraining layer 29 made of a material such as CoFe or Co. The magnetic material layer 30 is made of a magnetic material such as a NiFe alloy.

The free magnetic layer 28 may alternatively be formed from a single layer made of a magnetic material such as a NiFe alloy, CoFe alloy, CoFeNi alloy, Co, or a CoNi alloy. Preferably, the free magnetic layer 28 is formed from a CoFeNi alloy.

FIG. 15 is a partial enlarged sectional view centering around the free magnetic layer 28, as observed from a surface opposing a recording medium.

The free magnetic layer 28 according to the embodiment shown in FIG. 15 has three layers. Layers 36, 37, and 38, which constitute the free magnetic layer 28, are all made of a magnetic material. The magnetic material layer 36 made of CoFe or Co functions as a diffusion restraining layer for preventing the diffusion of elements into the nonmagnetic material layer 27.

The magnetic material layer 38 is formed in contact with a second antiferromagnetic layer 31. Preferably, the magnetic material layer 38 is formed from a CoFe alloy to produce a large exchange coupling magnetic field between the magnetic material layer 38 and the second antiferromagnetic layer 31.

The combination of the materials of the three layers shown in FIG. 15 may be, for example, as follows: magnetic material layer 36 (CoFe)/magnetic material layer 37 (NiFe)/magnetic material layer 38 (CoFe).

The thickness of the free magnetic layer 28 formed only from magnetic materials preferably ranges from about 30 angstroms to about 40 angstroms. An example of the composition ratio of the CoFe alloy used for the free magnetic layer 28 is as follows: 90 at % Co and 10 at % Fe.

FIG. 16 is a partial enlarged sectional view showing another embodiment of the free magnetic layer 28. The free magnetic layer 28 shown in FIG. 16 has a structure called "a multilayer ferri-structure." This structure makes it possible to reduce the thickness of the magnetic effective free magnetic layer without the need for setting the physical thickness of the free magnetic layer 28 to an extremely small value. With this arrangement, sensitivity to external magnetic fields can be improved.

Reference numerals 39 and 41 denote magnetic layers, while reference numeral 40 denotes a nonmagnetic intermediate layer. The magnetic layers 39 and 41 are formed from a magnetic material, such as a NiFe alloy, CoFe alloy, CoFeNi alloy, Co, or a CoNi alloy. The magnetic layer 39 and/or the magnetic layer 41 is formed from CoFeNi alloy. Preferably, the composition ratio is such that Fe ranges from about of 9 at % to about 17 at %, Ni ranges from about 0.5 at % to about 10 at %, and the remaining at % goes to Co.

With this arrangement, the coupling magnetic field produced by the RKKY interaction between the magnetic layers 39 and 41 can be increased. Specifically, a spin-flop magnetic field (Hsf) can be increased to about 293 (kA/m) or more. Thus, the magnetizations of the magnetic layer 39 and the magnetic layer 41 can be set to be antiparallel. In addition, setting the composition ratios within the above ranges allows the magnetostriction of the free magnetic layer 28 to stay within a range of between about $-3\times10^{-6}$ to about $3\times10^{-6}$, and the coercive force to be controlled to about 790 (A/m) or less.

Further, the soft magnetic characteristics of the free magnetic layer 28 can be improved, and a reduction in a resistance change amount ($\Delta R$) or resistance change rate ($\Delta R/R$) caused by the diffusion of Ni between the free magnetic layer 28 and the nonmagnetic material layer 27 can be effectively prevented.

Preferably, the nonmagnetic intermediate layer 40 is formed from one or more elements selected from Ru, Rh, Ir, Cr, Re, and Cu.

The thickness of the magnetic layer 39 is set, for example, to about 35 angstroms, the thickness of the nonmagnetic intermediate layer 40 is set, for example, to about 9 angstroms, and the thickness of the magnetic layer 41 is set, for example, to about 15 angstroms.

Figure 19:
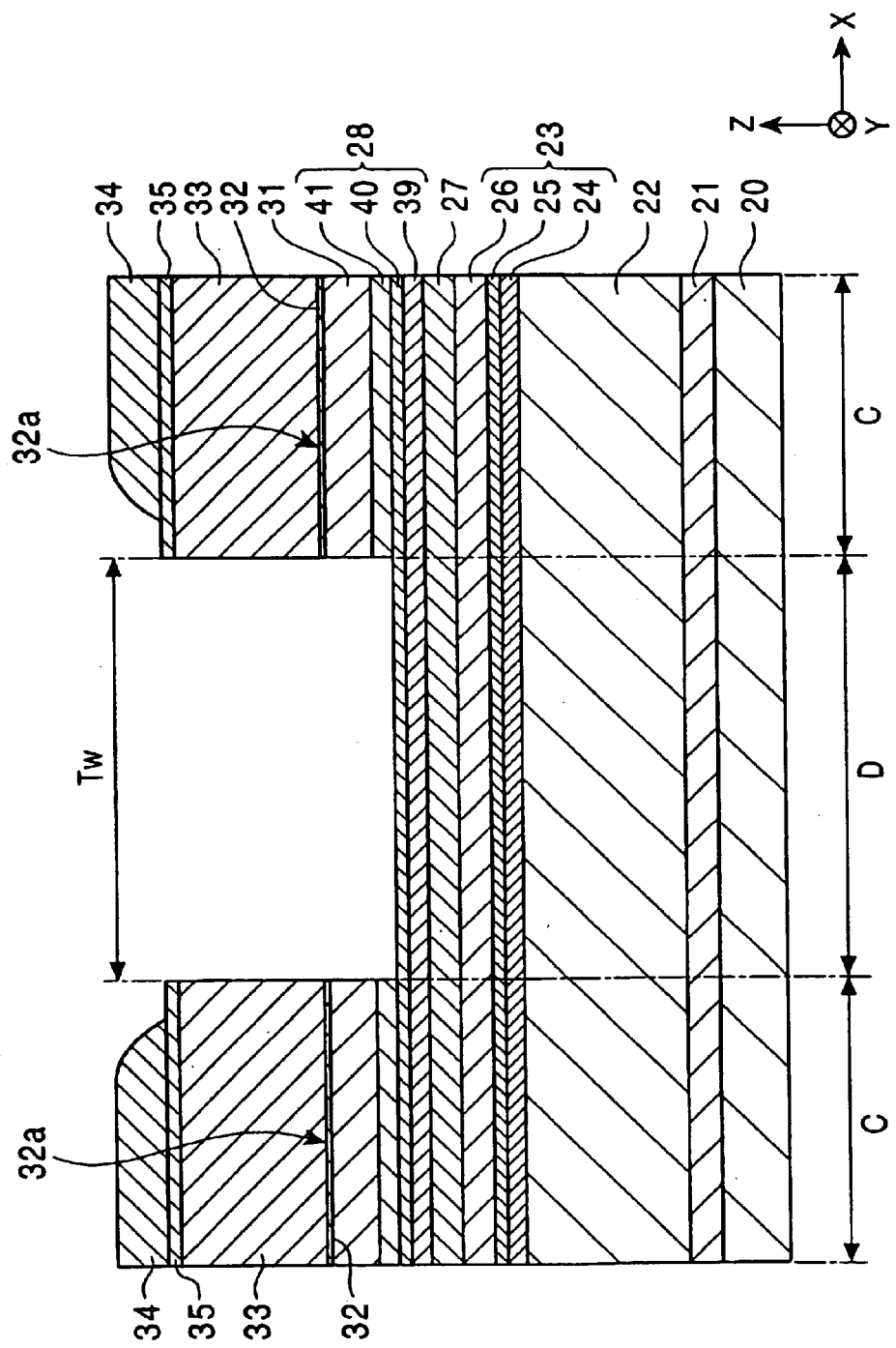
FIG. 19 is a partial sectional view of the structure of a magnetic detection device according to a fifteenth embodiment of the present invention observed from a surface opposing a recording medium.

When the above free magnetic layer 28 is formed using the multilayer ferri-structure, the layers may be completely removed down to the magnetic layer 41 at a central portion D to expose the nonmagnetic intermediate layer 40 in the gap between third antiferromagnetic layers 33, as shown in FIG. 19. With this arrangement, the central portion D of the free magnetic layer 28 functions as a free magnetic layer made only of a regular magnetic layer rather than as a multilayer ferri-structure layer. Both end portions C of the free magnetic layer 28 retain the multilayer ferri-structure. Hence, a unidirectional bias magnetic field is reinforced, enabling the magnetization of both end portions C of the free magnetic layer to be fixed more securely along the track width direction to restrain the occurrence of side-reading.

A diffusion restraining layer made of a CoFe alloy or Co may be provided between the magnetic layer 39 and the nonmagnetic material layer 27. Further, a magnetic layer formed from a CoFe alloy may be provided between the magnetic layer 41 and the second antiferromagnetic layer 31. In such a case, if the magnetic layer 39 and/or the magnetic layer 41 is formed from a CoFeNi alloy, then the composition ratios of the individual elements of the CoFeNi alloy are preferably as follows: Fe ranges from about 7 at % to about 15 at %, Ni ranges from about 5 at % to about 15 at %, and the remainder to Co. With this arrangement, the exchange coupling magnetic field produced by the RKKY interaction between the magnetic layers 39 and 41 can be increased. Specifically, a spin-flop magnetic field (Hsf) can be increased to about 293 (kA/m). Thus, the magnetizations of the magnetic layers 39 and 41 can be effectively set to be antiparallel.

In addition, setting the composition ratios within the above ranges allows the magnetostriction of the free magnetic layer 28 to stay within a range of about $-3\times10^{-6}$ to about $3\times10^{-6}$, and the coercive force to be controlled to about 790 (A/m) or less. Moreover, the soft magnetic characteristics of the free magnetic layer 28 can be improved.

Figure 17:
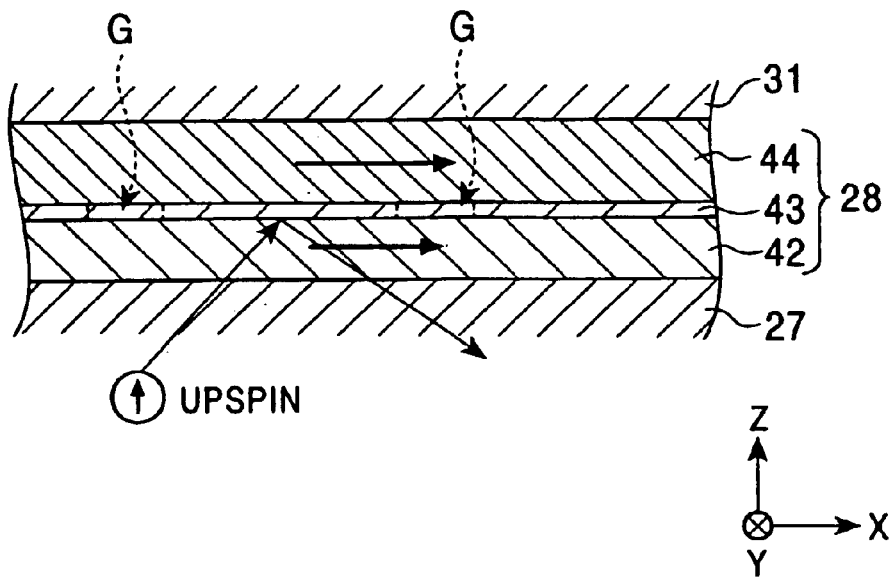
FIG. 17 is a partial enlarged sectional view showing still another embodiment of the free magnetic layer in accordance with the present invention observed from a surface opposing a recording medium.

FIG. 17 is a partial enlarged sectional view showing another embodiment of the free magnetic layer 28 in accordance with the present invention. The free magnetic layer 28 shown in FIG. 17 has a specular film 43 provided between the magnetic material layers 42 and 44. The specular film 43 may have a defect (pin hole) G, as shown in FIG. 17. In the embodiment illustrated in FIG. 17, the magnetic layer 42 and the magnetic layer 44 that sandwich the specular film (mirror surface reflection layer) 43 are magnetized in the same direction indicated by the arrows.

The magnetic layers 42 and 44 use a magnetic material, such as NiFe alloy, CoFe alloy, CoFeNi alloy, Co, or CoNi alloy.

When the specular film 43 is provided in the free magnetic layer 28, as shown in FIG. 17, a conduction electron, e.g., a conduction electron having upspin, reaching the specular film 43 is specularly reflected while retaining its spinning conditions, such as energy and quantum conditions. The conduction electron that has upspin and has been specularly reflected is able to change its direction of motion and pass through the free magnetic layer.

For this reason, according to the present invention, the provision of the specular film 43 makes it possible to extend the mean free path $\lambda+$ of the foregoing upspin conduction electron. This permits an increase in the difference between the mean free path $\lambda+$ of the foregoing upspin conduction electron and a mean free path $\lambda-$ of a downspin conduction electron, thus allowing an improved resistance change rate ($\Delta R/R$) and a higher reproduction output to be achieved.

To form the specular film 43, layers, for example, up to the magnetic layer 42, are formed. Then the surface of the magnetic layer 42 is oxidized to use the resulting oxidized layer as the specular film 43. Then, the magnetic layer 44 is deposited on the specular film 43.

Materials for the specular film 43 include an oxide of Fe—O, Ni—O, Co—O, Co—Fe—O, Co—Fe—Ni—O, Al—O, Al—Q—O (Q in this case includes one or more elements selected from amongB, Si, N, Ti, V, Cr, Mn, Fe, Co, and Ni) and R—O (R in this case includes one or more elements selected from among Cu, Ti, V, Cr, Zr, Nb, Mo, Hf, Ta, and W), a nitride of Al—N, Al—Q—N (Q in this case includes one or more elements selected from among B, Si, O, Ti, V, Cr, Mn, Fe, Co, and Ni) and R—N (R in this case includes one or more elements selected from among Ti, V, Cr, Zr, Nb, Mo, Hf, Ta, and W), and a metalloid whistler alloy.

Figure 18:
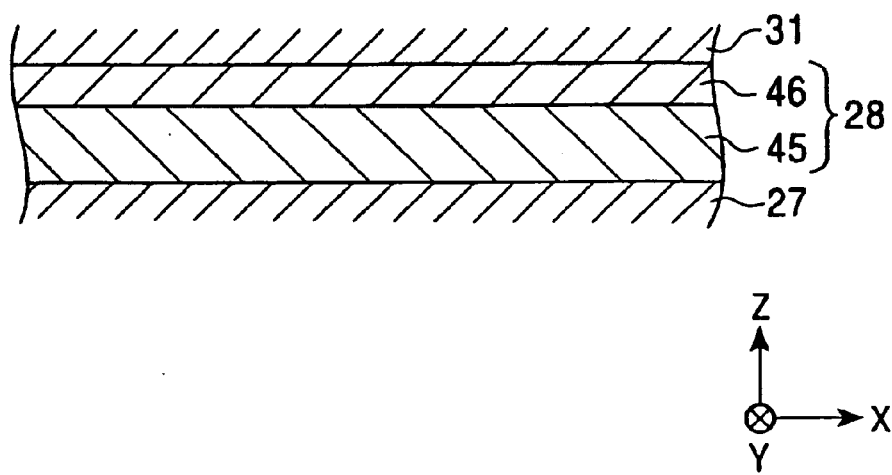
FIG. 18 is a partial enlarged sectional view showing yet another embodiment of the free magnetic layer in accordance with the present invention observed from a surface opposing a recording medium.

FIG. 18 is a partial enlarged sectional view showing still another embodiment of the free magnetic layer 28 according to the present invention.

The free magnetic layer 28 shown in FIG. 18 has a backed layer 46 between a magnetic layer 45 and a second antiferromagnetic layer 31. The backed layer 46 is formed from, for example, Cu, Au, Cr, or Ru. The magnetic layers 45 and 47 are formed from a magnetic material, such as NiFe alloy, CbFe alloy, CoFeNi alloy, Co, or CoNi alloy.

The presence of the backed layer 46 extends the mean free path of an upspin conduction electron that contributes to magnetoresistance effect. As a result, the so-called "spin filter effect" enables a spin valve type magnetic device to obtain a higher resistance change rate to accommodate higher recording densities. The backed layer 46 also acts as an intermediary for exchange coupling, so the exchange coupling magnetic field between the second antiferromagnetic layer 31 and the magnetic layer 45 will be maintained at a sufficiently large value although it is slightly reduced.

Figure 20:
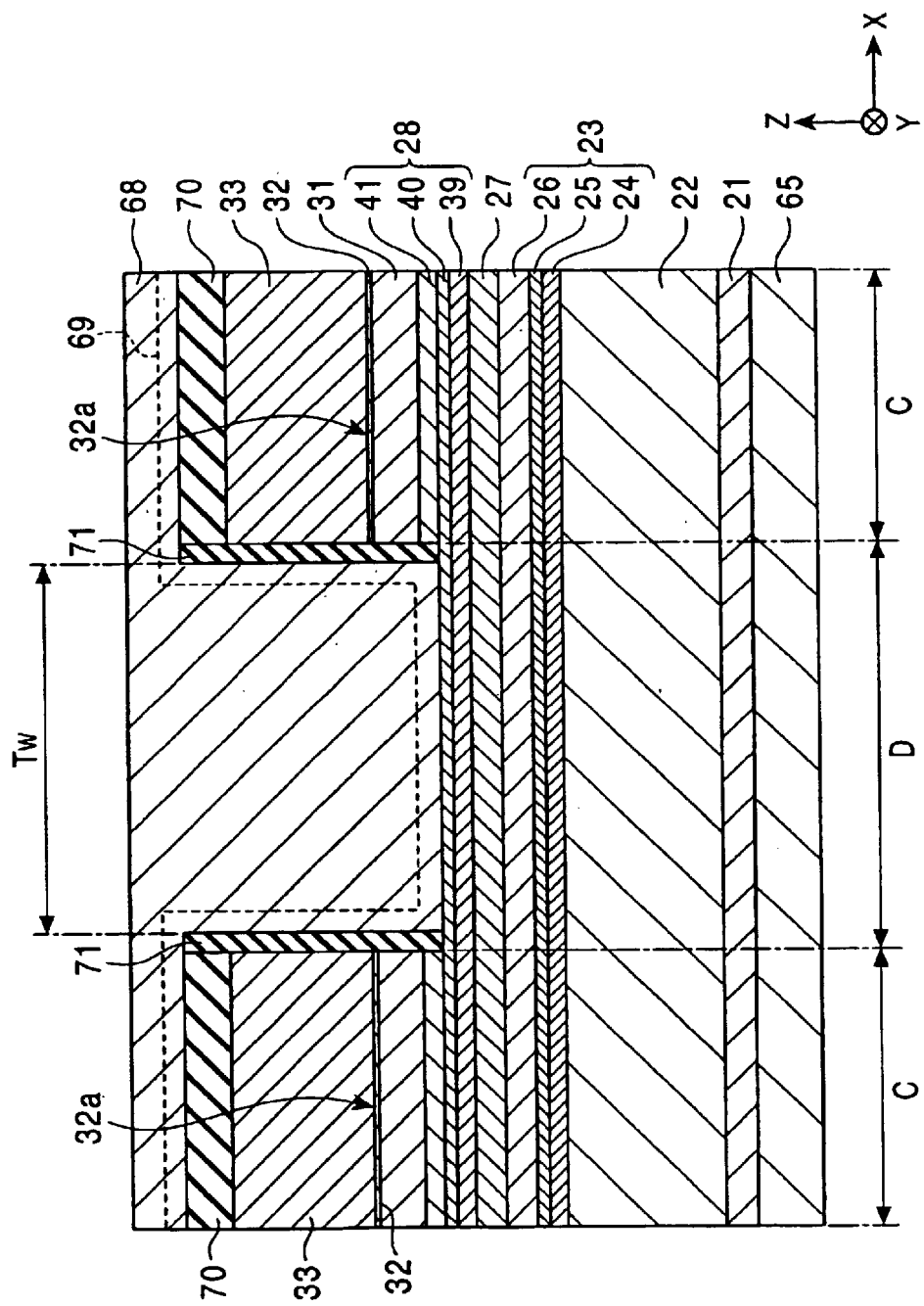
FIG. 20 is a partial sectional view of the structure of a magnetic detection device according to a sixteenth embodiment of the present invention observed from a surface opposing a recording medium.

FIG. 20 shows a magnetic detection device obtained by turning the one shown in FIG. 19 into a CPP type magnetic detection device shown in FIG. 10. More specifically, in the magnetic detection device shown in FIG. 20, first insulating layers 70 are deposited on upper surfaces 33b of the third antiferromagnetic layers 33, and second insulating layers 71 are provided on inner end portions 33a, 33a of the third antiferromagnetic layers 33 and the inner end portions 31a, 31a of the second antiferromagnetic layers 31. Further, a lower shielding layer 65 made of a magnetic material, which serves also an electrode layer, is provided under the multilayer. An upper shielding layer 68 made of a magnetic material, which also serves as an electrode layer, is provided to cover the first insulating layers 70, the second insulating layers 71, and a central portion D of the multilayer.

Further, a nonmagnetic layer 69 formed from a nonmagnetic electrically conductive material, such as Ta, may be provided between the first insulating layers 70, the second insulating layers 71, the central portion D of the multilayer, and the upper shielding layer 68.

Figure 21:
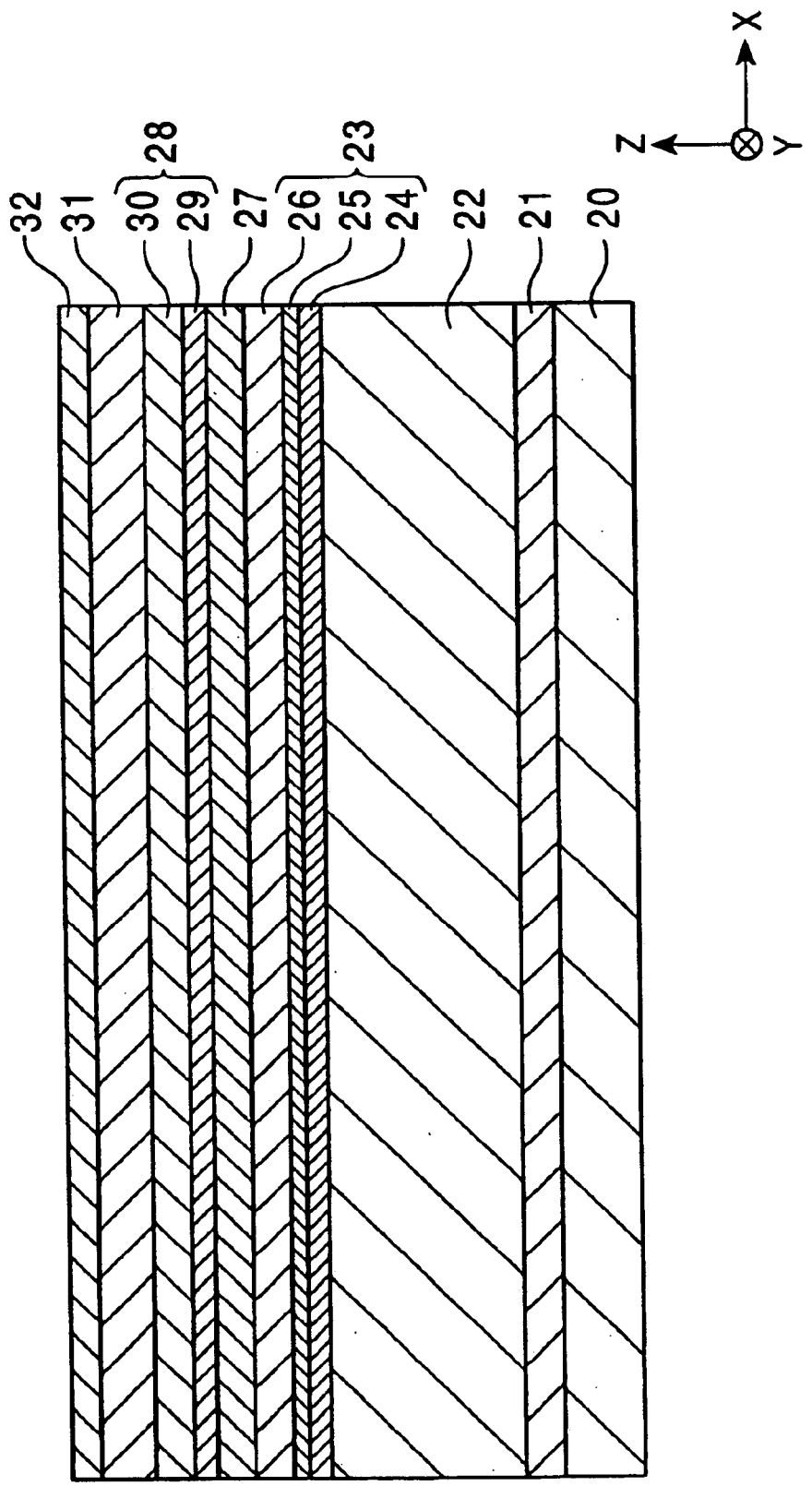
FIG. 21 is a magnetic detection device according to the embodiment shown in FIG. 1 prepared according to a manufacturing process step of the invention.
Figure 22:
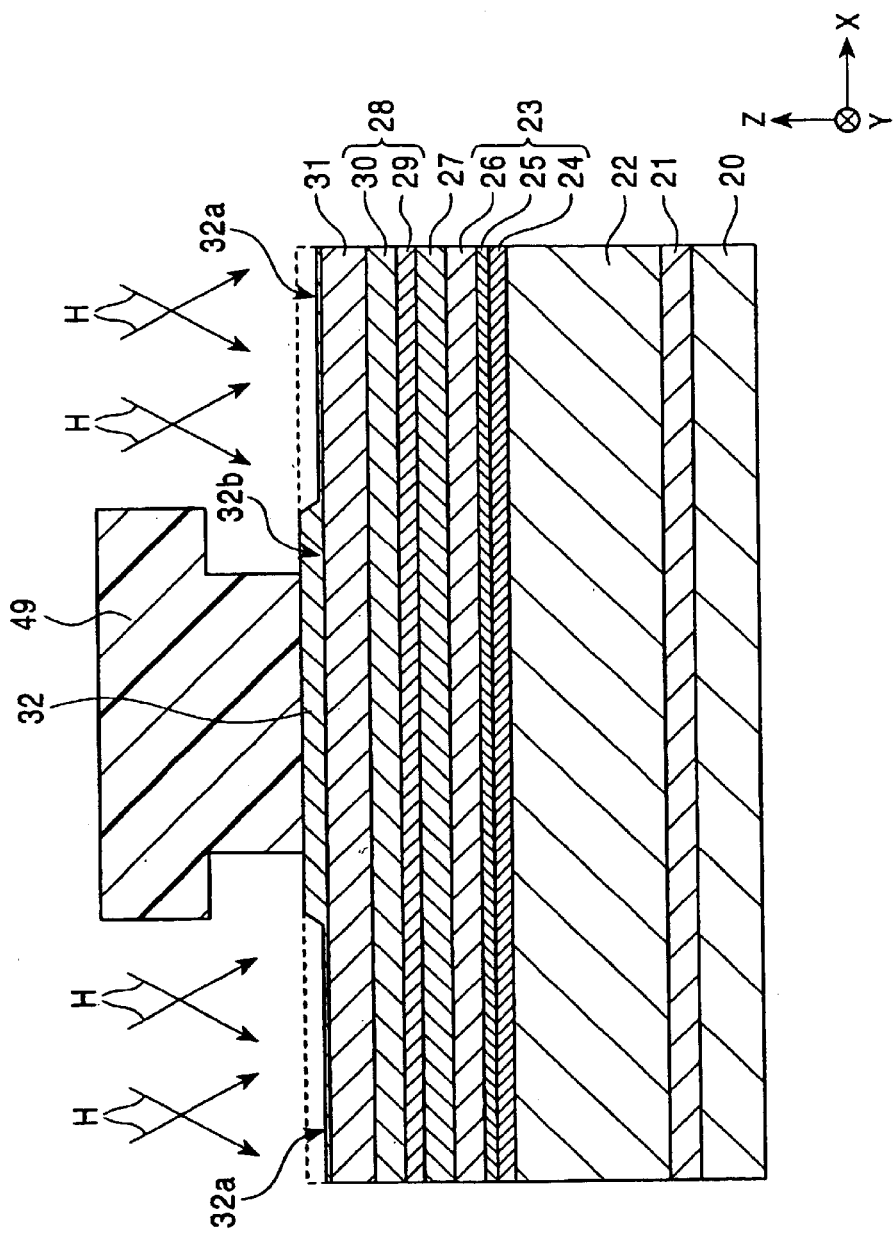
FIG. 22 is a magnetic detection device according to the embodiment shown in FIG. 1 prepared according to a step implemented after the step in FIG. 21.
Figure 23:
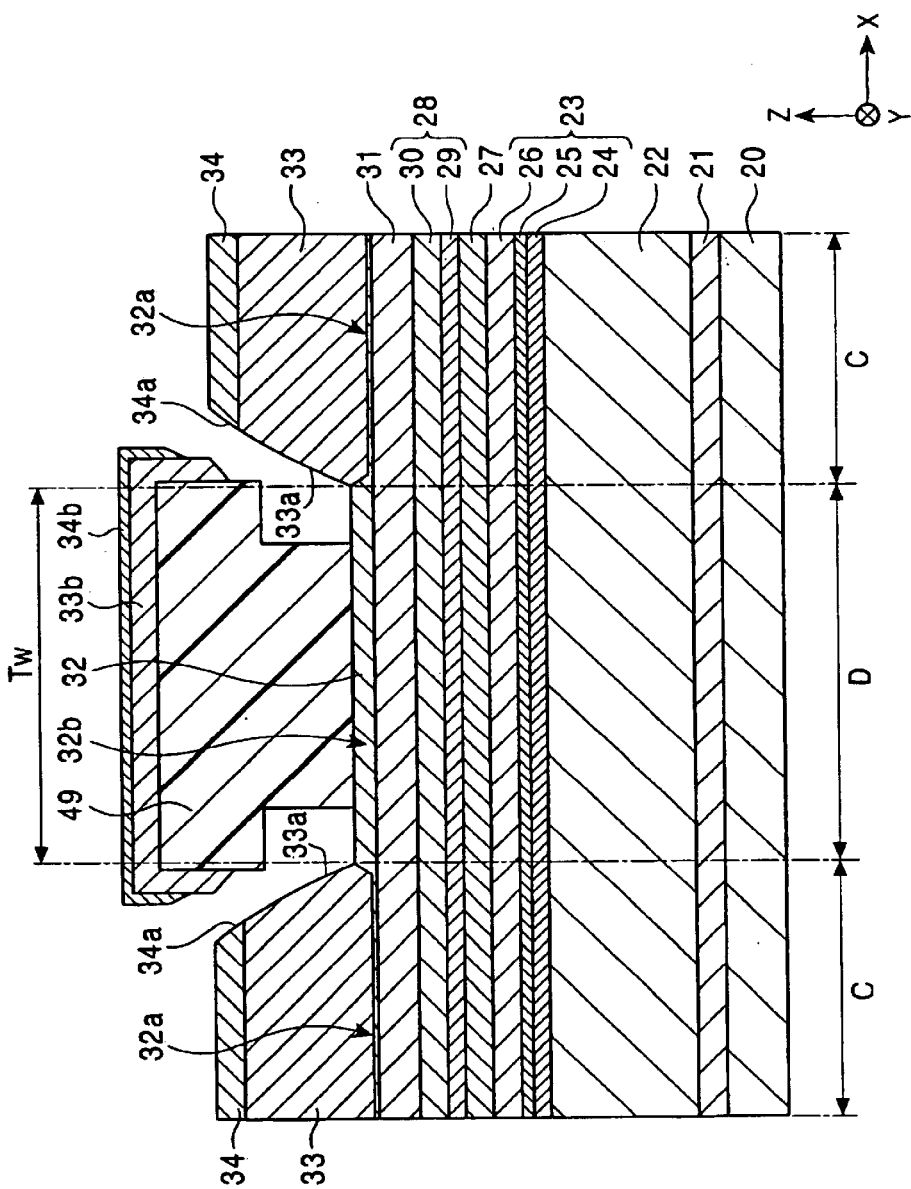
FIG. 23 is magnetic detection device according to the embodiment shown in FIG. 1 prepared according to a step implemented after the step in FIG. 22.

FIG. 21 through FIG. 23 are partial sectional views of the laminates in individual manufacturing steps observed from a side opposing a recording medium.

In FIG. 21, a seed layer 21, a first antiferromagnetic layer 22, a pinned magnetic layer 23, a nonmagnetic layer 27, a free magnetic layer 28, a second antiferromagnetic layer 31, and a nonmagnetic layer 32 are successively deposited in this order on a substrate 20. These layers are deposited by sputtering or vapor deposition. The pinned magnetic layer 23 shown in FIG. 21 has a multilayer ferri-structure including magnetic layers 24 and 26 formed from, for example, a CoFe alloy, and a nonmagnetic intermediate layer 25 formed from a material such as Ru that lies between the two magnetic layers 24 and 26. The free magnetic layer 28 has a multilayer structure of a diffusion restraining layer 29 made of a material such as CoFe alloy and a magnetic material layer 30 made of a material such as NiFe alloy.

According to the present invention, the first antiferromagnetic layer 22 and the second antiferromagnetic layer 31 are preferably formed from a PtMn alloy or X—Mn alloy (X being one or more elements selected from Pd, Ir, Rh, Ru, Os, Ni, and Fe), or a Pt—Mn—X' alloy (X' being one or more of elements selected from Pd, Ir, Rh, Ru, Au, Ag, Os, Cr, Ni, Ar, Ne, Xe, and Kr).

In the above PtMn and X—Mn alloys, Pt or X preferably ranges from about 37 to about 63 at %. Further, in the above PtMn and X—Mn alloys Pt or X preferably ranges from about 47 to about 57 at %. Unless otherwise specified, the value following "from" indicates the lower limit and the value following "to" indicates the upper limit in defining a range.

Preferably, in the Pt—Mn—$X^1$ alloys X'+Pt preferably ranges from about 37 to about 63 at %. In the Pt—Mn—X' alloys, X'+Pt more preferably ranges from 47 to 57 at %. Further, in the Pt—Mn—X' alloys, X' preferably ranges from about 0.2 to about 10 at %. If, X' is composed of one or more elements selected from Pd, Ir, Rh, Ru, Os, Ni, and Fe, then X' preferably ranges from about 0.2 to about 40 at %.

According to the present invention, the thickness of the first antiferromagnetic layer 22 preferably ranges from about 80 angstroms to about 300 angstroms. An antiferromagnetic layer 22 with a thickness in the above range allows a large exchange coupling magnetic field between the first antiferromagnetic layer 22 and the pinned magnetic layer 23 by annealing in a magnetic field. Specifically, an exchange coupling magnetic field of about 48 kA/m or more, e.g., about 64 kA/m or more can be generated.

According to the present invention, the second antiferromagnetic layer 31 is preferably has a thickness in the range of about 20 angstroms to about 50 angstroms more preferably from about 30 angstroms to about 40 angstroms.

A first characteristic of the present invention is that the second antiferromagnetic layer 31 is made thin.

As described above, a thin second antiferromagnetic layer 31 thin, namely, about 50 angstroms or less, imparts non-antiferromagnetic properties to the second antiferromagnetic layer 31. Therefore, even when a first annealing in a magnetic field is carried out, it will be difficult for the second antiferromagnetic layer 31 to develop order transformation, and no or very little exchange coupling magnetic field is generated between the second antiferromagnetic layer 31 and the free magnetic layer 28. Hence, the magnetization of the free magnetic layer 28 cannot be fixed as firmly as that of the pinned magnetic layer 23.

The second antiferromagnetic layer 31 should have a thickness of about 20 angstroms or more, preferably about 30 angstroms or more. Insufficient thickness would make it difficult for both end portions C of the second antiferromagnetic layer 31 to develop antiferromagnetic properties even after the third antiferromagnetic layers 33 are deposited on both end portions C of the second antiferromagnetic layer 31 in a subsequent step. This prevents sufficient exchange coupling magnetic field from being generated between both end portions C of the second antiferromagnetic layer 31 and both end portions C of the free magnetic layer 28.

Further, the nonmagnetic layer 32 deposited on the second antiferromagnetic layer 31, as illustrated in FIG. 21, properly protects the second antiferromagnetic layer 31 from being oxidized even if the laminate shown in FIG. 21 is exposed to the atmosphere.

The nonmagnetic layer 32 has to be a dense layer so it is not easily oxidized when exposed to the atmosphere. In addition, the nonmagnetic layer 32 must be formed from an element that does not degrade the properties of an antiferromagnetic layer even if the element diffuses into the second antiferromagnetic layer 31 by a mechanisms such thermal diffusion.

According to the present invention, the nonmagnetic layer 32 is preferably formed from a noble metal composed of one or more of elements selected from Ru, Re, Pd, Os, Ir, Pt, Au, and Rh.

The nonmagnetic layer 32 made of a noble metal such as Ru is preferably a dense layer resistant to oxidation caused by exposure to the atmosphere. Hence, even if a thin nonmagnetic layer 32 is used, the nonmagnetic layer 32 will still be capable of effectively protecting the second antiferromagnetic layer 31 from being oxidized by exposure to the atmosphere.

According to the present invention, the nonmagnetic layer 32 is preferably has a thickness in the range of between about 3 angstroms to about 10 angstroms. It is possible for the nonmagnetic layer 32 having such a small thickness within the above range to effectively protect the second antiferromagnetic layer 31 from being oxidized by exposure to the atmosphere.

A second characteristic of the present invention is that the nonmagnetic layer 32 is formed from a noble metal, such as Ru, and is thin, from about 3 angstroms to about 10 angstroms. Using a nonmagnetic layer 32 with a thickness within the above range allows the ion milling step in FIG. 22 to be performed at low energy. Therefore, better milling control than in the prior art can be achieved. This will be described in detail in conjunction with the step illustrated in FIG. 22.

The layers up to the nonmagnetic layer,32 are deposited on the substrate 20, as shown in FIG. 21, followed by first annealing in a magnetic field. Heat treatment is performed at a first heat treatment temperature while applying a first magnetic field in a direction Y in the drawing that is orthogonal to the track width Tw (direction X in the diagram). An exchange coupling magnetic field is produced between the first antiferromagnetic layer 22 and the magnetic layer 24 constituting the pinned magnetic layer 23 to fix the magnetization of the magnetic layer 24 in the direction Y in the diagram. The magnetization of the other magnetic layer 26 is fixed in a direction opposite to directionY by the exchange coupling based on the RKKY interaction taking place between the magnetic layer 26 and the magnetic layer 24. For instance, the first heat treatment temperature is set to about 270° C., and the magnitude of the magnetic field is set to about 800 k (A/m).

As set forth above, no or very little exchange coupling magnetic field is generated between the second antiferromagnetic layer 31 and the magnetic material layer 30 constituting the free magnetic layer 28 by the first annealing in a magnetic field. This is because the second antiferromagnetic layer 31 is thin, namely, about 50 angstroms or less, so it does not have antiferromagnetic properties.

A noble metal element such as Ru, which is used for the nonmagnetic layer 32 may diffuse into the second antiferromagnetic layer 31 during a first annealing in a magnetic field. Therefore, the elements in the vicinity of the surface of the second antiferromagnetic layer 31 after heat treatment include an element constituting the antiferromagnetic layer and a noble metal element. The noble metal element that diffused into the second antiferromagnetic layer 31 is more likely to exist near the top portion of the second antiferromagnetic layer 31 than near the bottom of the second antiferromagnetic layer 31. The composition ratio of the diffused noble metal element gradually decreases from the top toward the bottom of the second antiferromagnetic layer 31. This change in composition can be measured using an instrument a such as a SIMS analyzer.

In the next step in FIG. 22, a resist layer is deposited on the upper surface of the nonmagnetic layer 32. The resist layer is developed by exposure to leave the resist layer 49 having the configuration shown in FIG. 22 on the nonmagnetic layer 32. The resist layer 49 can be a lift-off resist layer.

Both end portions 32a of the nonmagnetic layer 32 not covered by the resist layer 49 are partly removed by ion milling from directions H indicated by the arrows in FIG. 22 to remove portions of the nonmagnetic layer 32 that are indicated by the dotted lines in FIG. 22.

Both end portions 32a of the nonmagnetic layer 32 are partly removed to reduce the thickness of the end portions 32a. Otherwise, antiferromagnetic interaction cannot be induced between the third antiferromagnetic layers 33 deposited on both end portions 32a and both end portions C of the second antiferromagnetic layer 31 in a subsequent step. As a result, antiferromagnetic properties cannot be imparted to both end portions C of the second antiferromagnetic layer 31, and the magnetization of the two end portions C of the free magnetic layer 28 cannot be firmly fixed.

The thickness of the two end portions 32a of the nonmagnetic layer 32 is preferably set to about 3 angstroms or less in the ion milling step. By decreasing the thickness of the end portions 32a of the nonmagnetic layer 32 to the above range, antiferromagnetic interaction can be induced between the two end portions C of the second antiferromagnetic layer 31 and the third antiferromagnetic layers 33 when the third antiferromagnetic layers 33 are deposited on the two end portions C of the second antiferromagnetic layer 31. This enables the two end portions of the second antiferromagnetic layer 31 and the third antiferromagnetic layers 33 to act like a one-piece antiferromagnetic layer, allowing both end portions C of the second antiferromagnetic layer 31 to develop antiferromagnetic properties.

For the ion milling step illustrated in FIG. 22, low-energy ion milling can be performed because the nonmagnetic layer 32 is extremely thin, namely, about 3 angstroms to about 10 angstroms.

Figure 37:
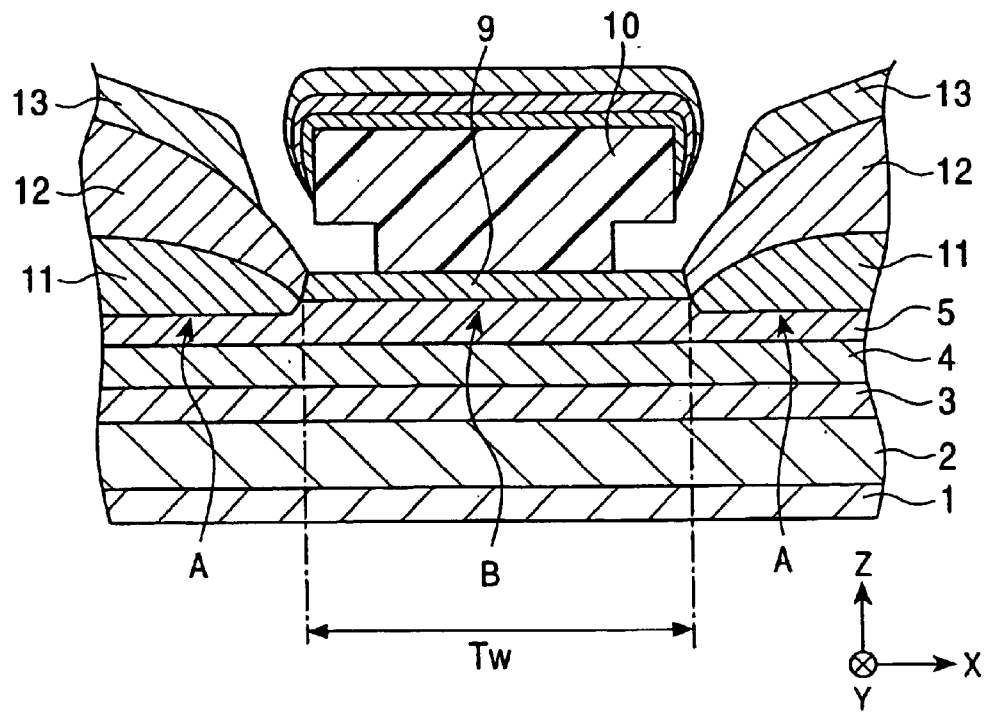
FIG. 37 is a conventional magnetic detection device prepared after the step in FIG. 36.

In contrast to the above, if a Ta film 9 is used as in the conventional example shown in FIG. 37, the Ta film 9 has to be thick, namely, from about 30 angstroms to about 50 angstroms, to compensate for oxidation caused by air exposure. Otherwise, the Ta film 9 cannot sufficiently protect the layer underneath. Further, as the volume of Ta film 9 increases, the thickness of the Ta film 9 increases to about 50 angstroms or more.

Removing such thick Ta film 9 inevitably requires high-energy ion milling. It is, however, extremely difficult to control high-energy ion milling to remove only the Ta film 9. As a result, the surface of the free magnetic layer 5 deposited under the Ta film 9 is partly removed and damaged by the ion milling.

According to the present invention, the nonmagnetic layer 32 formed from an element such as Ru is able to adequately protect the second antiferromagnetic layer 31 from being oxidized even though it has such a small thickness in the range of only about 3 angstroms to about 10 angstroms. Since low-energy ion milling can be applied to the thin nonmagnetic layer 32, milling can be easily stopped in the middle of the nonmagnetic layer 32.

Thus, the present invention permits the application of the low-energy ion milling, so improved milling control is obtained.

Experimental results indicate that milling duration preferably ranges from about 20 seconds to about 40 seconds and the milling angle preferably ranges from about 30 degrees to about 70 degrees, more preferably from about 40 degrees to about 60 degrees, with respect to the direction perpendicular to the surface of the substrate 20. Under these conditions, the antiferromagnetic interaction induced between the two end portions C of the second antiferromagnetic layer 31 and the third antiferromagnetic layers 33 deposited thereon can be reinforced, resulting in an enhanced exchange coupling magnetic field generated between both end portions C of the second antiferromagnetic layer 31 and both end portions C of the free magnetic layer 28.

The step illustrated in FIG. 23 is carried out. In the step of FIG. 23, the third antiferromagnetic layers 33 and electrode layers 34 are deposited in succession on the two end portions 32a of the nonmagnetic layer 32 by sputtering or vapor deposition. Inner end portions 33a of the deposited third antiferromagnetic layers 33 and inner end portions 34a of the deposited electrodes 34 are formed with slop surfaces or curved surfaces such that the gap between the third antiferromagnetic layers 33 gradually increases from the bottom to the top (direction Z in the drawing).

In this embodiment, the track width Tw is defined by the interval between the bottom surface edges of the third antiferromagnetic layers 33.

The material used for the third antiferromagnetic layers 33 is preferably the same antiferromagnetic material used for the second antiferromagnetic layer 31.

In the step illustrated in FIG. 23, the thickness of the third antiferromagnetic layers 33 is preferably adjusted so the total thickness of the third antiferromagnetic layer 33 and the end portion of the second antiferromagnetic layer 31 formed underneath is in the range of about 80 angstroms to about 300 angstroms.

Forming the second antiferromagnetic layer 31 and the third antiferromagnetic layer 33 such that the total thickness of the layers 31 and 33 ranges from about 80 angstroms to about 300 angstroms makes it easier for both end portions C of the second antiferromagnetic layer 31 to develop antiferromagnetic properties. An end portion C of the second antiferromagnetic layer 31 alone does not exhibit antiferromagnetic properties.

After the layers up to the electrode layers 34 are deposited, as shown in FIG. 23, the resist layer 49 is removed by lifting it off, a film 33b of an antiferromagnetic material composed of an element constituting the third antiferromagnetic layers 33, and a film 34b of an electrode material made of an element constituting the electrode layer 34 having been attached to the resist layer 49.

In the next step, a second annealing in a magnetic field is carried out. In this case, the magnetic field is oriented along the track width direction (direction X in the drawing). In the second annealing under a magnetic field, a second application magnetic field is set smaller than the exchange anisotropic magnetic field of the first antiferromagnetic layer 22. Also, the heat treatment temperature is set lower than the blocking temperature of the first antiferromagnetic layer 22.

Preferably, the magnitude of the second magnetic field is set greater than that of the saturation magnetic field of the free magnetic layer 28 and the diamagnetic field of the free magnetic layer 28. Under these conditions, the exchange anisotropic magnetic field of the second antiferromagnetic layer 31 can be oriented along track width direction (direction X in the drawing), while maintaining the direction of the exchange anisotropic magnetic field of the first antiferromagnetic layer 22 along the height direction (direction Y in the drawing). The second heat treatment temperature is set, for example, to about 250° C., and the magnitude of the magnetic field is set to about 24 k (A/m).

The third antiferromagnetic layers 33 are deposited on the two end portions C of the second antiferromagnetic layer 31 through the nonmagnetic layer 32, so the antiferromagnetic interaction between the end portions C of the second antiferromagnetic layer 31 and the third antiferromagnetic layers 33 is enhanced. As a result, both end portions C of the second antiferromagnetic layer 31 develop the antiferromagnetic properties. An end portion C of the second antiferromagnetic layer 31 by itself does not exhibit antiferromagnetic properties.

Thus, a second annealing under a magnetic field causes order transformation to properly take place in both end portions C of the second antiferromagnetic layer 31, producing an exchange coupling magnetic field of a proper magnitude between the two end portions C of the second antiferromagnetic layer 31 and the two end portions C of the free magnetic layer 28. This pins the magnetization of both end portions C of the free magnetic layer 28 along the track width direction (direction X in the drawing).

On the other hand, no or very little exchange coupling magnetic field is generated between the second antiferromagnetic layer 31 deposited on the central portion D of the free magnetic layer 28 and the central portion D of the free magnetic layer 28. Hence, the magnetization of the central portion D of the free magnetic layer 28 is not fixed along the track width direction as firmly as the magnetization of both end portions C thereof.

The central portion D of the free magnetic layer 28 is loosely magnetized to a level that permits inverted magnetization in response to an external magnetic field.

In the second annealing under a magnetic field, it is believed that a noble metal element such as Ru used for the nonmagnetic layer 32 diffuses into the second antiferromagnetic layer 31 and the third antiferromagnetic layers 33. Therefore, the elements constituting the second antiferromagnetic layer 31 and the third antiferromagnetic layers 33 after heat treatment include an element constituting the antiferromagnetic layers and a noble metal element. The noble metal element that diffused into the second antiferromagnetic layer 31 and the third antiferromagnetic layers 33 is more likely to be found near the top of the second antiferromagnetic layer 31 than near the bottom. The noble metal element is more likely to be found near the bottom of the third antiferromagnetic layers 33 than near the top. The composition ratio of the diffused noble metal element is believed to gradually decrease from the top to the bottom of the second antiferromagnetic layer 31 and from the bottom to the top of the third antiferromagnetic layers 33. This change in composition can be verified by an instrument such as a SIMS analyzer.

The manufacturing method in accordance with the present invention allows the magnetization of the free magnetic layer 28 to be effectively controlled, making it possible to fabricate magnetic detection devices featuring high reproduction sensitivity even with tracks narrower than those in conventional magnetic detection devices.

The manufacturing process set forth above permits the manufacture of the magnetic detection device shown in FIG. 1. The manufacturing method for the magnetic detection device shown in FIG. 2 includes the steps performed in FIGS. 21 through 23. In the ion milling step in FIG. 22, the two end portions 32a of the nonmagnetic layer 32 formed from an element such as Ru are completely removed.

As described above, according to the present invention, the nonmagnetic layer 32 upon completion of its formation is extremely thin. Thus, low-energy ion milling can be applied to etch away the nonmagnetic layer 32. Low-energy ion milling has a lower milling rate than high-energy ion milling; hence, it is easier to stop milling at the moment when the two end portions 32a of the nonmagnetic layer 32 have been removed. In other words, milling control is easier than in conventional methods, making it possible to effectively control the influences exerted by milling on the surface of the second antiferromagnetic layer 31 exposed by the removal of the nonmagnetic layer 32.

Therefore, in the step used in FIG. 22, ion milling can be more easily controlled to remove only the two end portions 32a of the nonmagnetic layer 32 to protect the second antiferromagnetic layer 31 underneath from damage caused by the ion milling. Successful protection of the second antiferromagnetic layer 31 from milling prevents damage to the surface of the second antiferromagnetic layer 31. This makes it possible to maintain good magnetic characteristics of the second antiferromagnetic layer 31.

Even if the surface of the second antiferromagnetic layer 31 is slightly etched, as indicated by dotted lines E in FIG. 2, it is believed that the surface of the second antiferromagnetic layer 31 is not substantially damaged by low-energy ion milling. Hence, depositing the third antiferromagnetic layers 33 on the two end portions C of the second antiferromagnetic layer 31 in the step used in FIG. 23 enables the two end portions C of the second antiferromagnetic layer 31 and the third antiferromagnetic layers 33 to act like a one-piece antiferromagnetic layer. This allows both end portions C of the second antiferromagnetic layer 31 to properly develop antiferromagnetic properties. This also allows the two end portions C of the second antiferromagnetic layer 31 to induce order transformation by second annealing in a magnetic field. Additionally, an exchange coupling magnetic field can be generated between the two end portions C of the second antiferromagnetic layer 31 and the free magnetic layer 28. As a result, the magnetization of the two end portions C of the free magnetic layer 28 can be properly pinned along the track width direction (direction X in the drawing).

The magnetic detection device shown in FIG. 3 can be fabricated by carrying out the step used in FIG. 21, depositing the resist layer 49 in the step used in FIG. 22, and then carrying out the step used in FIG. 23. Ion milling is not performed in the step used in FIG. 22.

According to the manufacturing method for the magnetic detection device shown in FIG. 3, the nonmagnetic layer 32 is formed beforehand to have a thickness of about 3 angstroms or less in the step used in FIG. 21. Alternatively, the nonmagnetic layer 32 is formed to have a thickness in the range of about 3 angstroms to about 10 angstroms in the step used in FIG. 21. The entire top surface of the nonmagnetic layer 32 is then subjected to ion milling until a thickness of about 3 angstroms or less is obtained.

Forming the nonmagnetic layer 32 to have a small thickness of about 3 angstroms or less makes it possible to cause antiferromagnetic interaction to take place between both end portions C of the second antiferromagnetic layer 31 and the third antiferromagnetic layers 33 deposited thereon through the nonmagnetic layer 32. This obviates the need for performing ion milling beforehand in the step used in FIG. 22 to reduce the thickness of the two end portions 32a of the nonmagnetic layer 32 or to completely remove the two end portions 32a.

As shown in FIG. 3, the nonmagnetic layer 32 can be left on the second antiferromagnetic layer 31, the central portion 32b having the same thickness as the two end portions 32a.

When the free magnetic layer 28 according to the embodiment shown in FIG. 16 or FIG. 18 is used in the manufacturing method for the magnetic detection device shown in the steps of FIG. 21 through FIG. 23, the third antiferromagnetic layers 33 and the electrode layers 34 may be covered with a resist layer after the step used in FIG. 23. The central portion 32b of the nonmagnetic layer 32 uncovered by the resist layer, as well as the central portion of the second antiferromagnetic layer 31 and the magnetic layer 41 shown in FIG. 16 or,the central portion of the backed layer 46 shown in FIG. 19, may then be etched by techniques such as milling.

The manufacturing method for the CIP type magnetic detection device shown in FIG. 1 through FIG. 3 having been explained, the manufacturing method for the CPP type magnetic detection device shown in FIG. 7 through FIG. 9 will now be described in detail, with emphasis on the steps different from the manufacturing method used for the magnetic detection device shown in FIGS. 1 through 3.

Figure 24:
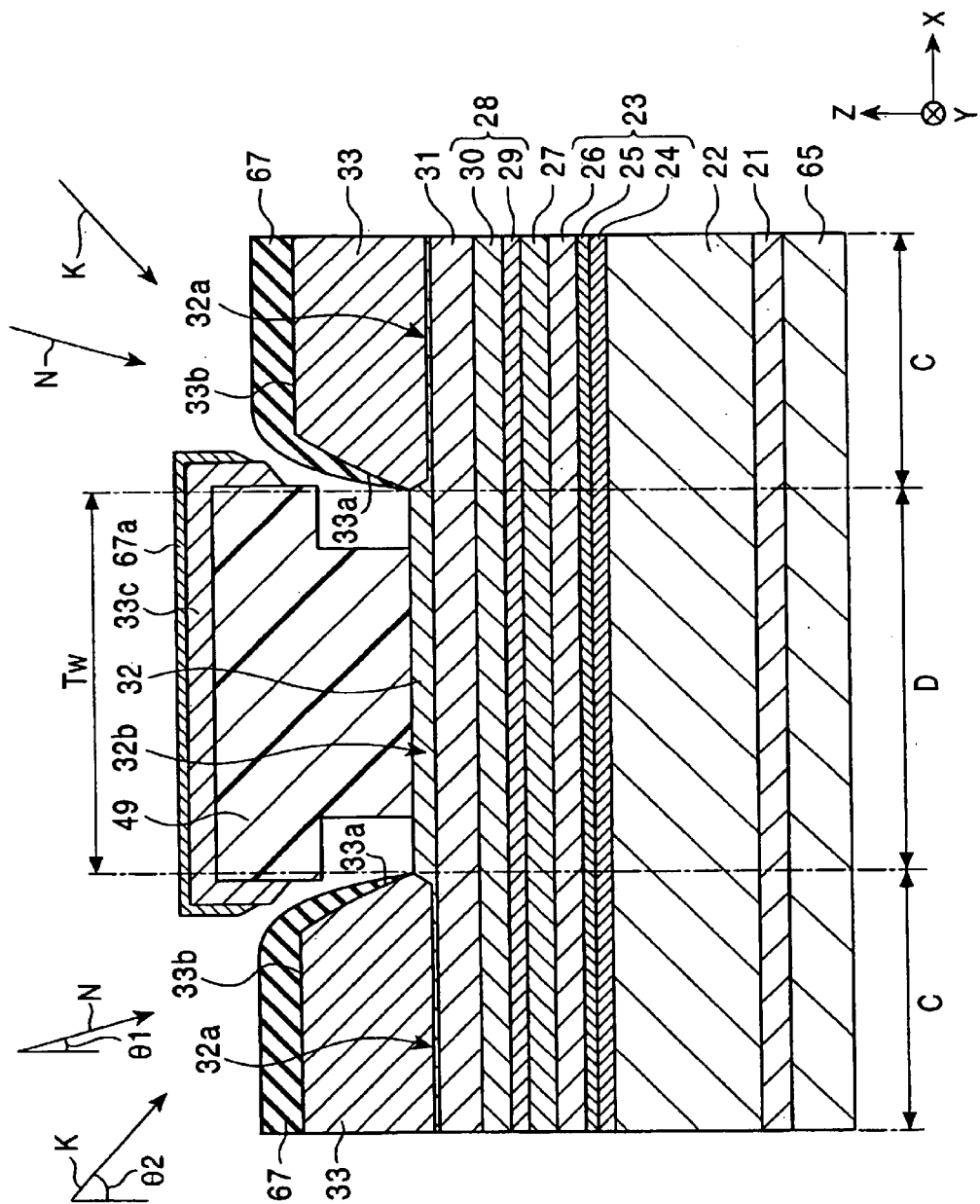
FIG. 24 is a magnetic detection device according to the embodiment shown in FIG. 7 prepared according to a manufacturing process step of the invention.

In the manufacturing method for the magnetic detection device shown in FIG. 7 through FIG. 9, the steps used in FIG. 21 and FIG. 22 are first carried out. Then, in the step used in FIG. 24, the third antiferromagnetic layers 33 are deposited on both end portions 32a of the nonmagnetic layer 32 by sputtering at a sputtering angle $\theta_1$ (a tilt with respect to direction Z in the drawing) relative to directions indicated by arrows N. Insulating layers 67 are then deposited on the top surfaces 33b and inner end portions 33a of the third antiferromagnetic layers 33 by sputtering at a sputtering angle $\theta_2$ (a tilt with respect to the direction Z in the drawing) relative to a direction indicated by arrows K.

The sputtering angles $\theta_1$ and $\theta_2$ may be the same. Preferably, however, the sputtering angle $\theta_2$ is greater than the sputtering angle $\theta_1$. This makes it easier to extended an inner end portion 67a of the insulating layer 67 to points above both ends of the central portion 32b of the nonmagnetic layer 32. Preferably, sputtering angles $\theta_1$ and $\theta_2$ preferably have a certain tilt with respect to direction Z in the drawing.

Figure 25:
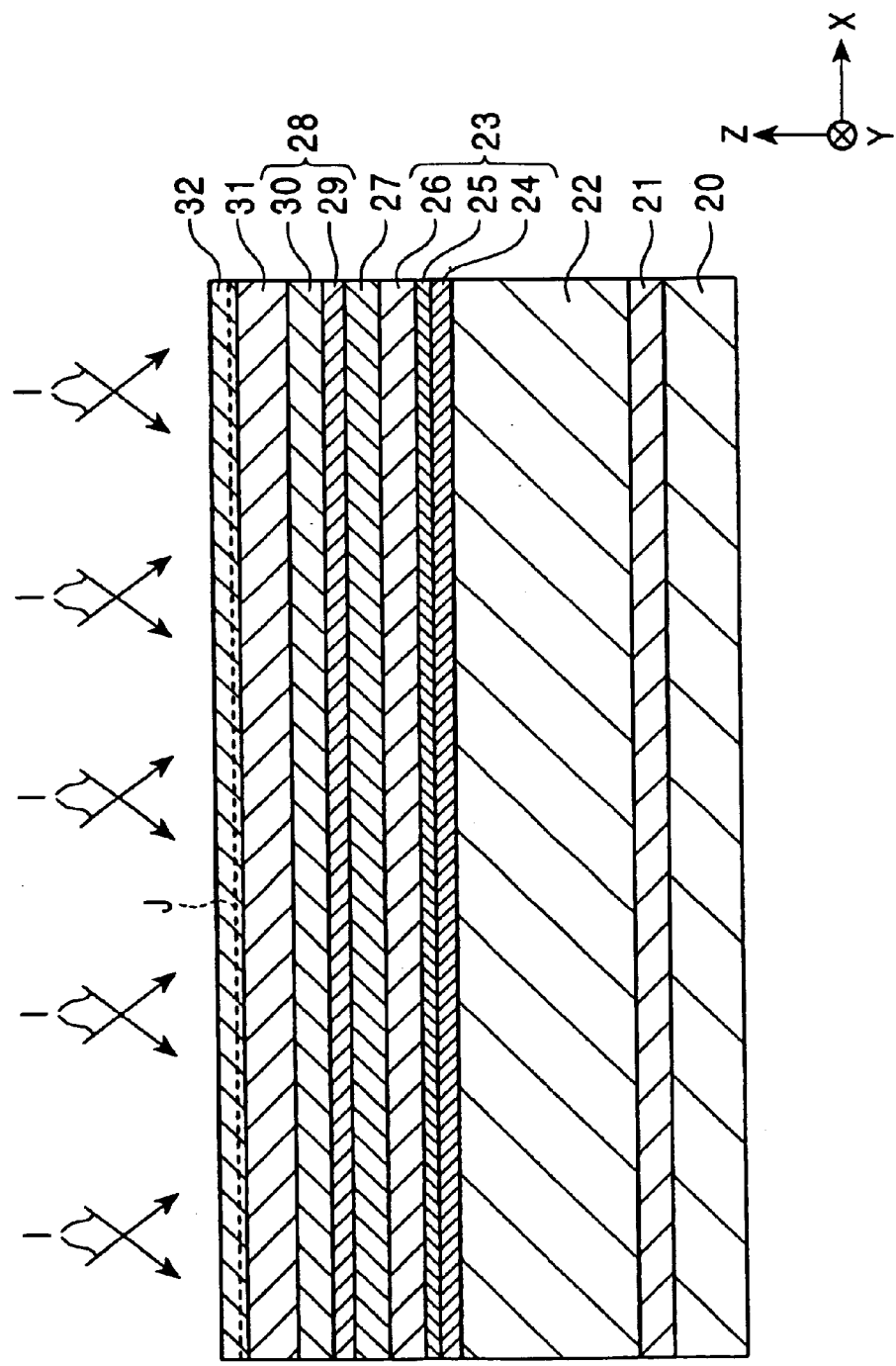
FIG. 25 is a magnetic detection device according to the embodiment shown in FIG. 4 prepared according to a manufacturing process step of the invention.
Figure 26:
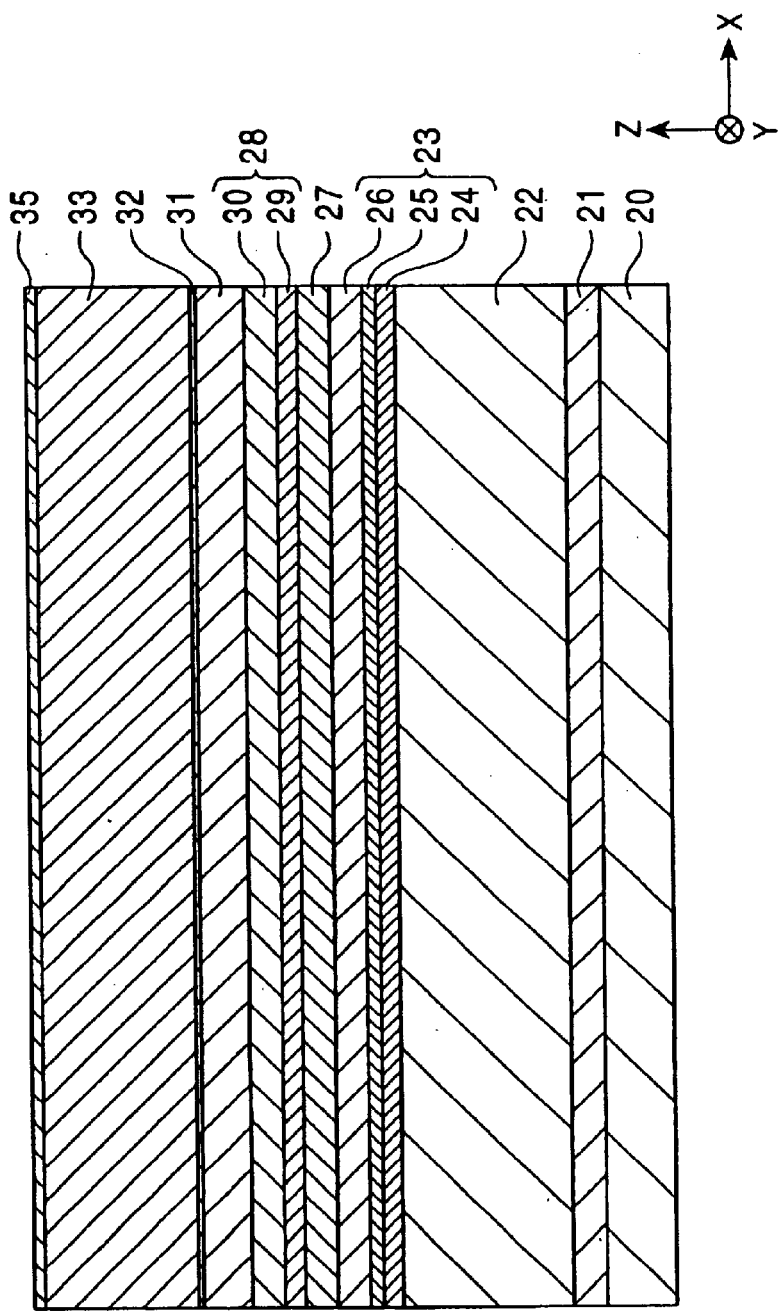
FIG. 26 is a magnetic detection device according to the embodiment shown in FIG. 4 prepared according to a step implemented after the step in FIG. 25.
Figure 27:
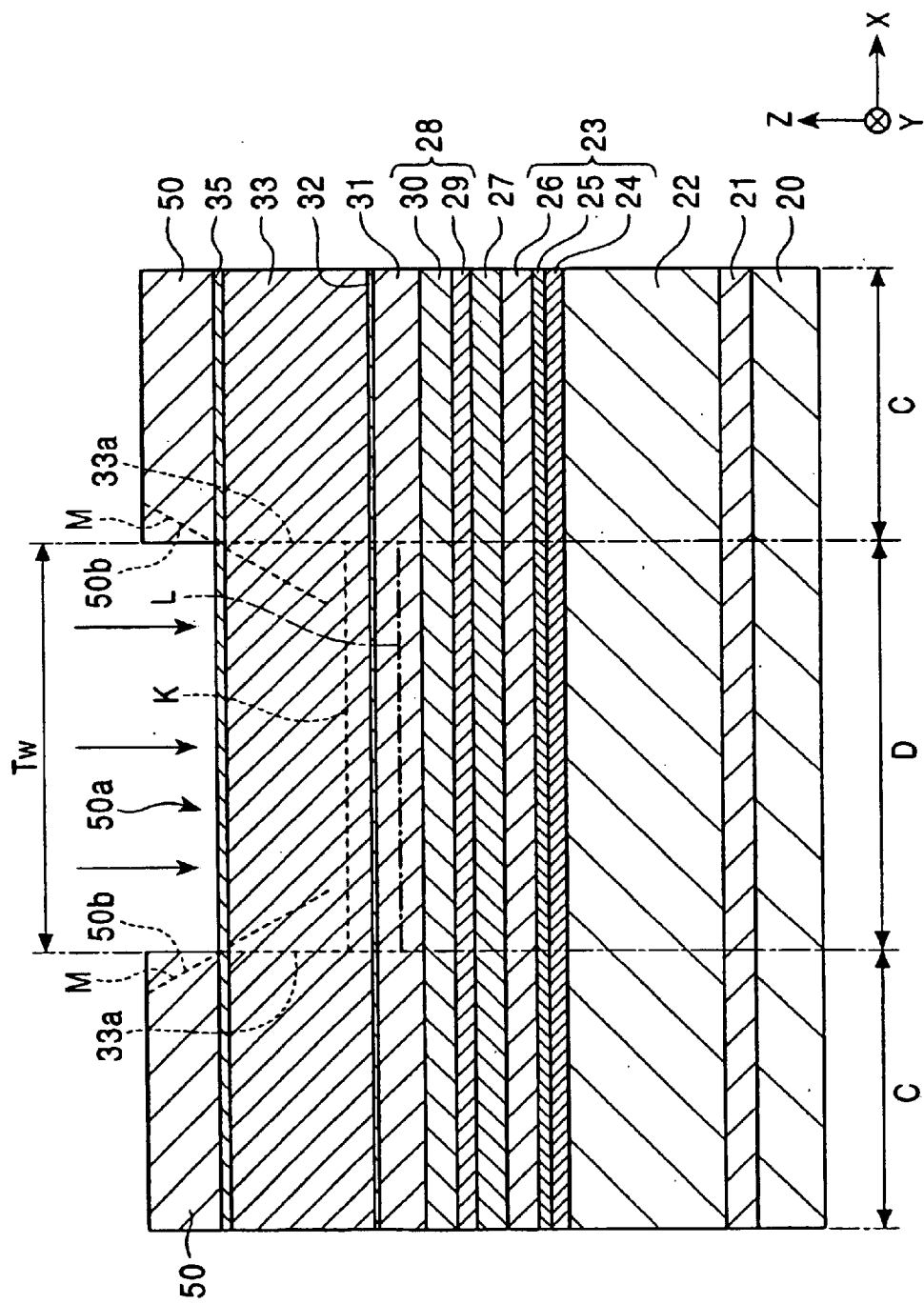
FIG. 27 is a magnetic detection device according to the embodiment shown in FIG. 4 prepared according to prepared according to a step implemented after the step in FIG. 26.

The manufacturing process steps used in FIGS. 25 through 27 are some of the steps used to manufacture the magnetic detection device shown in FIG. 10. All these figures are partial sectional views, as observed from a surface opposing a recording medium.

First, in the step illustrated in FIG. 25, a seed layer 21, a first antiferromagnetic layer 22, a pinned magnetic layer 23, a nonmagnetic material layer 27, a free magnetic layer 28, a second antiferromagnetic layer 31, and a nonmagnetic layer 32 are successively deposited in this order on a substrate 20 by sputtering or vapor deposition. The pinned magnetic layer 23 shown in FIG. 25 has a multilayer ferri-structure that includes magnetic layers 24 and 26 formed from, for example, a CoFe alloy, as well as a nonmagnetic intermediate layer 25 formed from an element such as Ru that lies between the two magnetic layers 24 and 26. The free magnetic layer 28 has a multilayer structure of a diffusion restraining layer 29 made of a material such as CoFe alloy, and a magnetic material layer 30 made of a material such as a NiFe alloy.

The first antiferromagnetic layer 22 and the second antiferromagnetic layer 31 are preferably formed from a PtMn alloy or X—Mn alloy (X being one or more elements selected from Pd, Ir, Rh, Ru, Os, Ni, and Fe), or a Pt—Mn—X' alloy (X' being one or more of elements selected from Pd, Ir, Rh, Ru, Au, Ag, Os, Cr, Ni, Ar, Ne, Xe, and Kr).

In the above PtMn and X—Mn alloys, Pt or X preferably ranges from about 37 to about 63 at %. Further, in the PtMn and X—Mn alloys, Pt or X preferably ranges from about 47 to about 57 at %. Unless otherwise specified, the value following "from" indicates the lower limit and the value following "to" indicates the upper limit in defining a range.

Preferably, in the alloy represented by Pt—Mn—X', X'+Pt preferably ranges from about 37 to about 63 at %. In the Pt—Mn—X' alloy, X'+Pt more preferably ranges from about 47 to about 57 at %. Further, in the Pt—Mn—X' alloy, X' preferably ranges from about 0.2 to about 10 at %. If X' is composed of one or more elements selected from among Pd, Ir, Rh, Ru, Os, Ni, and Fe, then X' preferably ranges from about 0.2 to about 40 at %.

The thickness of the first antiferromagnetic layer 22 preferably ranges from about 80 angstroms to about 300 angstroms. Forming the first antiferromagnetic layer 22 to have a thickness in the above range allows a large exchange coupling magnetic field to be produced between the first antiferromagnetic layer 22 and the pinned magnetic layer 23 by annealing under a magnetic field. More specifically, an exchange coupling magnetic field of about 48 kA/m or more, e.g., about 64 kA/m or more can be generated.

According to the present invention, the second antiferromagnetic layer 31 is preferably formed to have a thickness in the range of about 20 angstroms to about 50 angstroms, and more preferably, from about 30 angstroms to about 40 angstroms.

A first characteristic of the present invention is that a thin second antiferromagnetic layer 31 is used.

As described above, making the second antiferromagnetic layer 31 thin, namely, about 50 angstroms or less causes the second antiferromagnetic layer 31 to lose antiferromagnetic properties. Therefore, even when annealing under a magnetic field is carried out, it is difficult for the second antiferromagnetic layer 31 to induce order transformation, and no or very little exchange coupling magnetic field is generated between the second antiferromagnetic layer 31 and the free magnetic layer 28. Hence, the magnetization of the free magnetic layer 28 will not be fixed as firmly as that of the pinned magnetic layer 23.

The second antiferromagnetic layer 31 preferably has a thickness of about 20 angstroms or more, preferably, about 30 angstroms or more. Insufficient thickness would make it difficult for both end portions C of the second antiferromagnetic layer 31 to develop antiferromagnetic properties even after the third antiferromagnetic layers 33 are deposited on both end portions C of the second antiferromagnetic layer 31 in a subsequent step. This further prevents an appropriate magnitude of exchange coupling magnetic field from being generated between both end portions C of the second antiferromagnetic layer 31 and both end portions C of the free magnetic layer 28.

Further, the nonmagnetic layer 32 deposited on the second antiferromagnetic layer 31 according to the step used in FIG. 25 effectively protects the second antiferromagnetic layer 31 from being oxidized even if the multilayer laminate shown in FIG. 25 is exposed to the atmosphere.

The nonmagnetic layer 32 has to be a dense layer so it is not easily oxidized when exposed to the atmosphere. In addition, the nonmagnetic layer 32 must be formed from a material that does not degrade the properties of an antiferromagnetic layer even when the material diffuses into the second antiferromagnetic layer 31 by a mechanism such as thermal diffusion.

According to the present invention, the nonmagnetic layer 32 is preferably formed from a noble metal composed of one or more noble metals selected from Ru, Re, Pd, Os, and Ir.

The nonmagnetic layer 32 made of a noble metal, such as Ru, is a dense layer resistant to oxidation caused by exposure to the atmosphere. Thus, even if a thin nonmagnetic layer 32 is used, the nonmagnetic layer 32 will still be capable of protecting the second antiferromagnetic layer 31 from being oxidized by exposure to the atmosphere.

The nonmagnetic layer 32 preferably has a thickness in the range of about 3 angstroms to about 10 angstroms. Such a thin nonmagnetic layer 32 can effectively protect the second antiferromagnetic layer 31 from being oxidized by exposure to the atmosphere.

A second characteristic of the present invention is that the nonmagnetic layer 32 is formed from a noble metal, such as Ru, and is thin, i.e., having a thickness of from about 3 angstroms to about 10 angstroms. Setting the thickness of the nonmagnetic layer 32 to within this range allows ion milling in the following step to be performed effectively and easily.

The layers up to the nonmagnetic layer 32 are deposited on the substrate 20, as shown in FIG. 25, then the first annealing in a magnetic field is carried out. Heat treatment is performed at a first heat treatment temperature while applying a first magnetic field along Y direction in the drawing, which is orthogonal to the track width Tw (direction X in the diagram). An exchange coupling magnetic field is produced between the first antiferromagnetic layer 22 and the magnetic layer 24 constituting the pinned magnetic layer 23 to fix the magnetization of the magnetic layer 24 in direction Y in the diagram. The magnetization of the other magnetic layer 26 is fixed in a direction opposite to direction Y in the diagram by the exchange coupling based on the RKKY interaction taking place between the magnetic layer 26 and the magnetic layer 24. As an example, the first heat treatment temperature is set to about 270° C., and the magnitude of the magnetic field is set to about 800 k (A/m).

As set forth above, it is difficult for the second antiferromagnetic layer 31 to effect order transformation by a first annealing in a magnetic field because the layer is thin, and no exchange coupling magnetic field is produced between the second antiferromagnetic layer 31 and the magnetic material layer 30 constituting the free magnetic layer 28. The second antiferromagnetic layer 31 is formed to be thin, namely, about 50 angstroms or less, so it does not have antiferromagnetic properties.

The noble metal element, such as Ru, used for the nonmagnetic layer 32 may diffuse into the second antiferromagnetic layer 31 by the first annealing in a magnetic field. Therefore, the elements of the second antiferromagnetic layer 31 after heat treatment include an element constituting the antiferromagnetic layer and a noble metal element. The noble metal element that diffused into the second antiferromagnetic layer 31 is more likely to exist near the top of the second antiferromagnetic layer 31 than near the bottom of the second antiferromagnetic layer 31. The composition ratio of the diffused noble metal element gradually decreases from the top to the bottom of the second antiferromagnetic layer 31. This composition change can be verified using an instrument such as a SIMS analyzer.

In the next step used in FIG. 25, the entire surface of the nonmagnetic layer 32 is subjected to ion milling to etch away the nonmagnetic layer 32 down to the level indicated by a dotted line J.

The nonmagnetic layer 32 is partly removed to minimize its thickness. Otherwise, antiferromagnetic interaction cannot be induced between the third antiferromagnetic layers 33 deposited on both end portions 32a of the nonmagnetic layer 32 and both end portions C of the second antiferromagnetic layer 31. Without antiferromagnetic interaction, the magnetization of the free magnetic layer 28 cannot be controlled effectively.

According to the present invention, the thickness of the two end portions 32a of the nonmagnetic layer 32 preferably ranges from about 0.2 angstroms (mean value) to about 3 angstroms in the ion milling step. By decreasing the thickness of the end portions 32a of the nonmagnetic layer 32 to the aforesaid range, it is possible to induce antiferromagnetic interaction between the two end portions C of the second antiferromagnetic layer 31 and the third antiferromagnetic layers 33. This enables the two end portions C of the second antiferromagnetic layer 31 and the third antiferromagnetic layers 33 to function like a one-piece antiferromagnetic layer, thus allowing both end portions C of the second antiferromagnetic layer 31 to develop antiferromagnetic properties.

For the ion milling step used in FIG. 25, low-energy ion milling can be performed because the deposited nonmagnetic layer 32 is extremely thin, namely, about 3 angstroms to about 10 angstroms. Therefore, ion milling can be easily stopped in the middle of the nonmagnetic layer 32 because it can be performed at low energies. Thus, the present invention provides the advantage of improved milling control.

In the step used in FIG. 26, a third antiferromagnetic layer 33 is deposited on the nonmagnetic layer 32. An intermediate layer (protective layer) 35 formed from a material such as Ta is then deposited on the third antiferromagnetic layer 33. The intermediate layer 35 functions to protect the third antiferromagnetic layer 33 from oxidation caused by exposure to the atmosphere.

Preferably, the third antiferromagnetic layer 33 is formed from the same material used for the second antiferromagnetic layer 31.

In the step used in FIG. 26, the thickness of the third antiferromagnetic layer 33 is preferably adjusted so the total thickness of the third antiferromagnetic layer 33 and the second antiferromagnetic layer 31 formed underneath it and the nonmagnetic layer 32 ranges from about 80 angstroms to about 300 angstroms.

Forming the second antiferromagnetic layer 31 and the third antiferromagnetic layer 33 such that the total thickness of the layers 31 and 33 ranges from about 80 angstroms to about 300 angstroms causes the second antiferromagnetic layer 31 to develop antiferromagnetic properties. By itself, the second antiferromagnetic layer 31 does not exhibit antiferromagnetic properties.

In the step used in FIG. 27, mask layers 50 formed from, for example, an inorganic material are deposited on the intermediate layer 35 along the track width direction (direction X in the drawing) with a predetermined interval 50a provided therebetween. The inorganic material may be selected from among Ta, Ti, Si, Zr, Nb, Mo, Hf, W, Al—O, Al—Si—O, and Si—O. If a metal is used to make the mask layers 50, then they may be left behind as electrode layers 34 after completion of the manufacture.

To form the mask layers 50, a resist layer (not shown) is set on a central portion of, for example, the intermediate layer 35. Then the mask layers 50 are placed on both sides of the resist layer. Thereafter, the resist layer is removed to form the interval 50a corresponding to the predetermined width between the mask layers 50. Alternatively, the entire surface of the intermediate layer 35 may be covered with the mask layer 50, and the resist layer (not shown) may be deposited on the mask layer 50. Then, an opening is formed in the central portion of the resist layer by exposure. The mask layer 50 exposed through the opening is removed by techniques such as RIE to form the interval 50a corresponding to the predetermined width.

As another alternative according to the present invention, the mask layer 50 may be formed from a resist.

In the step illustrated in FIG. 27, the intermediate layer 35 exposed through the interval 50a of the mask layer 50 is removed by RIE or ion milling. The third antiferromagnetic layer 33 under the intermediate layer 35 is etched away down to the level indicated by a dotted line K. At this point, the third antiferromagnetic layer 33 is preferably etched away until the total thickness of the third antiferromagnetic layer 33 beneath the dotted line K and the thickness of the second antiferromagnetic layer 31 reaches about 50 angstroms or less, more preferably about 40 angstroms or less. Otherwise, the central portion D of the second antiferromagnetic layer 31 will undesirably retain the antiferromagnetic properties. This will generate an exchange coupling magnetic field between the central portion D of the second antiferromagnetic layer 31 and the central portion D of the free magnetic layer 28 during the second annealing in a magnetic field in the following step. The resulting exchange coupling magnetic field will undesirably firmly pin the magnetization of the central portion D of the free magnetic layer 28.

If the third antiferromagnetic layer 33 is etched away down to a level indicated by the dotted line K shown in FIG. 27 (to partly leave the third antiferromagnetic layer 33 on the central portion D of the free magnetic layer 28), the magnetic detection device shown in FIG. 5 can be fabricated.

Alternatively, the third antiferromagnetic layer 33 exposed through the interval 50a of the mask layers 50 may be completely removed to expose the nonmagnetic layer 32 through the interval 50a. At this point, the nonmagnetic layer 32 may be partly etched away. If milling is terminated when the nonmagnetic layer 32 has been exposed through the interval 50a during the milling step, a complete magnetic detection device, as shown in FIG. 4, is formed.

If milling is continued until the nonmagnetic layer 32 is completely removed, and the second antiferromagnetic layer 31 is removed down to the one-dot chain line L, a complete magnetic detection device as shown in FIG. 6, is formed.

In FIG. 27, the third antiferromagnetic layer 33 is trimmed in a direction perpendicular to the surface of the substrate 20, so that inner end portions 33a of the third antiferromagnetic layer 33 are formed perpendicular to the surface of the substrate 20 (along direction Z shown in the drawing). When milling is continued until the layer formed under the third antiferromagnetic layer 33 is reached, the inner end surfaces of the layers reached by milling are oriented perpendicularly to the surface of the substrate 20.

If inner end portions 50b of the mask layers 50 are formed, for example, with sloped or curved surfaces (as indicated by dotted lines M shown in FIG. 27) such that the interval 50a gradually increases from the bottom to the top, the inner end portions 33a of the third antiferromagnetic layer 33 will also be formed with, sloped or curved surfaces.

If the inner end portions 50b of the mask layers 50 are formed with sloped or curved surfaces, the width of interval 50a along the track width direction in which the mask layer 50 is removed decreases toward the bottom. This means that the track width Tw can be further made smaller than the width of the interval 50a of the mask layers 50, making it possible to fabricate a magnetic detection device that can accommodate still narrower tracks.

Milling can be stopped at any time as long as the antiferromagnetic layer on the central portion D of the free magnetic layer 28 is sufficiently thin to lose the antiferromagnetic properties and the free magnetic layer 28 is not affected by RIE or ion milling. If the free magnetic layer 28 is etched by methods such as ion milling, then milling will damage layer 28 as occurs in the prior art, and degrade its magnetic characteristics.

In the embodiment shown in FIG. 19, the magnetic layer 41 may be completely removed and the nonmagnetic intermediate layer 40 may be partly removed. When the free magnetic layer 28 according to the embodiment shown in FIG. 18 is used, the backed layer 46 may be partly removed.

After completing the RIE or ion milling step, the second annealing in a magnetic field is carried out. In this case, the magnetic field is oriented along the track width direction (direction X in the drawing). In the second annealing in a magnetic field, a second application magnetic field is set smaller than the exchange anisotropic magnetic field of the first antiferromagnetic layer 22. The heat treatment temperature is set lower than the blocking temperature of the first antiferromagnetic layer 22.

Preferably, the magnitude of the second magnetic field is set greater than the saturation magnetic field of the free magnetic layer 28 and the diamagnetic field of the free magnetic layer 28. Under these conditions, the exchange anisotropic magnetic field of both end portions C of the second antiferromagnetic layer 31 can be oriented along the track width direction (direction X in the drawing) while maintaining the direction of the exchange anisotropic magnetic field of the first antiferromagnetic layer 22 along the height direction (direction Y in the drawing). The second heat treatment temperature may be set to, for example, about 250° C., and the magnitude of the magnetic field may be set to about 24 k (A/m).

The two end portions C of the second antiferromagnetic layer 31 exhibit antiferromagnetic properties due to the antiferromagnetic interaction that takes place between the two end portions C of the second antiferromagnetic layer 31 and the third antiferromagnetic layers 33 deposited thereon. Hence, both end portions C of the second antiferromagnetic layer 31 effect order transformation by second annealing in a magnetic field, which produces an exchange coupling magnetic field between the two end portions C of the second antiferromagnetic layer 31 and the two end portions C of the free magnetic layer 28. This pins the magnetization of both end portions C of the free magnetic layer 28 along the track width direction (direction X in the drawing).

On the other hand, only an antiferromagnetic layer that is too thin to exhibit antiferromagnetic properties is left on the central portion D of the free magnetic layer 28. Hence, the central portion D of the second antiferromagnetic layer 31 deposited on the central portion D of the free magnetic layer 28 does not effect order transformation even when subjected to a second annealing in a magnetic, field. As a result, no or very little exchange coupling magnetic field is generated between the central portion D of the second antiferromagnetic layer 31 and the central portion D of the free magnetic layer 28. Hence, the magnetization of the central portion D of the free magnetic layer 28 is not fixed along the track width direction as firmly as the magnetization of both end portions C thereof.

The central portion D of the free magnetic layer 28 is formed into a single domain magnetized sufficiently weak to permit inverted magnetization in response to an external magnetic field.

Thus, the present invention permits effective control of the magnetization of the free magnetic layer 28, making it possible to fabricate magnetic detection devices featuring high reproduction sensitivity even with tracks narrower than those in conventional magnetic detection devices.

In the second annealing in a magnetic field, it is believed that the noble metal element, such as Ru, used for the nonmagnetic layer 32 diffuses into the second antiferromagnetic layer 31 and the third antiferromagnetic layer 33. Therefore, the elements constituting the second antiferromagnetic layer 31 and the third antiferromagnetic layer 33 after heat treatment include an element constituting the antiferromagnetic layers and a noble metal element. The noble metal element that diffused into the second antiferromagnetic layer 31 and the third antiferromagnetic layers 33 is more likely to exist more near the top of the second antiferromagnetic layer 31 than near the bottom of the second antiferromagnetic layer 31. The diffused metal element is also more likely to exist near the bottom of the third antiferromagnetic layer 33 than near the top of the third antiferromagnetic layer 33. The composition ratio of the diffused noble metal element is believed to gradually decrease from the top to the bottom of the second antiferromagnetic layer 31 and from the bottom to the top of the third antiferromagnetic layer 33. This change in composition can be verified by an instrument such as a SIMS analyzer.

The second annealing in a magnetic field may alternatively be carried out after the step used in FIG. 26, that is, after the third antiferromagnetic layer 33 and the intermediate layer 35 are deposited on the nonmagnetic layer 32. In that case, the second antiferromagnetic layer 31 has antiferromagnetic properties because of the deposited third antiferromagnetic layer 33, and the second antiferromagnetic layer 31 effects order transformation by the second annealing in a magnetic field. Hence, a large exchange coupling magnetic field is produced between the second antiferromagnetic layer 31 and the free magnetic layer 28, making it easy to pin the magnetization of the entire free magnetic layer 28 along the track width direction. It is possible, however, to weaken the exchange coupling magnetic field generated between the free magnetic layer 28 and the antiferromagnetic layer deposited on the central portion D of the free magnetic layer 28 by etching away the central portion D of the third antiferromagnetic layer 33 or the third antiferromagnetic layer 33, and the central portion D of the second antiferromagnetic layer 31 in the step used in FIG. 27. Thus, the magnetization of the central portion D of the free magnetic layer 28 may be weakened to a level that permits easy inversion of magnetization.

Figure 28:
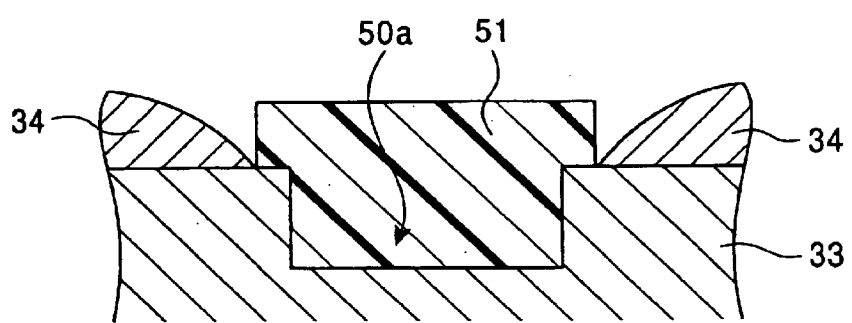
FIG. 28 is an electrode layer prepared according to a process of the invention.

FIG. 28 is a partial enlarged sectional view showing an electrode layer 34 observed from a surface opposing a recording medium.

If the mask layers 50 shown in FIG. 27 are made of a material, such as a resist, which cannot serve as an electrode layer, then the electrode layer 34 has to be deposited on the third antiferromagnetic layer 33 after removing the mask layers 50.

In FIG. 28, a resist layer 51 is deposited to fill interval 50a between the third antiferromagnetic layers 33 and cover part of the top surface of the third antiferromagnetic layers 33. Alternatively, the resist layer 51 may be provided only in interval 50a. Subsequently, the electrode layers 34 are deposited on portions of the third antiferromagnetic layers 33 that are not covered by the resist layer 51, after which the resist layer 51 is removed. This completes the deposition of the electrode layers 34 on the third antiferromagnetic layers 33.

The manufacturing methods for the CIP type magnetic detection devices shown in FIG. 4 through FIG. 6 have been described. The manufacturing methods for the CPP type magnetic detection devices shown in FIG. 11 and FIG. 12 will now be described in detailed, focusing on the aspects different from those of the manufacturing methods for the magnetic detection devices shown in FIGS. 4 through 6.

Following the step illustrated in FIG. 25, the first insulating layers 70 are successively deposited by sputtering on the third antiferromagnetic layers 33 in the step used in FIG. 26.

Figure 29:
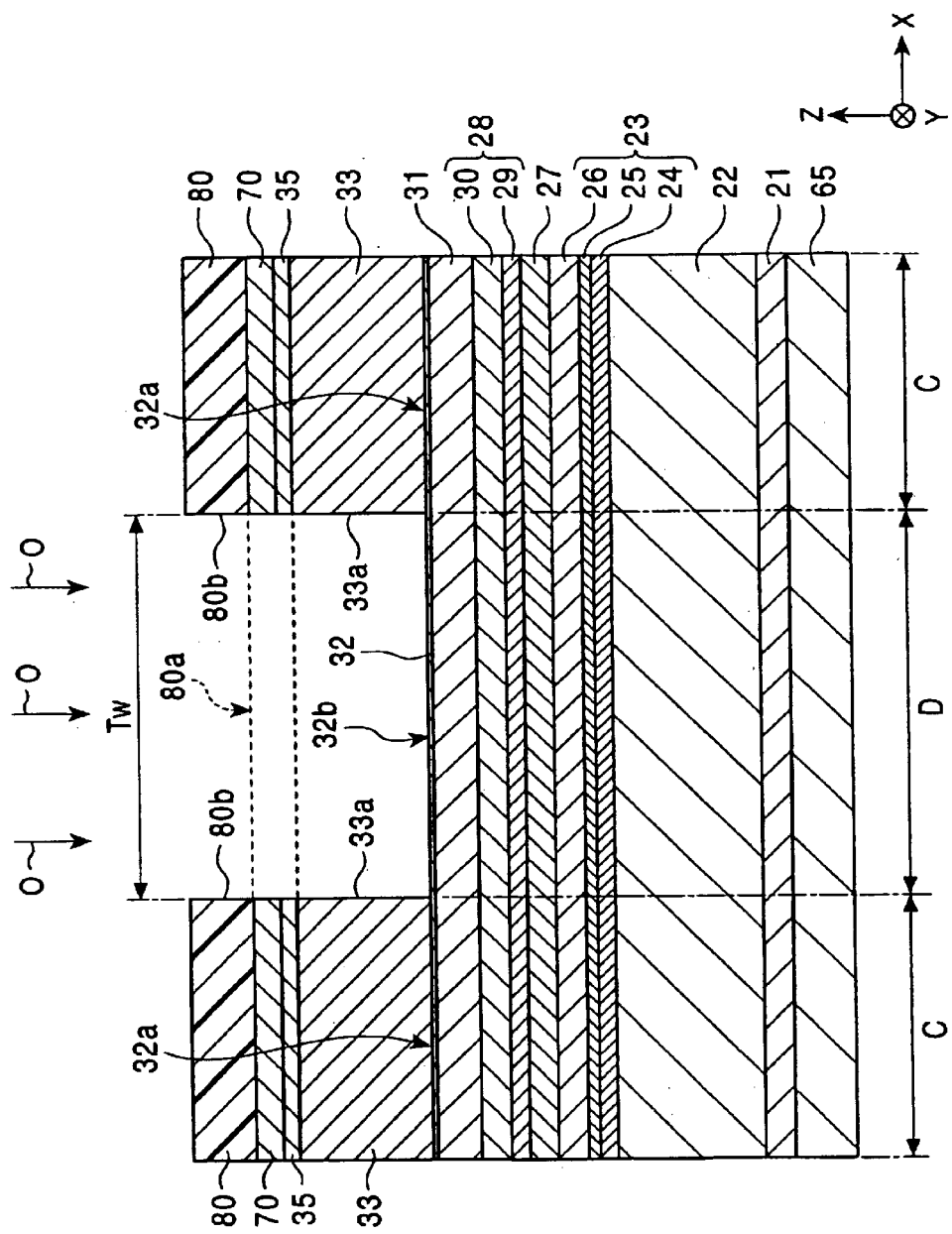
FIG. 29 is a magnetic detection device according to the embodiment shown in FIG. 10 prepared according to a manufacturing process step of the invention.

As shown in FIG. 29, a resist layer 80 is deposited on the first insulating layer 70, an opening 80a being formed in the central portion of the track width direction (direction X in the drawing) by exposure.

By ion milling in the directions indicated by arrows O in FIG. 29, portions of the first insulating layer 70 and the third antiferromagnetic layer 33 that are-not covered by the resist layer 80 are etched away (the portions removed are indicated by dotted lines in FIG. 29). The depths to which the layers are etched away define the individual embodiments shown in FIG. 10 through FIG. 12.

Alternatively, the first insulating layers 70 may be deposited on the two end portions C of the third antiferromagnetic layers 33. The central portion D of the third antiferromagnetic layer 33 that is not covered by the first insulating layer 70 may be etched away using the first insulating layer 70 as the mask.

The inner end surfaces 80b of the resist layer 80 shown in FIG. 29 lie vertically. If the inner end surfaces 80b have sloped or curved surfaces, or if an ion beam forms an angle with respect to the surface of the substrate, both end portions 33a of the third antiferromagnetic layers 33 will have sloped or curved surfaces from ion milling. The resist layer 80 is then removed after ion milling.

Figure 30:
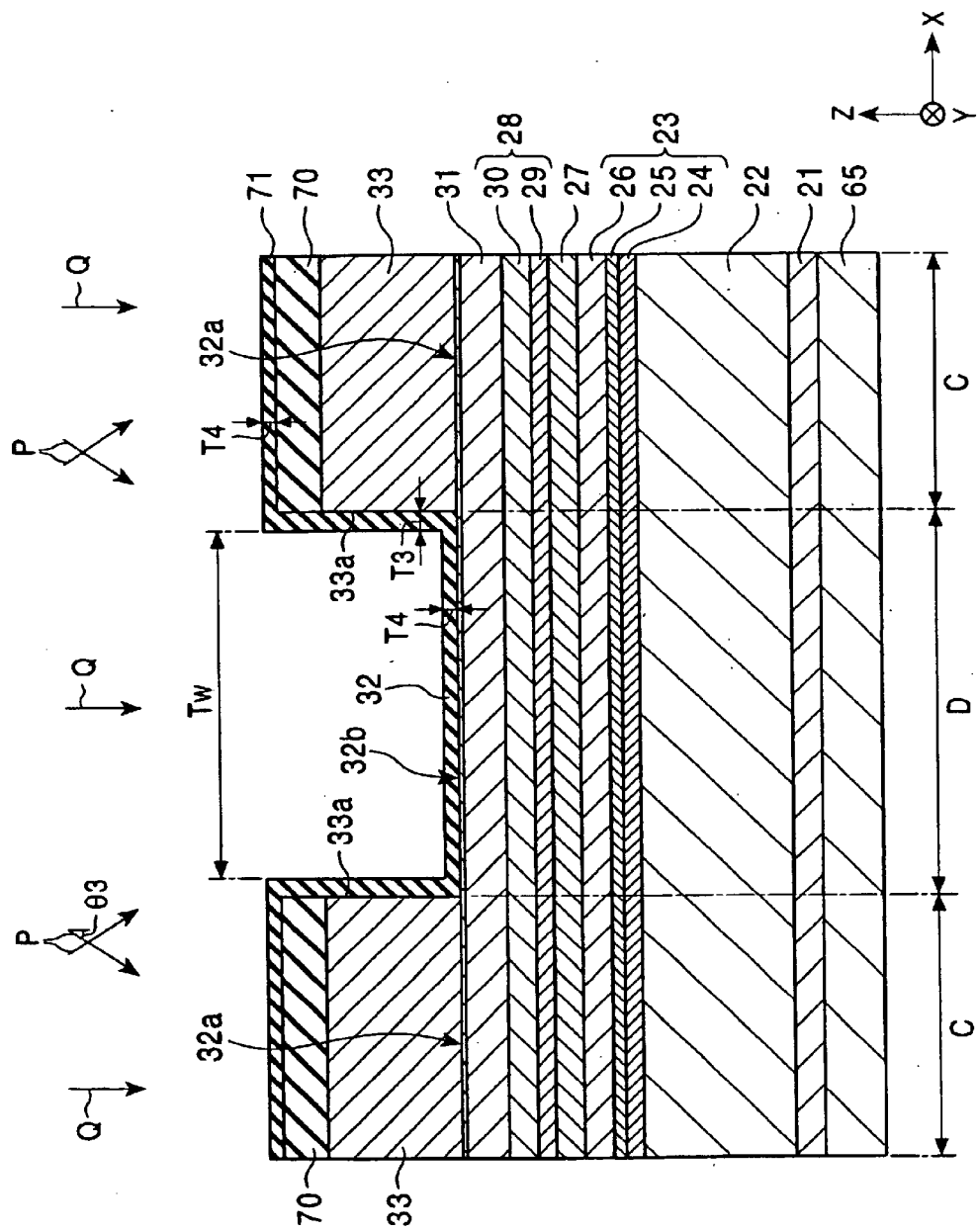
FIG. 30 is a magnetic detection device according to the embodiment shown in FIG. 10 prepared according to a step implemented after the step in FIG. 29.

In the step used in FIG. 30, a second insulating layer 71 formed of an insulating material, such as $Al_2O_3$, $SiO_2$, AlN, Al—Si—O—N, Al—Si—O, $Ti_2O_3$, or $Ti_3O_5$ is deposited by sputtering on the first insulating layers 70, the third antiferromagnetic layers 33, the inner end portions of the first insulating layers, and the central portion D of the magnetic detection device. The sputtering method used can be ion beam sputtering, long slow sputtering, or collimation sputtering.

Attention should be paid to the sputtering angle $\theta_3$ (the tilt with respect to the direction Z in the drawing) for depositing the second insulating layer 71. As shown in FIG. 30, the sputtering directions P have sputtering angles $\theta_3$ with respect to the direction perpendicular to the multilayer laminate layers. In the present invention, the sputtering angles $\theta_3$ are preferably chosen to be as large as possible to make it easy to deposit the second insulating layer 71 on the inner end portions 33a of the third antiferromagnetic layers 33. The sputtering angles $\theta_3$ range, for example, from about 50 degrees to about 70 degrees.

Thus, setting the sputtering angles $\theta_3$ to large values makes it possible to adjust the thickness T3 to values greater than the thickness T4, where T3 denotes the thickness along the track width direction (direction X in the drawing) of the second insulating layer 71 deposited on the inner end portions 33a of the third antiferromagnetic layers 33. T4 denotes the thickness of the second insulating layer 71 deposited on the upper surface of the magnetic detection device and the first insulating layer 70. If the thickness of the second insulating layer 71 is not adjusted, the second insulating layer 71 deposited on the inner end portions 33a of the third antiferromagnetic layers 33 will be completely removed by ion milling in the following step. However, even if the second insulating layer 71 is left behind, it will be too thin to function as an insulating layer for effectively reducing shunt loss.

Subsequently, as shown in FIG. 30, ion milling Q is carried out in a direction perpendicular to the surfaces of the layers making up the multilayer laminate (the direction parallel to direction Z in the drawing) or at an angle close to vertical direction (about zero to 20 degrees with respect to the direction perpendicular to the surfaces of the layers of the multilayer laminate). At this point, ion milling is continued until the second insulating layer 71 deposited on the central portion D of the magnetic detection device is removed. The second insulating layer 71 deposited on an upper surface 33b of the third antiferromagnetic layer 33 is also removed by ion milling. The portion of the second insulating layer 71 deposited on the inner end portions 33a of the third antiferromagnetic layers 33 is also slightly etched away. However, this portion has thickness T3, which is larger than the portion deposited on the central portion D of the magnetic detection device. The milling directions Q of the ion milling are at an angle as observed from the portion of the second insulating layer 71 deposited on the inner end portions 33a of the third antiferromagnetic layers 33. Thus, the portion of the second insulating layer 71 formed on the inner end portions 33a of the third antiferromagnetic layers 33 is less likely to be etched away compared to the portion of the second insulating layer 71 formed on the central portion D of the magnetic detection device. A second insulating layer 71 with an appropriate thickness is left behind on the inner end portions 33a of the third antiferromagnetic layers 33.

Preferably, the thickness T3 along the track width direction of the portion of the second insulating layer 71 deposited on the inner end portions 33a of the third antiferromagnetic layers 33 ranges about 5 nm to about 10 nm.

Figure 31:
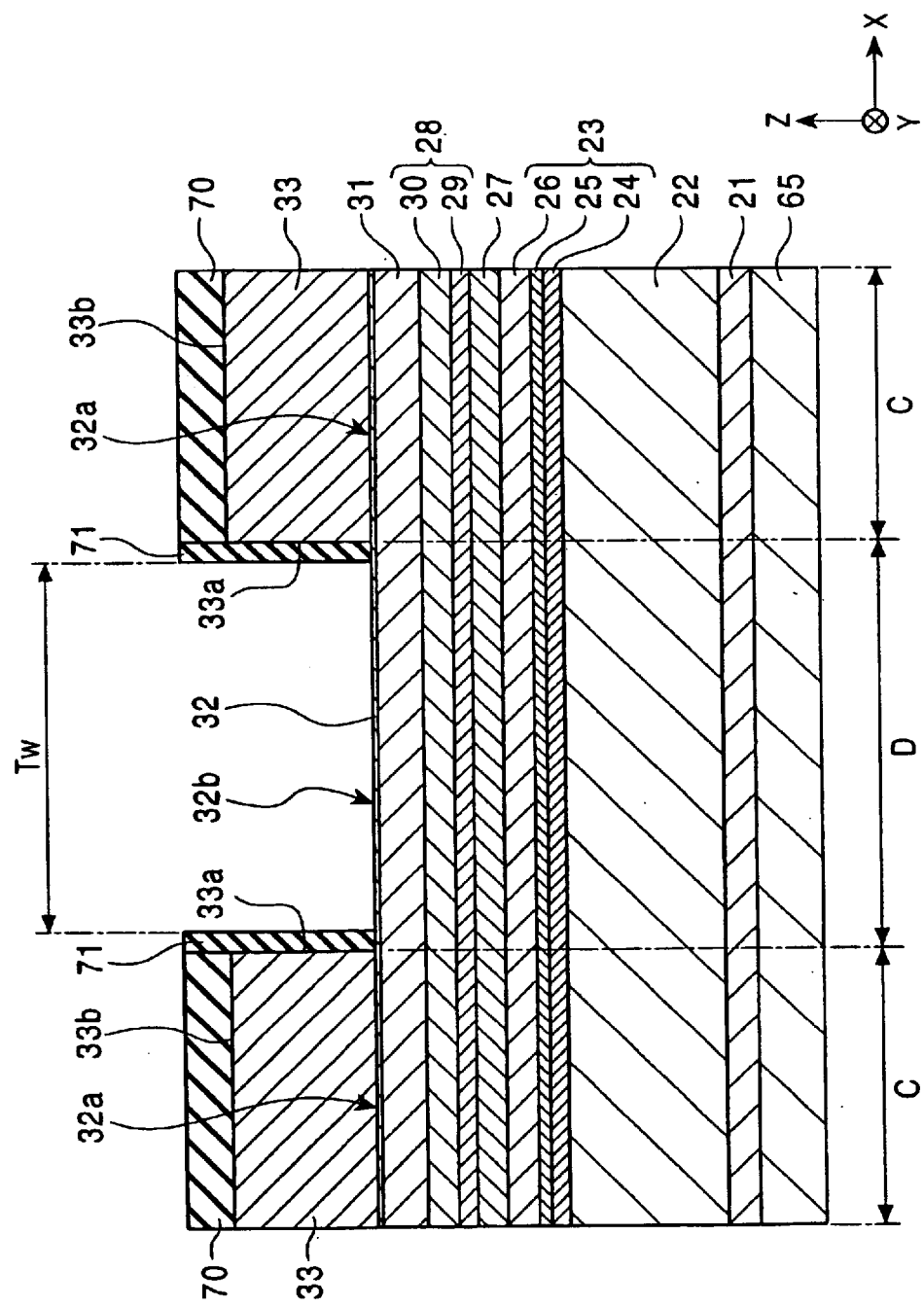
FIG. 31 is a magnetic detection device according to the embodiment shown in FIG. 10 prepared according to a step implemented after the step shown in FIG. 30.

In FIG. 31, the upper surfaces 33b of the third antiferromagnetic layers 33 are covered by the first insulating layers 70. The inner end portions 33a of the third antiferromagnetic layers 33 are covered by the second insulating layers 71. If necessary, after the nonmagnetic layer 69 shown in FIG. 10 is deposited on the insulating layers 70 and 71 and the central portion D of the magnetic detection device, plating is performed to form the upper shielding layer 68, which also functions as an upper electrode.

In the magnetic detection device fabricated as described above, the upper surfaces 33b and the inner end portions 33a of the third antiferromagnetic layers 33 can be covered by the insulating layers 70 and 71. It is therefore possible to fabricate a CPP type magnetic detection device capable of properly preventing shunt loss of current that passes through the shielding layer.

The following describes the process of forming the projecting portion 65a on the lower shielding layer 65 and the insulating layer 78 which is provided between both end portions 65b of the lower shielding layer 65 and the seed layer 21 in magnetic detection devices shown in FIG. 13 and FIG. 14.

First, the lower shielding layer 65 is formed by plating or sputtering and its surface smoothened by polishing. Then, a resist layer is deposited on the central portion in the track width direction (direction X in the drawing) of the lower shielding layer 65. Both end portions 65b of the lower shielding layer 65 not covered by the resist layer are partly etched away by ion milling. Thus, the projecting portion 65a can be formed on the central portion along the track width direction of the lower shielding layer 65.

Subsequently, the insulating layers 78 are deposited by sputtering on the two end portions 65b of the lower shielding layer 65 that are not covered by the resist layer. Deposition by sputtering is stopped the moment the upper surfaces of the insulating layers 78 are substantially flush with an upper surface 65a1 of the projecting portion 65a of the lower shielding layer 65. The resist layer is then removed. After removing the resist layer, the upper surface 65a1 of the projecting portion 65a of the lower shielding layer 65 and the upper surfaces of the insulating layers 78 may be polished using CMP, for example, to make the upper surface 65a1 of the projecting portion 65a flush with the upper surfaces of the insulating layers 78 accurately. In this case, the first polishing step is unnecessary.

The descriptions have been given of the manufacturing methods for the magnetic detection devices according to the individual embodiments. In accordance with the present invention, a thin second antiferromagnetic layer 31 is formed so that it does not exhibit antiferromagnetic properties by itself. The third antiferromagnetic layers 33 are deposited thereon to provide an appropriate thickness for properly imparting the antiferromagnetic properties. A suitable thickness ranges from about 20 angstroms to about 50 angstroms, preferably from about 30 angstroms to about 40 angstroms.

A thin nonmagnetic layer 32 is formed from a material such as Ru, which is resistant to oxidation caused by exposure to the atmosphere. The nonmagnetic layer 32 is formed to have a thickness in the range of about 3 angstroms to about 10 angstroms. This allows the use of low-energy ion milling for etching away the nonmagnetic layer 32, making it easier to stop ion milling in the middle of the nonmagnetic layer 32. Even if the nonmagnetic layer 32 is completely removed, ion milling can be easily controlled so it does not etch the second antiferromagnetic layer 31 formed under the nonmagnetic layer 32. This minimizes damage to the second antiferromagnetic layer 31 due to the milling.

Making the nonmagnetic layer 32 thinner by ion milling allows antiferromagnetic interaction to take place between the two end portions C of the second antiferromagnetic layer 31 and the third antiferromagnetic layers 33 deposited thereon through the nonmagnetic layer 32. This enables the two end portions C of the second antiferromagnetic layer 31 and the third antiferromagnetic layers 33 to function as an integrated antiferromagnetic layer. Thus, according to the present invention, antiferromagnetic properties can be imparted only to the two end portions C of the second antiferromagnetic layer 31. Thus, the two end portions C of the second antiferromagnetic layer 31 is able to effect order transformation by annealing in a magnetic field, and an exchange coupling magnetic field is generated between the two end portions C of the second antiferromagnetic layer 31 and the two end portions C of the free magnetic layer 28.

Because, only a thin second antiferromagnetic layer 31 exhibiting no antiferromagnetic properties is deposited on the central portion D of the free magnetic layer 28, it is difficult for the central portion D of the second antiferromagnetic layer 31 to effect order transformation by annealing in a magnetic field. Thus, no or very little exchange coupling magnetic field is generated between the central portion D of the second antiferromagnetic layer 31 and the central portion D of the free magnetic layer 28. As a result, the central portion D of the free magnetic layer 28 is formed into a single domain, which is magnetized sufficiently weakly to permit inverted magnetization in response to an external magnetic field.

The presence of a thin nonmagnetic layer 32 formed from a material such as Ru permits the use of low-energy ion milling. Moreover, the multilayer structure of the second antiferromagnetic layer 31 (which does not exhibit antiferromagnetic properties by itself), and the third antiferromagnetic layers 33 deposited on the two end portions C of the second antiferromagnetic layer 31 makes it possible to effectively control the magnetization of the free magnetic layer 28. The present invention, therefore, permits the fabrication of magnetic detection devices capable of successfully accommodating tracks narrower than those in conventional magnetic detection devices.

To fabricate a magnetic head by using the CIP type magnetic detection device discussed above, a base layer formed from an insulating material such as alumina, a lower shielding layer deposited on the base layer and composed of a magnetic alloy, and a lower gap layer deposited on the lower shielding layer and composed of an insulating material are formed between the substrate 20 and the seed layer 21. The magnetic detection device is deposited on the lower gap layer. An upper gap layer made of an insulating material and an upper shielding layer deposited on the upper gap layer and formed from a magnetic alloy are deposited on the magnetic detection device. A write inductive element may be deposited on the upper shielding layer.

The magnetic detection device according to the present invention may also be used with a component such as a magnetic head incorporated in a hard disk unit or a magnetic sensor.

Figure 32:
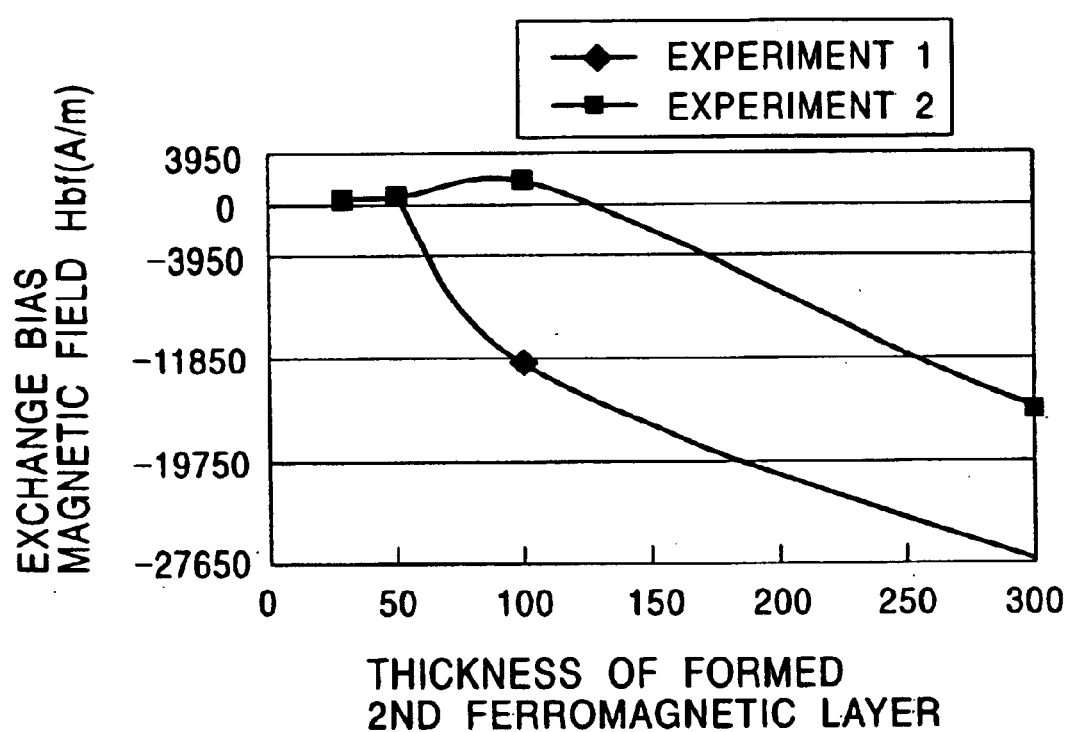
FIG. 32 is a graph showing the relationship between the thickness of a second antiferromagnetic layer (film forming stage) and the exchange bias magnetic field applied to a free magnetic layer when a Ta film is used for a nonmagnetic layer.

FIG. 32 is a graph showing the results of Experiment 1 and Experiment 2. In Experiment 1, a second antiferromagnetic layer made of PtMn alloy and a nonmagnetic layer made of Ta were deposited on a free magnetic layer made of CoFe alloy. An exchange bias magnetic field (Hbf) applied to the free magnetic layer at this point was measured.

In Experiment 2, the nonmagnetic layer was completely removed by ion milling. The surface of the second antiferromagnetic layer was also partly etched away. A third antiferromagnetic layer formed from a PtMn alloy was then deposited on a second antiferromagnetic layer such that the total thickness of the third antiferromagnetic layer and the remaining second antiferromagnetic layer is about 300 angstroms. At this point, the exchange bias magnetic field (Hbf) applied to the free magnetic layer was measured.

The exchange bias magnetic field (Hbf) in this case refers to all magnetic fields applied to the free magnetic layer, including the exchange coupling magnetic field generated between the free magnetic layer and the second antiferromagnetic layer. The term also refers to the static magnetic field between the free magnetic layer and a pinned magnetic layer.

The multilayers used for the experiments include the layers listed below, the layers being deposited in this order from the bottom. The values in the parentheses indicate layer thicknesses in angstroms.

Substrate/Base layer: Ta (32)/Seed layer: $(Ni_{0.8}Fe_{0.2})_{77at\%}Cr_{23at\%}$(30)/First antiferromagnetic layer $Pt_{50at\%}Mn_{50at\%}$(160)/Fixed magnetic layer: $[Co_{90at\%}Fe_{10at\%}(18)/Ru(8.7)/Co_{90at\%}Fe_{10at\%}(22)]$/Nonmagnetic material layer: Cu(21)/Free magnetic layer: $[Co_{90at\%}Fe_{10at\%}(8)/Ni_{80at\%}Fe_{20at\%}(24)]$/Second antiferromagnetic layer: $Pt_{50at\%}Mn_{50at\%}$(X)/Nonmagnetic layer: Ta(15). The values in the parentheses indicate layer thicknesses in angstroms.

In the experiments, measurements were made using different thicknesses of the second antiferromagnetic layer upon completion of its deposition. The samples of the second antiferromagnetic layers with different thicknesses were subjected to a first annealing in a magnetic field.

During annealing in a magnetic field, the samples were subjected to heat treatment at about 300° C. for about 4 hours while a magnetic field of about 790 (kA/m) is being applied to the samples along the height direction.

The magnitude of the exchange bias magnetic field (Hbf) applied to the free magnetic layer was measured. The measurement results are shown in the curve labeled "Experiment 1" in FIG. 32.

As shown in FIG. 32, the exchange bias magnetic field (Hbf) assumes a value close to about 0 (A/m) when the thickness of the second antiferromagnetic layer is about 50 angstroms or less.

The experimental results indicate that if the thickness of the second antiferromagnetic layer is about 50 angstroms or less, hardly any exchange coupling magnetic field is produced between the free magnetic layer and the second antiferromagnetic layer. Thus, the magnetization of the free magnetic layer is not pinned by annealing in a magnetic field.

As the second antiferromagnetic layer becomes thicker than about 50 angstroms, the absolute value of the exchange bias magnetic field (Hbf) increases. This means that an increasing exchange coupling magnetic field is generated between the free magnetic layer and the second antiferromagnetic layer.

In the subsequent step in the experiment, the nonmagnetic layer made of a Ta film(the uppermost layer in the above multilayer), is removed by ion milling. The Ta film has grown thicker than it was when it was initially formed because of oxidation due to the exposure to the atmosphere. For this reason, a Ta film cannot be successfully removed unless high-energy ion milling is performed.

In the experiment, when the Ta film was removed by the ion milling, the second antiferromagnetic layer exposed after the removal of the Ta film was also partly etched because it is extremely difficult to control high-energy ion milling. Thereafter, a third antiferromagnetic layer was deposited on the second antiferromagnetic layer. At this time the thickness of the third antiferromagnetic layer was adjusted so that the total thickness of the remaining second antiferromagnetic layer and the third antiferromagnetic layer was about 300 angstroms.

Subsequently, a second annealing in a magnetic field was carried out. The sample was subjected to heat treatment at about 290° C. for about 4 hours while a magnetic field of about 10 (kA/m) is being applied to it along the height direction during the second annealing in a magnetic field. The exchange bias magnetic field (Hbf) applied to the free magnetic layer was then measured. The experimental results are shown in the curve labeled "Experiment 2" in FIG. 32.

In FIG. 32, the exchange bias magnetic field in Experiment 2 assumes a value close to about zero (A/m) even when the thickness of the second antiferromagnetic layer upon completion of its deposition is about 100 angstroms. Comparison of the exchange bias magnetic fields in Experiments 1 and 2 indicates that the absolute values of the exchange bias magnetic fields in Experiment 2 are smaller than those in Experiment 1.

From the experimental results, it can be seen that if the second antiferromagnetic layer is partly etched by high-energy ion milling, as in the sample used for Experiment 2, the second antiferromagnetic layer is damaged-due to the ion milling. This frequently degrades the magnetic characteristics of the second antiferromagnetic layer. Hence, when the third antiferromagnetic layer is deposited on the second antiferromagnetic layer, it is difficult for these two antiferromagnetic layers to act as a one-piece antiferromagnetic layer. Therefore, the second antiferromagnetic layer does not develop adequate antiferromagnetic properties.

Another possibility is that the Ta element used for the nonmagnetic layer diffuses into the second antiferromagnetic layer during the formation of the layer due to the effect of annealing in a magnetic field. The diffusion of Ta degrades the antiferromagnetic properties of the second antiferromagnetic layer.

When the thickness of the second antiferromagnetic layer upon completion of its deposition is about 100 angstroms (refer to FIG. 32), the exchange bias magnetic field measured (after the layers up to the nonmagnetic layer are deposited and the first annealing in a magnetic field is carried out) is about 12 k (A/m) in terms of absolute value in Experiment 1. Thus, a considerable exchange coupling magnetic field is believed to be generated between the second antiferromagnetic layer and the free magnetic layer.

However, the exchange bias magnetic field measured in Experiment 2 is smaller in terms of absolute value than that measured in Experiment 1. In Experiment 2, the exchange bias magnetic field is measured after the nonmagnetic layer and a part of the second antiferromagnetic layer are removed, the third antiferromagnetic layer is added, and the second annealing in a magnetic field is carried out.

Theoretically, the exchange bias magnetic fields in Experiment 2 should indicate larger absolute values than those in Experiment 1 since the thickness of the antiferromagnetic layer is larger in Experiment 2 than in Experiment 1. In Experiment 2, however, the exchange bias magnetic field suddenly decreased in terms of absolute value probably because the magnetic characteristics of the second antiferromagnetic layer is degraded due to damage caused by ion milling. The antiferromagnetic properties of the second antiferromagnetic layer are also degraded due to the diffusion of Ta.

Thus, it is concluded that the use of Ta film for the nonmagnetic layer contributes to the damage to the second antiferromagnetic layer caused by ion milling. The diffusion of Ta may also cause a smaller exchange bias magnetic field even when the third antiferromagnetic layer is added, preventing satisfactory control of the magnetization of the free magnetic layer.

Subsequently, a plurality of samples were prepared that used Ru for their nonmagnetic layers and have free magnetic layers of different thicknesses and second antiferromagnetic layers of different thicknesses. Then, measurement was carried out to determine the relationship between the duration of ion milling performed on the nonmagnetic layers and the exchange bias magnetic fields (Hbf) applied to the free magnetic layers.

The multilayer samples used for the experiment include the layers listed below, the layers being deposited in this order from the bottom. The values in the parentheses indicate layer thickness in angstroms.

Substrate/Seed layer: $(Ni_{0.8}Fe_{0.2})_{60at\%}Cr_{40at\%}(60)$/First antiferromagnetic layer $Pt_{50at\%}Mn_{50at\%}(120)$/Fixed magnetic layer: $[Co_{90at\%}Fe_{10at\%}(14)/Ru(8.7)/Co_{90at\%}Fe_{10at\%}(20)]$/Nonmagnetic material layer: Cu(21)/Free magnetic layer: $[Co_{90at\%}Fe_{10at\%}(16)/Ni_{80at\%}Fe_{20at\%}(18)]$/Second antiferromagnetic layer: $Pt_{50at\%}Mn_{50at\%}(Y)$/Nonmagnetic layer: Ru(8). The values in the parentheses indicate layer thicknesses in angstroms.

Two different samples were prepared. The thicknesses of the second antiferromagnetic layers when formed are about 30 angstroms and about 40 angstroms.

First, the samples having the above construction were subjected to a first annealing in a magnetic field, specifically, heat treatment at about 290° C. for about 4 hours while being subjected to a magnetic field of about 790 (kA/m) along the height direction.

Then, the nonmagnetic layers were etched away by ion milling. In the experiment, the ion milling time was set to a range of between about 10 seconds to about 50 seconds.

Thereafter, a third antiferromagnetic layer was deposited on the nonmagnetic layer formed from Ru, as described above. At this point, the thickness of the third antiferromagnetic layer was adjusted so the total thickness of the second antiferromagnetic layer and the third antiferromagnetic layer is about 300 angstroms. Then, an approximately 30-angstrom protective layer made of Ta is provided on the third antiferromagnetic layer.

Subsequently, the multilayer laminate was magnetized at about 790 (kA/m), then subjected to heat treatment at about 290° C. for about 4 hours while a magnetic field of about 24 (kA/m) was being applied thereto along the height direction during annealing in a magnetic field.

Then, the exchange bias magnetic field (Hbf) applied to the free magnetic layer was measured. The results of the experiment are shown in FIG. 33.

Figure 33:
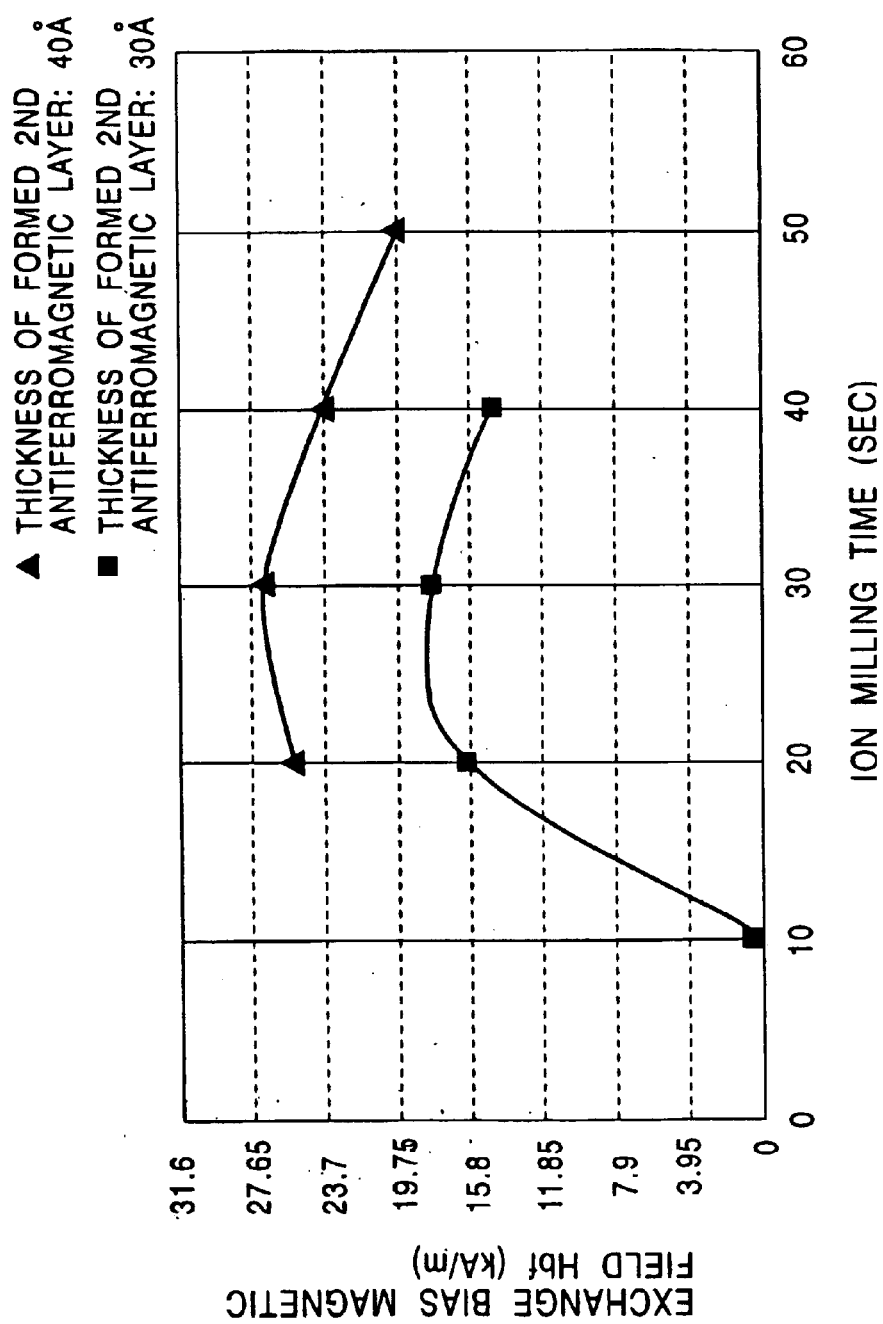
FIG. 33 is a graph showing the relationship between the time of ion milling to the nonmagnetic layer and the exchange bias magnetic field when Ru is used for the nonmagnetic layer.

From FIG. 33, it can be seen that when the thickness of the second antiferromagnetic layer is about 40 angstroms, the exchange bias magnetic field reaches its maximum when the duration of ion milling for the nonmagnetic layer made of Ru is set to about 30 seconds.

It has also been found that maximum exchange bias magnetic field is obtained when the duration of ion milling is set to 30 seconds and when the second antiferromagnetic layer is formed to have a thickness of about 30 angstroms.

Referring to FIG. 33, when the thickness of the second antiferromagnetic layer upon completion of its formation is about 30 angstroms, the exchange bias magnetic field is smaller than when the second antiferromagnetic layer upon completion of its formation is about 40 angstroms. This is believed to be due to the following reasons. Because the second antiferromagnetic layer is thinner, the ordering of the antiferromagnetic layer by annealing in a magnetic field weakens even after the third antiferromagnetic layer is deposited on the second antiferromagnetic layer. Thus, the exchange coupling magnetic field generated between the second antiferromagnetic layer and the free magnetic layer decreases. However, even when the thickness of the second antiferromagnetic layer is about 30 angstroms, it is believed that the magnetization of the free magnetic layer can be adequately controlled by setting the duration of ion milling to about 20 seconds or more.

The exchange bias magnetic field reaches its maximum when the duration of ion milling is about 30 seconds probably because the nonmagnetic layer made of Ru is almost completely removed at that point. In other words, it is believed that the nonmagnetic layer made of Ru is more likely to remain on the second antiferromagnetic layer when the duration of ion milling is shorter than about 30 seconds, so the antiferromagnetic interaction between the second antiferromagnetic layer and the third antiferromagnetic layer weakens. Ordering of the second antiferromagnetic layer remains inadequate even after annealing in a magnetic field, leading to a smaller exchange coupling magnetic field between the second antiferromagnetic layer and the free magnetic layer.

On the other hand, if the ion milling is continued for more than about 30 seconds, the nonmagnetic layer formed from Ru is thoroughly removed and the second antiferromagnetic layer is also partly etched. Thus, the magnetic characteristics of the second antiferromagnetic layer is degraded due to the damage caused by ion milling. This would likely result in a weakened exchange bias magnetic field.

The experimental results shown in FIG. 33 have proved that the exchange bias magnetic field applied to the free magnetic layer can be increased by setting the duration of ion milling to between about 20 seconds to about 40 seconds when the nonmagnetic layer made of Ru is about 8 angstroms.

Next, in the present invention, the longitudinal bias magnetic field applied to the free magnetic layer was measured at different milling angles at which the nonmagnetic layer made of Ru is subjected to ion milling.

The multilayer sample used for the experiment includes the layers listed below, the layers deposited in this order from the bottom. The values in the parentheses indicate thicknesses in angstroms.

Substrate/Seed layer: $(Ni_{0.8}Fe_{0.2})_{60at\%}Cr_{40at\%}(60)$/First antiferromagnetic layer $Pt_{50at\%}Mn_{50at\%}(120)$/Fixed magnetic layer: $[Co_{90at\%}Fe_{10at\%}(14)/Ru(8.7)/Co_{90at\%}Fe_{10at\%}(20)]$/Nonmagnetic material layer: $Cu(21)$/Free magnetic layer: $Co_{90at\%}Fe_{10at\%}(24)$/Second antiferromagnetic layer: $Pt_{50at\%}Mn_{50at\%}(30)$/Nonmagnetic layer: $Ru(8)$.

The sample having the above construction was subjected to a first annealing in a magnetic field, then ion milling was carried out on the nonmagnetic layer from Ru. Ion milling was performed at three different angles, namely, about 40°, about 50°, and about 60°, against the direction perpendicular to the surface of the substrate. The ion milling time was set to a range of about 20 seconds to about 50 seconds. Thereafter, the third antiferromagnetic layer was added and second annealing in a magnetic field was carried out under exactly the same conditions as those in the experiment whose results are shown in FIG. 33.

In this experiment, the exchange bias magnetic field applied to the free magnetic layer was determined using the above ion milling angles, the ion milling duration being set to about 20 seconds, about 30 seconds, about 40 seconds, and about 50 seconds, respectively. The experiment results are shown in FIG. 34.

Figure 34:
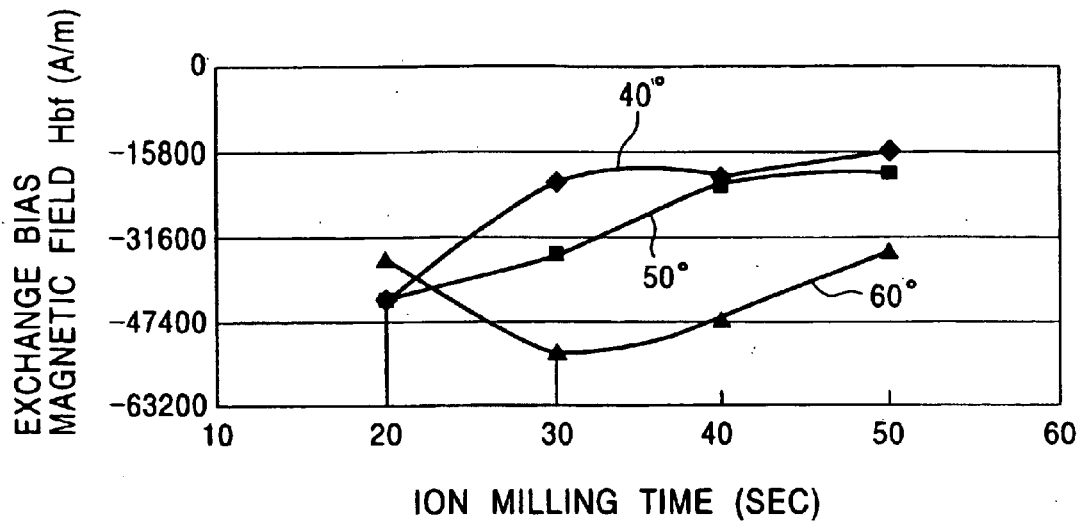
FIG. 34 is a graph showing the relationship between the angle of ion milling and the time of milling to the nonmagnetic layer and the exchange bias magnetic field when Ru is used for the nonmagnetic layer.
Figure 35:
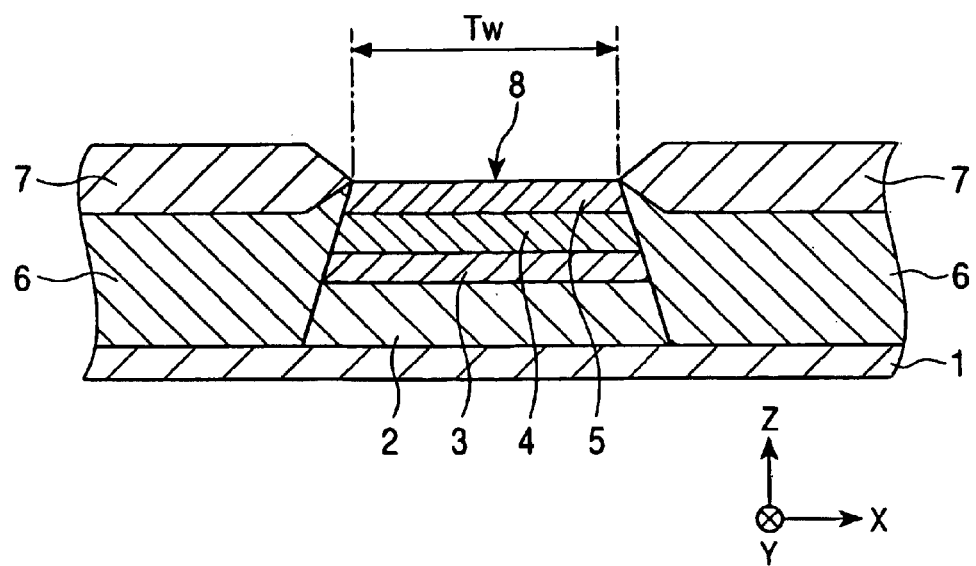
FIG. 35 is a partial sectional view of the structure of a conventional magnetic detection device observed from a surface opposing a recording medium.
Figure 36:
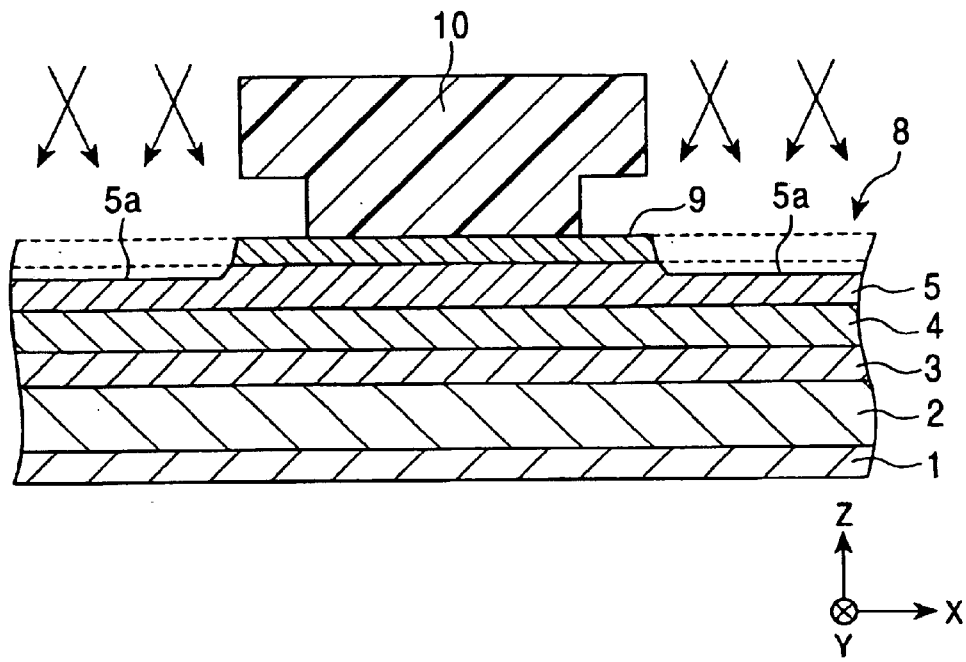
FIG. 36 is a conventional magnetic detection device.

As shown in FIG. 34, when the milling angle is about 40 degrees, the absolute value of the exchange bias magnetic field decreases when the milling duration is set to about 20 seconds or more. At an approximately 40-degree milling angle, the milling rate is faster than it is at about 50- or about 60-degree milling angle. Hence, milling for an excessively long time is likely to cause the second antiferromagnetic layer to be etched in addition to the nonmagnetic layer made of Ru. Thus, the magnetic characteristics of the second antiferromagnetic layer tends to deteriorate due to the damage caused by milling.

It is concluded that when the milling angle is about 40 degrees, prolonged milling time tends to degrade the exchange bias magnetic field, as compared to a case where the milling angle is set to about 50 or about 60 degrees.

It has been found that, when the milling angle is about 60 degrees, an exchange bias magnetic field having maximum absolute value can be obtained by setting the milling duration to about 30 seconds. It is understood that the absolute value of the exchange bias magnetic field gradually decreases as the milling time is set longer than about 30 seconds. This is considered to be due to the deterioration of the magnetic characteristics of the second antiferromagnetic layer caused by the damage from ion milling (which was performed to remove the nonmagnetic layer formed from Ru).

The experimental results shown in FIG. 34 proves that, even when the milling angle is set to a range of about 40 degrees to about 60 degrees, a large exchange bias magnetic field can be obtained by properly adjusting the milling duration. It is likely that a large exchange bias magnetic field is obtained also by properly adjusting the milling duration even when the milling angle is set to a range of about 30 degrees to about 70 degrees.

What is claimed is:

1. A magnetic detection device comprising:
   a multilayer film having a first antiferromagnetic layer, a pinned magnetic layer, a nonmagnetic material layer, and a free magnetic layer, arranged in this order from the bottom,
   wherein a second antiferromagnetic layer is provided on the free magnetic layer,
   a nonmagnetic layer is provided at least on a central portion of the second antiferromagnetic layer, and
   a pair of third antiferromagnetic layers is provided on the second antiferromagnetic layer, the pair of third antiferromagnetic layers being separated by a gap along a width direction.

2. The magnetic detection device according to claim 1, wherein the nonmagnetic layer lies also between the second antiferromagnetic layer and the pair of third antiferromagnetic layers.

3. The magnetic detection device according to claim 2, wherein a thickness of the nonmagnetic layer is greater at a central portion than at between the second antiferromagnetic layer and the pair of third antiferromagnetic layers.

4. The magnetic detection device according to claim 1, wherein a nonmagnetic layer of about 3 angstroms or less is provided between the pair of third antiferromagnetic layers and second antiferromagnetic layer.

5. The magnetic detection device according to claim 1, wherein the pair of third antiferromagnetic layers are directly formed on the second antiferromagnetic layer.

6. The magnetic detection device according to claim 1, wherein the thickness of the nonmagnetic layer deposited on the central portion of the second antiferromagnetic layer ranges from about 3 angstroms to about 10 angstroms.

7. The magnetic detection device according to claim 1, wherein the second antiferromagnetic layer exhibits non-antiferromagnetic properties at the central portion, and the second antiferromagnetic layer exhibit antiferromagnetic properties on both sides of the central portion.

8. The magnetic detection device according to claim 7, wherein a thickness of the second antiferromagnetic layer ranges from about 30 angstroms to about 40 angstroms.

9. The magnetic detection device according to claim 1, wherein a thickness of the second antiferromagnetic layer ranges from about 20 angstroms to about 50 angstroms.

10. The magnetic detection device according to claim 1, wherein the nonmagnetic layer is formed from at least one element selected from a group consisting of Ru, Re, Pd, Os, Ir, Pt, Au, and Rh.

11. The magnetic detection device according to claim 1, wherein the free magnetic layer is formed from three magnetic layers.

12. The magnetic detection device according to claim 11, wherein the free magnetic layer has a three-layer structure.

13. The magnetic detection device according to claim 12, wherein the free magnetic layer has a CoFe/NiFe/CoFe three-layer structure.

14. The magnetic detection device according to claim 1, wherein
   an electrode layer is provided on a third antiferromagnetic layer, and
   the electrode layer is oriented in a direction parallel to surfaces of layers making up the multilayer film.

15. The magnetic detection device according to claim 1, wherein
   upper electrode layers are provided on a central portion of the multilayer film and the pair of third antiferromagnetic layers,
   a lower electrode layer is provided under the multilayer film, and
   current passes in a direction perpendicular to surfaces of layers of the multilayer film.

16. The magnetic detection device according to claim 15, wherein the upper electrode layers are upper shielding layers formed from a magnetic material.

17. The magnetic detection device according to claim 16, wherein an insulating layer is provided between the pair of third antiferromagnetic layers and the upper electrode layers.

18. The magnetic detection device according to claim 16, wherein
   a first insulating layer is provided on an upper surface of each of the pair of third antiferromagnetic layers,
   a second insulating layer separate from the first insulating layer is provided on an inner end surface of each of the pair of third antiferromagnetic layers, and
   the first insulating layer and the second insulating layer lie between the pair of third antiferromagnetic layers and the upper electrode layers.

19. The magnetic detection device according to claim 16, wherein the upper surface of the protuberant portion is flush with upper surfaces of the insulating layer provided on both sides of the central portion of the lower electrode layer.

20. The magnetic detection device according to claim 15, wherein the lower electrode layer is a lower shielding layer formed from a magnetic material.

21. The magnetic detection device according to claim 16, wherein
   a protuberant portion projecting toward the multilayer film is provided at a center of the lower electrode layer, an upper surface of the protuberant portion being in contact with a bottom surface of the multilayer film, and
   an insulating layer is provided between both sides of the central portion of the lower electrode layer and of the multilayer film.

22. The magnetic detection device according to claim 1, wherein the nonmagnetic material layer is formed from a nonmagnetic electrically conductive material.

23. The magnetic detection device according to claim 1, wherein the nonmagnetic material layer is formed from an insulating material.

24. A magnetic detection device comprising:
   a multilayer film having a first antiferromagnetic layer, a pinned magnetic layer, a nonmagnetic material layer, and a free magnetic layer in this order from the bottom,
   wherein second antiferromagnetic layers are provided at least on both sides of a central portion of the free magnetic layer along a width direction,
   nonmagnetic layers are provided on the second antiferromagnetic layers, and
   a pair of third antiferromagnetic layers is provided on the nonmagnetic layers, the pair of third antiferromagnetic layers being separated by a gap along the width direction.

25. The magnetic detection device according to claim 24, wherein the second antiferromagnetic layer is provided on the central portion of the free magnetic layer.

26. The magnetic detection device according to claim 25, wherein the second antiferromagnetic layer provided on the central portion of the free magnetic layer exhibits non-antiferromagnetic properties while the second antiferromagnetic layer provided on both sides of the central portion exhibits antiferromagnetic properties.

27. The magnetic detection device according to claim 26, wherein the second antiferromagnetic layer provided on the central portion of the free magnetic layer has non-antiferromagnetic properties while the second antiferromagnetic layer provided on both sides of the central portion has antiferromagnetic properties.

28. The magnetic detection device according to claim 27, wherein
a third antiferromagnetic layer is formed on the central portion of the free magnetic layer,
the third antiferromagnetic layer on the central portion is thinner than the third antiferromagnetic layers on both sides thereof, and
the third antiferromagnetic layer on the central portion has non-antiferromagnetic properties.

29. The magnetic detection device according to claim 26, wherein
a third antiferromagnetic layer is formed on the central portion of the free magnetic layer,
the third antiferromagnetic layer on the central portion is thinner than the third antiferromagnetic layers on both sides thereof, and
the third antiferromagnetic layer on the central portion has non-antiferromagnetic properties.

30. The magnetic detection device according to claim 24, where the second antiferromagnetic layer and the nonmagnetic layers are provided on the central portion of the free magnetic layer.

31. The magnetic detection device according to claim 24, wherein an antiferromagnetic layer formed on a central portion of the free magnetic layer has a thickness of about 50 angstroms or less.

32. The magnetic detection device according to claim 31, wherein the antiferromagnetic layer on the central portion of the free magnetic layer has a thickness of 40 angstroms or less.

33. The magnetic detection device according to claim 24, wherein a thickness of a nonmagnetic layer formed on both sides of the central portion of the free magnetic layer ranges from about 0.2 angstroms to about 3 angstroms.

34. A manufacturing method for a magnetic detection device, comprising the steps of:
(a) depositing a first antiferromagnetic layer, a pinned magnetic layer, a nonmagnetic material layer, a free magnetic layer, a second antiferromagnetic layer, and a nonmagnetic layer, arranged on a substrate in this order from the bottom;
(b) carrying out a first annealing in a magnetic field to generate an exchange coupling magnetic field between the first antiferromagnetic layer and the pinned magnetic layer to fix the magnetization of the pinned magnetic layer along height direction;
(c) forming a resist layer on a central portion of the nonmagnetic layer, removing end portions on either side of the central portion of the nonmagnetic layer that are not covered by the resist layer, and leaving the nonmagnetic layer on both sides of the central portion partly unremoved;
(d) forming a pair of third antiferromagnetic layers on both sides of the central portion of the nonmagnetic layer that has been left unremoved;
(e) removing the resist layer; and
(f) carrying out a second annealing in a magnetic field to generate an exchange coupling magnetic field between both sides of a central portion of the second antiferromagnetic layer and both sides of a central portion of the free magnetic layer to fix a magnetization of both sides of the central portion of the free magnetic layer in a direction crossing a direction in which the pinned magnetic layer is magnetized.

35. The manufacturing method for a magnetic detection device according to claim 34, wherein
both portions of the nonmagnetic layer on either side of the central portion that are not covered by the resist layer are completely removed to expose surfaces on both sides of the central portion of the second antiferromagnetic layer in the step (c), and
the pair of third antiferromagnetic layers are formed on the exposed portions of the second antiferromagnetic layer on both sides of the central portion in the step (d).

36. The manufacturing method for a magnetic detection device according to claim 34, wherein the second antiferromagnetic layer has a thickness in the range of about 10 angstroms to about 50 angstroms in step (a).

37. The manufacturing method for a magnetic detection device according to claim 36, wherein the second antiferromagnetic layer has a thickness that ranges from about 30 angstroms to about 40 angstroms.

38. The manufacturing method for a magnetic detection device according to claim 34, wherein the nonmagnetic layer has a thickness that ranges from about 3 angstroms to about 10 angstroms in step (a).

39. The manufacturing method for a magnetic detection device according to claim 34, wherein both portions of the nonmagnetic layer on either sides of the central portion are etched away until a thickness of both portions of the nonmagnetic layer reaches about 3 angstroms or less in step (c), or the entire nonmagnetic layer is removed in step (c).

40. The manufacturing method for a magnetic detector device according to claim 34, wherein the entire nonmagnetic layer is removed in the step (c).

41. The manufacturing method for a magnetic detection device according to claim 34, wherein
the substrate in step (a) is a lower electrode layer,
an insulating layer is formed on a third antiferromagnetic layer in step (d), and
an upper electrode layer is formed on the insulating layer.

42. The manufacturing method for a magnetic detection device according to claim 41, wherein
both portions of the lower electrode layer on either side of the central portion are etched away to form an insulating layer thereon, and
the first antiferromagnetic layer is formed on the protuberant portion formed on the central portion of the lower electrode layer and on the insulating layer.

43. The manufacturing method for a magnetic detection device according to claim 41, wherein the lower electrode layer and the upper electrode layer are formed from a magnetic material.

44. The manufacturing method for a magnetic detection device according to claim 34, wherein the nonmagnetic layer is formed from at least one element selected from a group consisting of Ru, Re, Pd, Os, Ir, Pt, Au, and Rh.

45. The manufacturing method for a magnetic detection device according to claim 34, wherein the free magnetic layer is formed, using three magnetic layers in the step (a).

46. The manufacturing method for a magnetic detection device according to claim 45, wherein the free magnetic layer has a CoFe/NiFe/CoFe three-layer structure.

47. A manufacturing method for a magnetic detection device comprising the steps of:

(a) depositing a first antiferromagnetic layer, a pinned magnetic layer, a nonmagnetic material layer, a free magnetic layer, a second antiferromagnetic layer, and a nonmagnetic layer in this order from the bottom on a substrate;

(b) carrying out first annealing in a magnetic field to generate an exchange coupling magnetic field between the first antiferromagnetic layer and the pinned magnetic layer so as to fix the magnetization of the pinned magnetic layer in a height direction;

(c) removing a part of the front surface of the nonmagnetic layer;

(d) forming a third antiferromagnetic layer on the nonmagnetic layer;

(e) forming mask layers on the third antiferromagnetic layer on either side of the central portion, and etching away the central portion of the third antiferromagnetic layer that is not covered by the mask layers; and (f) carrying out second annealing in a magnetic field to generate an exchange coupling magnetic field between both sides of the central portion of the second antiferromagnetic layer under the third antiferromagnetic layer that are left under the mask layers and both sides of a central portion of the free magnetic layer to pin the magnetization of both sides of the central portion of the free magnetic layer in a direction crossing the direction in which the pinned magnetic layer is magnetized.

48. The manufacturing method for a magnetic detection device according to claim 47, wherein the second antiferromagnetic layer has a thickness in the range of about 10 angstroms to about 50 angstroms in the step (a).

49. The manufacturing method for a magnetic detection device according to claim 48, wherein the second antiferromagnetic layer has a thickness in the range of about 30 angstroms to about 40 angstroms.

50. The manufacturing method for a magnetic detection device according to claim 47, wherein the nonmagnetic layer is formed to have a thickness in the range of about 3 angstroms to about 10 angstroms in step (a).

51. The manufacturing method for a magnetic detection device according to claim 47, wherein the nonmagnetic layer is left to a thickness in the range of about 0.2 angstroms to about 3 angstroms in step (c).

52. The manufacturing method for a magnetic detection device according to claim 47, wherein the central portion of the third antiferromagnetic layer that is not covered by the mask layer is completely removed to expose the front surface of the nonmagnetic layer in step (e).

53. The manufacturing method for a magnetic detection device according to claim 47, wherein the central portion of the third antiferromagnetic layer that is not covered by the mask layer is completely removed, and the exposed nonmagnetic layer is also removed to expose the front surface of the second antiferromagnetic layer in the step (e).

54. The manufacturing method for a magnetic detection device according to claim 47, wherein the second annealing in a magnetic field in step (f) is carried out between the step (d) and the step (e).

55. The manufacturing method for a magnetic detection device according to claim 47, wherein the substrate in the step (a) is a lower electrode layer, the first insulating layer is formed on the third antiferromagnetic layer in the step (d), the mask layer is formed on the first insulating layer on both sides of a central portion, and central portions of the first insulating layer and the third antiferromagnetic layer that are not covered by the mask layer are etched away in the step (e), the second insulating layer is formed onto the first insulating layer, inner end surfaces of the third antiferromagnetic layer, and the central portion between the third antiferromagnetic layer, then the second insulating layer is removed, leaving a part of the second insulating layer formed on the inner end surfaces of the third antiferromagnetic layer, after the step (e), and the upper electrode layer is formed onto the first insulating layer to the second insulating layer and the central portions.

56. The manufacturing method for a magnetic detection device according to claim 55, wherein in place of the step (d), the first insulating layer is formed on the third antiferromagnetic layer on both sides of the central portion, and in place of the step (e), the central portion of the third antiferromagnetic layer that is not covered by the first insulating layer is etched away using the first insulating layer as a mask.

57. The manufacturing method for a magnetic detection device according to claim 55, wherein the angle for forming the second insulating layer is set to an angle θ1 with respect to the plane perpendicular to the surface of the lower electrode layer and the incident angle for etching away the second insulating layer is set to an angle θ2, which is smaller than the angle θ1, and the second insulating layer is etched away in a perpendicular direction or a direction close to the perpendicular direction.

58. The manufacturing method for a magnetic detection device according to claim 55, wherein both portions of the lower electrode layer on either side of the central portion are etched away, insulating layers are formed on both portions, and the first antiferromagnetic layer is formed on a protuberant portion formed at the central portion of the lower electrode layer and on the insulating layers.

59. The manufacturing method for a magnetic detection device according to claim 55, wherein the lower electrode layer and the upper electrode layer are formed from a magnetic material.

60. The manufacturing method for a magnetic detection device according to claim 47, wherein the nonmagnetic layer is formed from at least one element selected from a group consisting of Ru, Re, Pd, Os, Ir, Pt, Au, and Rh.

61. The manufacturing method for a magnetic detection device according to claim 47, wherein free magnetic layer is formed using three magnetic layers in step (a).

62. The manufacturing method for a magnetic detection device according to claim 61, wherein the free magnetic layer is formed using a three-layer structure.

63. The manufacturing method for a magnetic detection device according to claim 62, wherein the free magnetic layer is formed using a CoFe/NiFe/CoFe three-layer structure.

* * * * *